United States Patent
Shinya et al.

(10) Patent No.: US 8,166,363 B2
(45) Date of Patent: Apr. 24, 2012

(54) DECODING DEVICE AND METHOD

(75) Inventors: Osamu Shinya, Tokyo (JP); Takashi Yokokawa, Kanagawa (JP); Yuji Shinohara, Tokyo (JP); Toshiyuki Miyauchi, Tokyo (JP)

(73) Assignee: Sony Corporation, Tokyo (JP)

( * ) Notice: Subject to any disclaimer, the term of this patent is extended or adjusted under 35 U.S.C. 154(b) by 502 days.

(21) Appl. No.: 12/066,641

(22) PCT Filed: Sep. 7, 2006

(86) PCT No.: PCT/JP2006/317735
§ 371 (c)(1),
(2), (4) Date: May 27, 2009

(87) PCT Pub. No.: WO2007/032251
PCT Pub. Date: Mar. 22, 2007

(65) Prior Publication Data
US 2009/0304111 A1    Dec. 10, 2009

(30) Foreign Application Priority Data
Sep. 13, 2005   (JP) .................................. 2005-264730

(51) Int. Cl.
*H03M 13/00* (2006.01)
(52) U.S. Cl. ........................................ 714/752
(58) Field of Classification Search .................. 714/746, 714/747, 752–760, 778, 779, 792–801
See application file for complete search history.

(56) References Cited

U.S. PATENT DOCUMENTS 5,794,179 A * 8/1998 Yamabe ......................... 704/205
6,631,391 B1 * 10/2003 Inabata et al. ................. 708/495
(Continued)

FOREIGN PATENT DOCUMENTS
JP    2004-364233    12/2004

OTHER PUBLICATIONS

C. Howland, et al., "Parallel Decoding Architectures for Low Density Parity Check Codes", High Speed Communications VLSI Research Department Agere Systems, May 6, 2001, pp. 742-745.

(Continued)

*Primary Examiner* — Nadeem Iqbal
(74) *Attorney, Agent, or Firm* — Finnegan, Henderson, Farabow, Garrett & Dunner, L.L.P.

(57) ABSTRACT

A decoding device and method for decoding an LDPC code with high accuracy while suppressing an increase of the scale of a device. A check node calculator (181) performs check node calculations including calculations of a nonlinear function $\phi(x)$ and its inverse function $\phi^{-1}(x)$ of the nonlinear function so as to decode an LDPC code. A variable node calculator (103) performs variable node calculation of a variable node so as to decode the LDPC code. The check node calculator (181) has an LUT which receives a fixed-point quantized value expressing a numerical value with a fixed quantization width and outputs the result of the calculation of the nonlinear function $\phi(x)$ as a semi-floating point quantized value which is a bit sequence expressing a numerical value with a quantization width determined by a part of a bit sequence and an LUT which receives a semi-floating point quantized value and outputs the result of the calculation of the inverse function $\phi^{-1}(x)$ as a fixed point quantized value. The invention can be applied to e.g., a tuner for receiving a satellite broadcast.

12 Claims, 30 Drawing Sheets

U.S. PATENT DOCUMENTS

| | | | |
|---|---|---|---|
| 7,299,397 B2 | 11/2007 | Yokokawa et al. | |
| 7,441,178 B2 * | 10/2008 | Xin | 714/800 |
| 2003/0023917 A1 * | 1/2003 | Richardson et al. | 714/749 |
| 2005/0278604 A1 * | 12/2005 | Yokokawa et al. | 714/758 |
| 2006/0190797 A1 * | 8/2006 | Xin | 714/758 |
| 2006/0242536 A1 * | 10/2006 | Yokokawa et al. | 714/758 |

OTHER PUBLICATIONS

Engling Yeo et al., "VLSI Architectures for Iterative Decoders in Magnetic Recording Channels", IEEE Transactions on Magnetics, vol. 37, No. 2, Mar. 2001, pp. 748-755.

* cited by examiner

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 0 & 0 & 1 & 0 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 19

| INPUT x INTO LUT (FIXED POINT FORMAT) | DECIMAL NUMBER |
|---|---|
| 00000 | 0 |
| 00001 | 1 |
| 00010 | 2 |
| 00011 | 3 |
| 00100 | 4 |
| 00101 | 5 |
| 00110 | 6 |
| 00111 | 7 |
| 01000 | 8 |
| 01001 | 9 |
| 01010 | 10 |
| 01011 | 11 |
| 01100 | 12 |
| 01101 | 13 |
| 01110 | 14 |
| 01111 | 15 |
| 10000 | 16 |
| 10001 | 17 |
| 10010 | 18 |
| 10011 | 19 |
| 10100 | 20 |
| 10101 | 21 |
| 10110 | 22 |
| 10111 | 23 |
| 11000 | 24 |
| 11001 | 25 |
| 11010 | 26 |
| 11011 | 27 |
| 11100 | 28 |
| 11101 | 29 |
| 11110 | 30 |
| 11111 | 31 |

⇒

| OUTPUT φ(x) FROM LUT (SEMI-FLOATING POINT FORMAT) | | (FIXED POINT FORMAT) | DECIMAL NUMBER |
|---|---|---|---|
| 000 | 00 | 000000000 | 0 |
| 000 | 01 | 000000001 | 1 |
| 000 | 10 | 000000010 | 2 |
| 000 | 11 | 000000011 | 3 |
| 001 | 00 | 000000100 | 4 |
| 001 | 01 | 000000101 | 5 |
| 001 | 10 | 000000110 | 6 |
| 001 | 11 | 000000111 | 7 |
| 010 | 00 | 000001000 | 8 |
| 010 | 01 | 000001010 | 10 |
| 010 | 10 | 000001100 | 12 |
| 010 | 11 | 000001110 | 14 |
| 011 | 00 | 000010000 | 16 |
| 011 | 01 | 000010100 | 20 |
| 011 | 10 | 000011000 | 24 |
| 011 | 11 | 000011100 | 28 |
| 100 | 00 | 000100000 | 32 |
| 100 | 01 | 000101000 | 40 |
| 100 | 10 | 000110000 | 48 |
| 100 | 11 | 000111000 | 56 |
| 101 | 00 | 001000000 | 64 |
| 101 | 01 | 001010000 | 80 |
| 101 | 10 | 001100000 | 96 |
| 101 | 11 | 001110000 | 112 |
| 110 | 00 | 010000000 | 128 |
| 110 | 01 | 010100000 | 160 |
| 110 | 10 | 011000000 | 192 |
| 110 | 11 | 011100000 | 224 |
| 111 | 00 | 100000000 | 256 |
| 111 | 01 | 101000000 | 320 |
| 111 | 10 | 110000000 | 384 |
| 111 | 11 | 111000000 | 448 |

FIG. 20

| OUTPUT φ(x) FROM LUT (SEMI-FLOATING POINT FORMAT) | | CONVERTED OUTPUT (FIXED POINT FORMAT) | DECIMAL NUMBER |
|---|---|---|---|
| 000 | 00 | 000000000 | 0 |
| 000 | 01 | 000000001 | 1 |
| 000 | 10 | 000000010 | 2 |
| 000 | 11 | 000000011 | 3 |
| 001 | 00 | 000000100 | 4 |
| 001 | 01 | 000000101 | 5 |
| 001 | 10 | 000000110 | 6 |
| 001 | 11 | 000000111 | 7 |
| 010 | 00 | 000001000 | 8 |
| 010 | 01 | 000001010 | 10 |
| 010 | 10 | 000001100 | 12 |
| 010 | 11 | 000001110 | 14 |
| 011 | 00 | 000010000 | 16 |
| 011 | 01 | 000010100 | 20 |
| 011 | 10 | 000011000 | 24 |
| 011 | 11 | 000011100 | 28 |
| 100 | 00 | 000100000 | 32 |
| 100 | 01 | 000101000 | 40 |
| 100 | 10 | 000110000 | 48 |
| 100 | 11 | 000111000 | 56 |
| 101 | 00 | 001000000 | 64 |
| 101 | 01 | 001010000 | 80 |
| 101 | 10 | 001100000 | 96 |
| 101 | 11 | 001110000 | 112 |
| 110 | 00 | 010000000 | 128 |
| 110 | 01 | 010100000 | 160 |
| 110 | 10 | 011000000 | 192 |
| 110 | 11 | 011100000 | 224 |
| 111 | 00 | 100000000 | 256 |
| 111 | 01 | 101000000 | 320 |
| 111 | 10 | 110000000 | 384 |
| 111 | 11 | 111000000 | 448 |

FIG. 22

| OUTPUT FROM CALCULATOR (FIXED POINT FORMAT) | DECIMAL NUMBER |
|---|---|
| 000000000 | 0 |
| 000000001 | 1 |
| 000000010 | 2 |
| 000000011 | 3 |
| 000000100 | 4 |
| 000000101 | 5 |
| 000000110 | 6 |
| 000000111 | 7 |
| 000001000 | 8 |
| 000001001 | 9 |
| 000001010 | 10 |
| 000001011 | 11 |
| ⋮ | |
| 111111011 | 507 |
| 111111100 | 508 |
| 111111101 | 509 |
| 111111110 | 510 |
| 111111111 | 511 |

| CONVERTED OUTPUT (SEMI-FLOATING POINT FORMAT) | | (FIXED POINT FORMAT) | DECIMAL NUMBER |
|---|---|---|---|
| 000 | 00 | 000000000 | 0 |
| 000 | 01 | 000000001 | 1 |
| 000 | 10 | 000000010 | 2 |
| 000 | 11 | 000000011 | 3 |
| 001 | 00 | 000000100 | 4 |
| 001 | 01 | 000000101 | 5 |
| 001 | 10 | 000000110 | 6 |
| 001 | 11 | 000000111 | 7 |
| 010 | 00 | 000001000 | 8 |
| 010 | 01 | 000001010 | 10 |
| 010 | 10 | 000001100 | 12 |
| 010 | 11 | 000001110 | 14 |
| 011 | 00 | 000010000 | 16 |
| 011 | 01 | 000010100 | 20 |
| 011 | 10 | 000011000 | 24 |
| 011 | 11 | 000011100 | 28 |
| 100 | 00 | 000100000 | 32 |
| 100 | 01 | 000101000 | 40 |
| 100 | 10 | 000110000 | 48 |
| 100 | 11 | 000111000 | 56 |
| 101 | 00 | 001000000 | 64 |
| 101 | 01 | 001010000 | 80 |
| 101 | 10 | 001100000 | 96 |
| 101 | 11 | 001110000 | 112 |
| 110 | 00 | 010000000 | 128 |
| 110 | 01 | 010100000 | 160 |
| 110 | 10 | 011000000 | 192 |
| 110 | 11 | 011100000 | 224 |
| 111 | 00 | 100000000 | 256 |
| 111 | 01 | 101000000 | 320 |
| 111 | 10 | 110000000 | 384 |
| 111 | 11 | 111000000 | 448 |

| OUTPUT φ⁻¹(y) FROM LUT (FIXED POINT FORMAT) | DECIMAL NUMBER |
|---|---|
| 00000 | 0 |
| 00001 | 1 |
| 00010 | 2 |
| 00011 | 3 |
| 00100 | 4 |
| 00101 | 5 |
| 00110 | 6 |
| 00111 | 7 |
| 01000 | 8 |
| 01001 | 9 |
| 01010 | 10 |
| 01011 | 11 |
| 01100 | 12 |
| 01101 | 13 |
| 01110 | 14 |
| 01111 | 15 |
| 10000 | 16 |
| 10001 | 17 |
| 10010 | 18 |
| 10011 | 19 |
| 10100 | 20 |
| 10101 | 21 |
| 10110 | 22 |
| 10111 | 23 |
| 11000 | 24 |
| 11001 | 25 |
| 11010 | 26 |
| 11011 | 27 |
| 11100 | 28 |
| 11101 | 29 |
| 11110 | 30 |
| 11111 | 31 |

| INPUT y INTO LUT (SEMI-FLOATING POINT FORMAT) | | (FIXED POINT FORMAT) | DECIMAL NUMBER |
|---|---|---|---|
| 000 | 00 | 000000000 | 0 |
| 000 | 01 | 000000001 | 1 |
| 000 | 10 | 000000010 | 2 |
| 000 | 11 | 000000011 | 3 |
| 001 | 00 | 000000100 | 4 |
| 001 | 01 | 000000101 | 5 |
| 001 | 10 | 000000110 | 6 |
| 001 | 11 | 000000111 | 7 |
| 010 | 00 | 000001000 | 8 |
| 010 | 01 | 000001010 | 10 |
| 010 | 10 | 000001100 | 12 |
| 010 | 11 | 000001110 | 14 |
| 011 | 00 | 000010000 | 16 |
| 011 | 01 | 000010100 | 20 |
| 011 | 10 | 000011000 | 24 |
| 011 | 11 | 000011100 | 28 |
| 100 | 00 | 000100000 | 32 |
| 100 | 01 | 000101000 | 40 |
| 100 | 10 | 000110000 | 48 |
| 100 | 11 | 000111000 | 56 |
| 101 | 00 | 001000000 | 64 |
| 101 | 01 | 001010000 | 80 |
| 101 | 10 | 001100000 | 96 |
| 101 | 11 | 001110000 | 112 |
| 110 | 00 | 010000000 | 128 |
| 110 | 01 | 010100000 | 160 |
| 110 | 10 | 011000000 | 192 |
| 110 | 11 | 011100000 | 224 |
| 111 | 00 | 100000000 | 256 |
| 111 | 01 | 101000000 | 320 |
| 111 | 10 | 110000000 | 384 |
| 111 | 11 | 111000000 | 448 |

DECODING DEVICE AND METHOD

TECHNICAL FIELD

The present invention relates to a decoding device and method. Particularly, it relates to a decoding device and method for decoding a code coded by low density parity check coding (LDPC coding) with high accuracy while suppressing an increase of the scale of the device.

BACKGROUND ART

Researches in the communication field such as mobile communication or deep space communication and in the broadcasting field such as digitalized terrestrial or satellite broadcasting have been recently advanced remarkably. Along with the advance, researches into coding theories have been also made vigorously for the purpose of increasing efficiency in error correction coding and decoding.

A so-called Shannon limit given by C. E. Shannon's theorem of communication channel coding has been known as a theoretical limit of code performance. The researches into coding theories have been made for the purpose of developing a code exhibiting performance close to the Shannon limit. As a coding method exhibiting performance close to the Shannon limit, there has been developed a method called Turbo coding such as parallel concatenated convolutional codes (PCCC) or serially concatenated convolutional codes (SCCC) in recent years. While these Turbo codes have been developed, low density parity check codes (hereinafter referred to as LDPC codes) have been moving into the limelight though the LDPC coding method is a coding method known from long ago.

The LDPC codes were initially proposed by R. G. Gallager in 'R. G. Gallager, "Low Density Parity Check Codes", Cambridge, Mass.: M.I.T. Press, 1963', and then have come to be noticed again in 'D. J. C. MacKay, "Good error correcting codes based on very sparse matrices", Submitted to IEEE Trans. Inf. Theory, IT-45, pp. 399-431, 1999', 'M. G. Luby, M. Mitzenmacher, M. A. Shokrollahi and D. A. Spielman, "Analysis of low density codes and improved designs using irregular graphs", in Proceedings of ACM Symposium on Theory of Computing, pp. 249-258, 1998', etc.

According to the recent researches, it is being known that as the code length is increased, the LDPC codes can obtain performance close to the Shannon limit similarly to the Turbo codes or the like. In addition, since the LDPC codes have a trait that the minimum distance is proportional to the code length, the LDPC codes have a feature that block error probability characteristic is good, and an advantage that a so-called error floor phenomenon observed in decoding characteristic of the Turbo codes etc. hardly occurs.

Such an LDPC code will be hereinafter described specifically. Incidentally, the LDPC code is a linear code but not necessarily binary. Here, the LDPC code will be described as a binary code.

The LDPC code has the greatest feature in that a parity check matrix for defining the LDPC code is sparse. Here, the sparse matrix is constructed to have a very small number of components of "1" in the matrix. Assuming that the sparse parity check matrix is represented by H, then, for example, as shown in FIG. 1, there is a parity check matrix H in which the Hamming weight (the number of "1") of each column is 3 and the Hamming weight of each row is 6.

An LDPC code defined by a parity check matrix H having a constant Hamming weight of each row and a constant Hamming weight of each column in this manner is referred to as a regular LDPC code. On the other hand, an LDPC code defined by a parity check matrix H having a non-constant Hamming weight of each row and a non-constant Hamming weight of each column is referred to as an irregular LDPC code.

Coding into such an LDPC code is achieved by a codeword which is generated in such a manner that a generator matrix G is generated based on a parity check matrix H and multiplied by a binary information message. Specifically, a coding device for performing coding into an LDPC code first calculates a generator matrix G which holds the equation $GH^T=0$ with respect to a transposed matrix $H^T$ of the parity check matrix H. Here, the parity check matrix H is a matrix with (n-k) rows and n columns when the generator matrix G is a k×n matrix (a matrix with k rows and n columns).

The coding device generates a codeword (LDPC code) c (=uG) consisting of n bits by multiplying the generator matrix G by an information message (vector) u consisting of k bits.

The codeword c generated by the coding device is transmitted after mapped so that a bit with a value of "0" is changed to "+1" and a bit with a value of "1" is changed to "−1". The transmitted codeword c is received on the receiver side through a predetermined communication channel.

For example, assuming a parity check matrix H consisting of (n-k) rows and n columns in the case where the codeword c consisting of n bits is a systematic code consistent with a bit string in which (n-k) parity bits are arranged following k bits of an information message u, and further assuming that an (n-k)-by-k matrix part corresponding to the k bits of the information message u in the n-bit codeword c is referred to as an information section and an (n-k)-by-(n-k) matrix part corresponding to the (n-k) parity bits in the n-bit codeword c is referred to as a parity section, then it is possible to code the information message u into an LDPC code using the parity check matrix H as long as the parity section is a lower or upper triangular matrix.

That is, for example, assuming that the parity check matrix H consists of an information section and a parity section of a lower triangular matrix as shown in FIG. 2, and further assuming that all components in the lower triangle of the parity section are "1", then the first bit of the parity bits in the codeword c has a value obtained by EXORing (exclusive ORing) of bits of the information message u corresponding to components of "1" in the first row of the information section of the parity check matrix H.

In addition, the second bit of the parity bits in the codeword c has a value obtained by EXORing of bits of the information message u corresponding to components of "1" in the second row of the information section of the parity check matrix H and the first bit of the parity bits.

Further, the third bit of the parity bits in the codeword c has a value obtained by EXORing of bits of the information message u corresponding to components of "1" in the third row of the information section of the parity check matrix H and the first and second bits of the parity bits.

Hereinafter, in the same manner, the i-th bit of the parity bits in the codeword c has a value obtained by EXORing of bits of the information message u corresponding to components of "1" in the i-th row of the information section of the parity check matrix H and the first to (i-1)-th bits of the parity bits.

The (n-k) parity bits obtained in the aforementioned manner can be arranged following the k bits of the information message u to thereby obtain a codeword c consisting of n bits.

On the other hand, an LDPC code can be decoded by a message passing algorithm which is an algorithm called probabilistic decoding proposed by Gallager and which is based on belief propagation on a so-called Tanner graph having variable nodes (also called message nodes) and check nodes. Hereinafter, the variable nodes and the check nodes may be also generically referred to as nodes appropriately.

Messages exchanged between the nodes are real-valued in the probabilistic decoding. Therefore, it is necessary to trace a probability distribution of messages taking continuous values in order to find analytic solutions, so that analysis accompanied with very high difficulty is required. Accordingly, Gallager has proposed Algorithm A or Algorithm B as an algorithm for decoding an LDPC code.

Generally, an LDPC code is decoded in a procedure as shown in FIG. 3. Here, a reception value of an LDPC code (coded c) is regarded as $U_0$, a message which may be hereinafter also referred to as check node message appropriately) outputted from a check node is regarded as $u_j$, and a message (which may be hereinafter also referred to as variable node message appropriately) outputted from a variable node is regarded as $v_i$. In addition, each message has a value of a real number expressing the likelihood of "C" in a so-called log likelihood ratio. The log likelihood ratio of the "0" likelihood of the reception value $U_0$ is expressed as reception data $u_{0i}$.

In decoding of an LDPC code, as shown in FIG. 3, in step S11, first, a reception value $U_0$ (reception data $u_{0i}$) is received, a message $u_j$ is initialized to "0", and a variable k taking an integer as a counter for iterative processing is initialized to "0". Then, the routine of processing goes to step S12. In the step S12, a variable node message $v_i$ is obtained by performing an operation represented by the expression (1) on the basis of the reception data $u_{0i}$, and a check node message $u_j$ is obtained by performing an operation represented by the expression (2) on the basis of the variable node message $v_i$.

[Numerical Expression 1]

$$v_i = u_{0i} + \sum_{j=1}^{d_c-1} u_j \quad (1)$$

[Numerical Expression 2]

$$\tanh\left(\frac{u_j}{2}\right) = \prod_{i=1}^{d_c-1} \tanh\left(\frac{v_i}{2}\right) \quad (2)$$

Here, $d_v$ and $d_c$ in the expressions (1) and (2) are arbitrarily selectable parameters expressing the number of "1" in the longitudinal (row) direction of the parity check matrix H and the number of "1" in the horizontal (column) direction of the parity check matrix H, respectively. For example, in the case of a (3,6) code, $d_v=3$ and $d_c=6$.

Incidentally, in the operation represented by the expression (1) or (2), the range for the sum or product operation is 1 to $d_v-1$ or 1 to $d_c-1$ because a message inputted from a branch (edge) intended to output a message is not used as a parameter for the sum or product operation. Practically, the operation represented by the expression (2) can be performed by generating a table of a function $R(v_1, v_2)$ defined by one output relative to two inputs $v_1$ and $v_2$ as shown in the expression (3) in advance and using this table continuously (recursively) as shown in the expression (4).

[Numerical Expression 3]

$$x=2\tan h^{-1}\{\tan h(v_1/2)\tan h(v_2/2)\}=R(v_1,v_2) \quad (3)$$

[Numerical Expression 4]

$$u_j=R(v_1,R(v_2,R(v_3,\ldots R(v_{d_c-2},v_{d_c-1})))) \quad (4)$$

In the step S12, the variable k is incremented by "1". Then, the routine of processing goes to step S13. In the step S13, judgment is made as to whether or not the variable k is at least a predetermined iterative decoding number N. When the judgment in the step S13 makes a decision that the variable k is not at least N, the routine of processing goes back to the step S12. Then, the same processing is iterated.

When the judgment in the step S13 makes a decision that the variable k is at least N, the routine of processing goes to step S14 in which a message v is obtained by performing an operation represented by the expression (5) and outputted as an ultimately outputted decoding result. Then, the LDPC code decoding process is terminated.

[Numerical Expression 5]

$$v = u_{0i} + \sum_{j=1}^{d_v} u_j \quad (5)$$

Here, differently from the operation represented by the expression (1), the operation represented by the expression (5) is performed by using messages given from all branches connected to a variable node.

In such decoding of an LDPC code, for example, in the case of a (3, 6) code, messages are exchanged between respective nodes as shown in FIG. 4. Incidentally, in FIG. 4, the operation represented by the expression (1) is performed in nodes (variable nodes) represented by "=" and the operation represented by the expression (2) is performed in nodes (check nodes) represented by "+". Particularly in algorithm A, messages are binary-valued and EXORing of $d_c-1$ messages inputted to a node represented by "+" is performed at the node whereas the inversion of the code is outputted at a node represented by "=" when $d_v-1$ messages inputted to the node have all different bit values from reception data $R(u_{0i})$.

On the other hand, researches into an implementation method for decoding an LDPC code have been also made in recent years. Decoding of an LDPC code will be modeled and described before description of the implementation method.

FIG. 5 shows an example of a parity check matrix for a (3, 6) LDPC code (of coding rate 1/2 and code length 12). The parity check matrix H for the LDPC code can be expressed in a Tanner graph as shown in FIG. 6. Here, in FIG. 6, a node represented by "+" is a check node and a node represented by "=" is a variable node. Each check node corresponds to a row in the parity check matrix H while each variable node corresponds to a column in the parity check matrix H. A line by which a check node and a variable node are connected is a branch (edge) and equivalent to "1" in the parity check matrix. That is, when a component located in the j-th row and the i-th column of the parity check matrix H is 1, the i-th variable node ("=" node) from top and the j-th check node ("+" node) from top are connected to each other by a branch in FIG. 6. Each branch indicates that a bit of the LDPC code corresponding to the variable node has a constraint condition corresponding to the check node. Incidentally, FIG. 6 is a Tanner graph showing the parity check matrix H in FIG. 5.

A sum production algorithm which is an LDPC code decoding method iterates the operation of a variable node and the operation of a check node.

The operation represented by the expression (1) is performed in a variable node as shown in FIG. 7. That is, in FIG.

7, a variable node message $v_i$ corresponding to a branch to be calculated is calculated using check node messages $u_1$ and $u_2$ from the other branches connected to the variable node, and reception data $u_{0i}$. Variable node messages corresponding to the other branches are also calculated in the same manner respectively.

Before description of the operation of a check node, the expression (2) is rewritten as the expression (6) using the relation of the equation $a \times b = \exp\{\ln(|a|) + \ln(|b|)\} \times \text{sign}(a) \times \text{sign}(b)$, in which the $\text{sign}(x)$ expresses a sign (plus or minus) of x and takes 1 for $x \geq 0$ and $-1$ for $x < 0$.

[Numerical Expression 6]

$$u_j = 2\tanh^{-1}\left(\prod_{i=1}^{d_c-1} \tanh\left(\frac{v_i}{2}\right)\right) \quad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tan\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

Further assuming that a nonlinear function (nonlinear function) $\phi(x)$ is defined as the equation $\phi(x) = \ln(\tan h(x/2))$ (in which $\ln()$ is a natural logarithm function) in $x \geq 0$, then the inverse function $\phi^{-1}(x)$ of the nonlinear function $\phi(x)$ is expressed as the equation $\phi^{-1}(x) = 2\tan h^{-1}(e^{-x})$. Accordingly, the expression (6) can be rewritten as the expression (7).

[Numerical Expression 7]

$$u_j = \phi^{-1}\left(\sum_{i=1}^{d_c-1} \phi(|v_i|)\right) \times \prod_{i=1}^{d_c-1} \text{sign}(v_i) \quad (7)$$

An operation represented by the expression (7) is performed in a check node as shown in FIG. 8. That is, in FIG. 8, a check node message $u_j$ corresponding to a branch to be calculated is calculated using variable messages $v_1, v_2, v_3, V_4$ and $v_5$ from the other branches connected to the check node. Check node messages corresponding to the other branches are also calculated in the same manner respectively.

Incidentally, the function $\phi(x)$ can be also expressed as $\phi(x) = \ln((e^x+1)/e^x-1))$. In $x > 0$, $\phi(x) = \phi^{-1}(x)$. When the functions $\phi(x)$ and $\phi^{-1}(x)$ are implemented in a piece of hardware, LUT's (look up tables) may be used for the implementation. The LUT's are the same.

The method for decoding an LDPC code is also called belief propagation in addition to the sum product algorithm. In any case, the contents of operations to be performed are the same.

An implementation method in the case (of full serial decoding) where operations of nodes are performed one by one successively to thereby perform decoding will be described as an example of implementation of a sum product algorithm into a decoding device.

When the sum product algorithm is implemented in a piece of hardware, it is necessary to iteratively perform the variable node operation represented by the expression (1) and the check node operation represented by the expression (7) in a moderate circuit scale and with a moderate operating frequency.

Here, for example, assume that a code (of coding rate 2/3 and code length 108) represented by a parity check matrix H having 36 rows and 108 columns in FIG. 9 is decoded. The number of "1" in the parity check matrix H in FIG. 9 is 323. Accordingly, in a Tanner graph for the parity check matrix H, the number of branches is 323. Here, 0 is expressed as in the parity check matrix of FIG. 9.

FIG. 10 shows an example of configuration of a decoding device for decoding an LDPC code only in one cycle.

A message corresponding to one branch is calculated in accordance with each operating clock in the decoding device of FIG. 10.

That is, the decoding device in FIG. 10 includes two branch memories 100 and 102, one check node calculator 101, one variable node calculator 103, one receiving memory 104, and one control section 105.

In the decoding device of FIG. 10, messages are read one by one from the branch memory 100 or 102, so that the messages are used for calculating messages corresponding to desired branches. The messages obtained by the calculation are stored one by one in a post-stage branch memory 102 or 100. For performing decoding iteratively, decoding devices of FIG. 10 for performing deciding only in one cycle may be cascade-connected or a decoding device of FIG. 10 may be used iteratively to achieve iterative decoding. Here, for example, assume that a plurality of decoding devices of FIG. 10 are connected.

The branch memory 100 stores messages (variable node messages) D100 supplied from a variable node calculator 103 of an ante-stage decoding device (not shown), in the sequence where the messages D100 will be read by the post-stage check node calculator 101. In a phase of check node calculation, the branch memory 100 supplies the messages D100 as messages D101 to the check node calculator 101 in the sequence where the messages D100 were stored in the branch memory 100.

The check node calculator 101 performs an operation (check node operation) in accordance with the expression (7) by using the messages D101 (variable node messages $v_i$) supplied from the branch memory 100 on the basis of a control signal D106 supplied from the control section 105, and supplies messages D102 (check node messages $u_j$) obtained by the operation to the post-stage branch memory 102.

The branch memory 102 stores the messages D102 supplied from the ante-stage check node calculator 101 in the sequence where the messages D102 will be read by the post-stage variable node calculator 103. In a phase of variable node calculation, the branch memory 102 supplies the messages D102 as messages D103 to the variable node calculator 103 in the sequence where the messages D102 were stored in the branch memory 102.

While a control signal D107 is supplied from the control section 105 to the variable node calculator 103, reception data D104 are supplied from the receiving memory 104 to the variable node calculator 103. The variable node calculator 103 performs an operation (variable node operation) in accordance with the expression (1) by using the messages D103 (check node messages $u_j$) supplied from the branch memory 100 and the reception data D104 (reception data $u_{0i}$) supplied from the receiving memory 100 on the basis of the control signal D107, and supplies messages D105 (variable node messages $v_i$) obtained as results of the operation to a branch memory 100 of a post-stage decoding device not shown.

The reception data $u_{0i}$ of the LDPC code are stored in the receiving memory 104. The control section 105 supplies the control signal D106 for controlling the variable node operation and the control signal D107 for controlling the check node operation, to the check node calculator 101 and the variable node calculator 103, respectively.

FIG. 11 shows an example of configuration of the check node calculator 101 of FIG. 10 for performing check node operations one by one.

In FIG. 11, the check node calculator 101 is shown on the assumption that each message is quantized into a total of 6 bits including a sign bit (bit for discriminating between plus and minus). That is, messages are expressed by 6-bit quantized values respectively and the 6-bit quantized values are assigned to numerical values which are obtained by equally dividing a predetermined numerical value range into 64 values which can be expressed by 6 bits including a sign bit.

In addition, a check node operation of the LDPC code expressed by the parity check matrix H of FIG. 9 is performed in FIG. 11. Further, a clock ck is supplied to the check node calculator 101 of FIG. 11. This clock ck is supplied to necessary blocks. Each block performs processing in synchronization with the clock ck.

The check node calculator 101 of FIG. 11 performs an operation in accordance with the expression (7) by using messages D101 (variable node messages $v_i$) read one by one from the branch memory 100, for example, on the basis of a 1-bit control signal D106 supplied from the control section 105.

That is, in the check node calculator 101, the messages D101 (variable node messages $v_i$) of 6 bits are read one by one from variable nodes corresponding to respective columns in the parity check matrix H, so that an absolute value D122 ($|v_i|$) which is the lower 5 bits of each 6-bit message is supplied to a LUT 121 whereas a sign bit D121 which is the most significant bit of each 6-bit message is supplied to an EXOR circuit 129 and an FIFO (First In First Out) memory 133. In the check node calculator 101, a control signal D106 is given from the control section 105 and supplied to a selector 124 and a selector 131.

The LUT 121 reads a 5-bit operation result D123 ($\phi(|v_i|)$) as a result of the operation of the nonlinear function $\phi(|v_i|)$ in the expression (7) on the absolute value D122 ($|v_i|$) inputted therein, and supplies the 5-bit operation result D123 ($\phi(|v_i|)$) to an operation unit 122 and an FIFO memory 127.

The operation unit 122 integrates the operation result D123 by adding each operation result D123 ($\phi(|v_i|)$) to a 9-bit value D124 stored in a register 123, so that a 9-bit integrated value obtained as a result of the integration is stored in the register 123 again. Incidentally, when operation results D123 for absolute values D122 ($|v_i|$) of messages D101 given from all branches corresponding to one row in the parity check matrix H have been integrated, the register 123 is reset.

Here, in the operation unit 122 and the register 123, the 5-bit operation result D123 ($\phi(|v_i|)$) supplied from the LUT 121 is integrated at maximum up to the maximum number of delay times in the FIFO memory 127, i.e. up to the number of times equal to the maximum weight of one row in the parity check matrix H. Now, the maximum weight of one row in the parity check matrix H in FIG. 9 is 9. Accordingly, in the operation unit 122 and the register 123, the 9-bit operation result D123 ($\phi(|v_i|)$) is integrated at maximum up to 9 times (nine 5-bit values are integrated). For this reason, at an output from the operation unit 122 and at outputs from portions after the operation unit 122, the number of quantization bits is 9 which is larger by 4 bits (the minimum number of bits capable of expressing 9 (times)) than the 5-bit operation result D1123 ($\phi(|v_i|)$) outputted by the LUT 121 so that a value obtained by integrating a 5-bit value 9 times can be expressed.

When messages D101 (variable node messages $v_i$) corresponding to one row in the parity check matrix have been read one by one and an integrated value as a result of integration of operation results D123 corresponding to one row has been stored in the register 123, the control signal D106 supplied from the control section 105 changes from 0 to 1. When, for example, the row weight is "9", the control signal D106 takes "0" for the first clock to the eighth clock and takes "1" for the ninth clock.

When the control signal D106 is "1", the selector 124 selects a value stored in the register 123, i.e. a 9-bit value D124 ($\Sigma\phi(|v_i|)$ from i=1 to i=$d_c$) as a result of integration of $\phi(|v_i|)$ calculated from messages D101 (variable node messages $v_i$) given from all branches corresponding to one row in the parity check matrix H, and outputs the 9-bit value D124 as a value D125 so that the value D125 is stored in a register 125. The register 125 supplies the stored value D125 as a 9-bit value D126 to the selector 124 and an operation unit 126. When the control signal D106 is "0", the selector 124 selects a value D126 supplied from the register 125, and outputs the value D126 so that the value D126 is stored in the register 125 again. That is, the register 125 supplies $\phi(|v_i|)$ integrated at the last time, to the selector 124 and the operation unit 126 unless $\phi(|v_i|)$ calculated from messages D101 (variable node messages $v_i$) given from all branches corresponding to one row in the parity check matrix H are integrated completely.

On the other hand, the FIFO memory 127 delays the 5-bit operation result D123 ($\phi(|v_i|)$) outputted by the LUT 121 until a new value D126 ($\Sigma\phi(|v_i|)$ from i=1 to i=$d_c$) is outputted from the register 125, and supplies the 5-bit operation result D123 ($\phi(|v_i|)$) as a 5-bit value D127 to the operation unit 126. The operation unit 126 subtracts the value D127 supplied from the FIFO memory 127, from the value D126 supplied from the register 125, and supplies a result of the subtraction as a 5-bit difference value D128 to an LUT 128. That is, the operation unit 126 subtracts $\phi(|v_i|)$ calculated from a message D101 (variable node message $v_i$) given from a branch intended to calculate the check node message $u_j$, from the integrated value of $\phi(|v_i|)$ obtained from messages D101 (variable node messages $v_i$) given from all branches corresponding to one row in the parity check matrix H, and supplies the difference value ($\Sigma\phi(|v_i|)$) from i=1 to i=$d_c$-1) as a difference value D128 to an LUT 128.

Incidentally, since the operation unit 126 subtracts the 5-bit value D127 supplied from the FIFO memory 127, from the 9-bit value D126 supplied from the register 125, a result of the subtraction may be 9 bits at maximum. However, the operation unit 126 outputs a 5-bit difference value D128. For this reason, when a subtraction result as a result of subtraction of a 5-bit value D127 supplied from the FIFO memory 127 from a 9-bit value D126 supplied from the register 125 cannot be expressed by 5 bits, that is, when a subtraction result exceeds the maximum value (31 (11111 in binary)) which can be expressed by 5 bits, the operation unit 126 clips the subtraction result to the maximum value which can be expressed by 5 bits, and outputs the clipped value as a 5-bit difference value D128.

The LUT 128 outputs a 5-bit operation result D129 ($\phi^{-1}(\Sigma\phi(|v_i|))$) as a result of the operation of the inverse function $\phi^{-1}(\Sigma\phi(|v_i|))$ in the expression (7) on the difference value D128 ($\Sigma\phi(|v_i|)$ from i=1 to i=$d_c$-1).

In parallel with the aforementioned processing, the EXOR circuit 129 performs EXORing of a 1-bit value D131 stored in the register 130 and a sign bit D121 to thereby multiply the sign bits by each other, and stores a thus obtained 1-bit multiplication result D130 in the register 130 again. Incidentally, when sign bits D121 of messages D101 (variable node messages $v_i$) given from all branches corresponding to one row in the parity check matrix H have been multiplied completely, the register 130 is reset.

When a multiplication result D130 ($\Pi\text{sign}(v_i)$ from i=1 to $d_c$) as a result of multiplication of sign bits D121 of messages D101 given from all branches corresponding to one row in the parity check matrix H has been stored in the register 130, the control signal D106 supplied from the control section 105 changes from "0" to "1".

When the control signal D106 is "1", the selector 131 selects a value stored in the register 130, that is, a value D131 ($\Pi\text{sign}(v_i)$ from i=1 to i=$d_c$) as a result of multiplication of sign bits D121 of messages D101 given from all branches corresponding to one row in the parity check matrix H, and outputs the value D131 as a 1-bit value D132 so that the 1-bit value D132 is stored in a register 132. The register 132 supplies the stored value D132 as a 1-bit value D133 to the selector 131 and an EXOR circuit 134. When the control signal D106 is "0", the selector 131 selects a value D133 supplied from the register 132, and outputs the value D133 so that the value D133 is stored in the register 132 again. That is, the register 132 supplies a value stored at the last time, to the selector 131 and the EXOR circuit 134 unless sign bits D121 of messages D101 (variable node messages $v_i$) given from all branches corresponding to one row in the parity check matrix H are multiplied completely.

On the other hand, the FIFO memory 133 delays the sign bit D121 until a new value D133 ($\Pi\text{sign}(v_i)$ from i=1 to i=$d_c$) is supplied from the register 132 to the EXOR circuit 134, and supplies the sign bit D121 as a 1-bit value D134 to the EXOR circuit 134. The EXOR circuit 134 performs EXORing of the value D133 supplied from the register 132 and the value D134 supplied from the FIFO memory 133 to thereby divide the value D133 by the value D134 and output a 1-bit division result as a quotient value D135. That is, the EXOR circuit 134 divides the product value of sign bits D121 ($\text{sign}(|v_i|)$) of messages D101 given from all branches corresponding to one row in the parity check matrix H by a sign bit D121 ($\text{sign}(|v_i|)$) of a message D101 given from a branch intended to calculate the check node message $u_j$, and outputs a quotient value ($\Pi\text{sign}(v_i)$ from i=1 to i=$d_c$-1) as a quotient value D135.

A total of 6 bits including the 5-bit operation result D129 outputted from the LUT 128 as the lower 5 bits of the 6 bits, and the 1-bit quotient value D135 outputted from the EXOR circuit 134 as the most significant bit (sign bit) of the 6 bits are outputted as a message D102 (check node message $u_j$) from the check node calculator 101.

As described above, the operation represented by the expression (7) is performed by the check node calculator 101 so that a check node message $u_j$ is obtained.

Since the maximum weight of one row in the parity check matrix H in FIG. 9 is 9, that is, since the maximum number of variable node messages $v_i$ supplied to a check node is 9, the check node calculator 101 has the FIFO memory 127 and the FIFO memory 133 for delaying nonlinear function operation results ($\phi(|v_i|)$) of 9 check node messages $v_i$. To calculate a check node message $u_j$ in a row whose row weight is smaller than 9, the delay amount in the FIFO memory 127 and the FIFO memory 133 is reduced to a value equal to the row weight.

FIG. 12 shows an example of configuration of the variable node calculator 103 of FIG. 10 for performing variable node operations one by one.

Similarly to FIG. 11, FIG. 12 also shows a variable node calculator 103 on the assumption that each message is quantized into a total of 6 bits including a sign bit.

Further, also in FIG. 12, a variable node operation of an LDPC code expressed by the parity check matrix H of FIG. 9 is performed. A clock ck is supplied to the variable node calculator 103 of FIG. 12. This clock ck is supplied to necessary blocks. Each block performs processing in synchronization with the clock ck.

The variable node calculator 103 of FIG. 12 performs an operation (variable node operation) in accordance with the expression (1) by using messages D103 read one by one from the branch memory 102 and reception data D104 ($u_{0i}$) read from the receiving memory 104, for example, on the basis of a 1-bit control signal D107 supplied from the control section 105.

That is, in the variable node calculator 103, 6-bit messages D103 (check node messages $u_j$) given from check nodes corresponding to each row in the parity check matrix H are read one by one and supplied to an operation unit 151 and an FIFO memory 155. Also in the variable node calculator 103, 6-bit receiving data D104 ($u_{0i}$) are read one by one from the receiving memory 104 and supplied to an operation unit 156. Further, a control signal D107 given from the control section 105 is supplied to the variable node calculator 103 so that the control signal D107 is supplied to a selector 153.

The operation unit 151 integrates a 6-bit message D103 (check node message $u_j$) by adding the 6-bit message D103 to a 9-bit value D151 stored in a register 152, and stores a 9-bit integrated value obtained as a result of the integration in the register 152 again. Incidentally, when messages D103 given from all branches corresponding to one column in the parity check matrix H have been integrated completely, the register 152 is reset.

Here, in the operation unit 151 and the register 152, the 6-bit message D103 is integrated at maximum up to the maximum number of delay times in the FIFO memory 155, i.e. the number of times equal to the maximum weight of one column in the parity check matrix H. Now, the maximum weight of one column in the parity check matrix H in FIG. 9 is 5. Accordingly, in the operation unit 151 and the register 152, the 6-bit message D103 is integrated at maximum up to 5 times (five 6-bit values are integrated). For this reason, at an output from the operation unit 151 and at outputs from portions after the operation unit 151, the number of quantization bits is 9 which is larger by 3 (the minimum number of bits capable of expressing 5 (times)) than the 6-bit message D103 so that a value obtained by integration of a 6-bit value 5 times can be expressed.

When messages D103 corresponding to one column in the parity check matrix H have been read one by one and an integrated value of the messages D103 corresponding to one column has been stored in the register 152, the control signal D107 supplied from the control section 105 changes from "0" to "1". When, for example, the column weight is "5", the control signal D107 takes "0" for the first clock to the fourth clock and takes "1" for the fifth clock.

When the control signal D107 is "1", the selector 153 selects a value stored in the register 152, i.e. a 9-bit value D151 ($\Sigma u_j$ from j=1 to $d_v$) as a result of integration of messages D103 (check node messages $u_j$) given from all branches corresponding to one column in the parity check matrix H, and outputs the 9-bit value D151 so that the 9-bit value D151 is stored in a register 154. The register 154 supplies the stored value D151 as a 9-bit value D152 to the selector 153 and the operation unit 156. When the control signal D107 is "0", the selector 153 selects a value D152 supplied from the register 154, and outputs the value D152 so that the value D152 is stored in the register 154 again. That is, the register 154 supplies a value integrated at the last time, to the selector 153 and the operation unit 156 unless messages D103 (check node messages $u_j$) given from all branches corresponding to one column in the parity check matrix H are integrated completely.

On the other hand, the FIFO memory 155 delays a message D103 given from a check node until a new value D152 ($\Sigma u_j$ from j=1 to j=$d_v$) is outputted from the register 154, and supplies the message D103 as a 6-bit value D153 to the operation unit 156. The operation unit 156 subtracts the value D153 supplied from the FIFO memory 155, from the value D152 supplied from the register 154. That is, the operation unit 156 subtracts a check node message $u_j$ given from a branch intended to calculate a variable node message $v_i$, from the integrated value of messages D103 (check node messages $u_j$) given from all branches corresponding to one column in the parity check matrix H to thereby obtain a difference value ($\Sigma u_j$ from j=1 to j=$d_v$-1). Further, in the operation unit 156, reception data D104 ($u_{0i}$) supplied from the receiving memory 104 are added to the difference value ($\Sigma u_j$ from j=1 to j=$d_v$-1), so that a 6-bit value obtained as a result of the addition is outputted as a message D105 (variable node message $v_i$).

As described above, the operation represented by the expression (1) is performed by the variable node calculator to thereby obtain a variable node message $v_i$.

Incidentally, since the maximum weight of one column in the parity check matrix H in FIG. 9 is 5, that is, since the maximum number of check node messages $u_j$ supplied to a variable node is 5, the variable node calculator 103 has the FIFO memory for delaying five check node messages $u_j$. To calculate a variable node message $v_i$ for a column whose column weight is smaller than 5, the delay amount in the FIFO memory 155 is reduced to a value equal to the column weight.

In addition, the operation unit 156 performs an operation of subtracting the 6-bit value D153 supplied from the FIFO memory 155 from the 9-bit value D152 supplied from the register 154 and of adding the 6-bit reception data D104 supplied from the receiving memory 104, so that a result of the operation may be smaller than the minimum value which can be expressed by a 6-bit message D105 or may be larger than the maximum value which can be expressed by the 6-bit message D105. When the operation result is smaller than the minimum value which can be expressed by the 6-bit message D105, the operation unit 156 clips the operation result to the minimum value. When the operation result is larger than the maximum value which can be expressed by the 6-bit message D105, the operation unit 156 clips the operation result to the maximum value.

In the decoding device of FIG. 10, control signals are given from the control section 105 in accordance with the weight of the parity check matrix H. According to the decoding device of FIG. 10, the control signals can be changed simply to make it possible to decode a variety of LDPC codes of parity check matrices H as long as capacities of the branch memories 100 and 102 and the FIFO memories 127, 133 and 155 of the check node calculator 101 and the variable node calculator 103 are sufficient.

Although not shown, in an ultimate stage of decoding in the decoding device of FIG. 10, an operation represented by the expression (5) is performed in place of the variable node operation represented by the expression (1), so that a result of the operation is outputted as an ultimate decoding result.

When the decoding device of FIG. 10 is used iteratively for decoding an LDPC code, the check node operation and the variable node operation are performed alternately. That is, in the decoding device of FIG. 10, the variable node calculator 103 performs the variable node operation by using results of the check node operation performed by the check node calculator 101 whereas the check node calculator 101 performs the check node operation by using results of the variable node operation performed by the variable node calculator 103.

Incidentally, although the decoding device of FIG. 10 is a full serial decoding device for decoding an LDPC code by performing operations of respective nodes one by one successively, other devices such as a full parallel decoding device (e.g. see Non-Patent Document 1) for performing operations of all nodes simultaneously, and a partly parallel decoding device (e.g. see Non-Patent Document 2 and Patent Document 1) for performing operations of neither one node nor all nodes but a certain number of nodes simultaneously have been also proposed.

For example, in the decoding device of FIG. 10, at least a bit number equal to a product of the code length of an LDPC code and the bit number (the number of quantization bits) of a quantized value for expressing reception data D104 is required as storage capacity of the receiving memory 104 for storing reception data D104. Moreover, at least a bit number equal to a product of the total number of branches (total branch number) and the bit number (the number of quantization bits) of a quantized value for expressing a message is required as storage capacity of the branch memory 100 or 102 for storing messages.

Accordingly, when the code length is 108, the bit number of a quantized value for expressing a message (including reception data D104) is 6, and the number of branches is 323 as described above, a receiving memory 104 having storage capacity of at least 648 (=108×6) bits, and branch memories 100 and 102 each having storage capacity of at least 1938 (=323×6) bits are required.

Although here is shown the case where the code length is 108 for the sake of simplification of description, a value of about several thousands can be practically used as the code length of an LDPC code.

On the other hand, in order to improve accuracy in decoding of an LDPC code, it is simply necessary to use a quantized value having a number of bits to a certain degree, as a quantized value for expressing a message including reception data D104.

As described above, storage capacities of the branch memories 100 and 102 and the receiving memory 104 are however proportional to the bit number of a quantized value for expressing a message. Accordingly, when a message is expressed by a quantized value with a large bit number, a large capacity memory is required as a memory serving as a constituent portion of the decoding device, to thereby result in an increase of the scale of the device.

Patent Document 1: JP-A-2004-364233

Non-Patent Document 1: C. Howland and A. Blanksby, "Parallel Decoding Architectures for Low Density Parity Check Codes", Symposium on Circuits and Systems, 2001

Non-Patent Document 2: E. Yeo, P. Pakzad, B. Nikolic and V. Anantharam, "VLSI Architectures for iterative Decoders in Magnetic Recording Channels", IEEE Transactions on Magnetics, Vol. 37, No. 2, March 2001

DISCLOSURE OF THE INVENTION

Problems that the Invention is to Solve

In the decoding device of FIG. 10, accuracy in the operation of the nonlinear function $\phi(|v_i|)$ and the operation of the inverse function $\phi^{-1}(\Sigma\phi|v_i|)$ among the check node operations performed in accordance with the expression (7) by the check node calculator 101 (FIG. 11) exerts influence on accuracy in decoding of an LDPC code.

That is, accuracy in decoding of an LDPC code becomes poor as accuracy in the operation of the nonlinear function $\phi(|v_i|)$ and the operation of the inverse function $\phi^{-1}(\Sigma\phi(|v_i|))$ becomes poor.

For example, accuracy in the operation of the nonlinear function $\phi(|v_i|)$ and the operation of the inverse function $\phi^{-1}(\Sigma\phi(|v_i|))$ can be improved either by a method of narrowing the quantization width of a quantized value used in the operation (difference between a numerical value expressed by a certain quantized value and a numerical value expressed by a quantized value different by 1 from the certain quantized value) or by a method of enlarging the dynamic range of a numerical value expressed by a quantized value (difference between the maximum and minimum of a numerical value expressed by a quantized value), or by the two methods.

The bit number of the quantized value however increases even when the quantization width is narrowed (while the current dynamic range is kept) or even when the dynamic range of the numerical value expressed by the quantized value is enlarged (while the current quantization width is kept).

In the case where a quantized value (capable of expressing a numerical value) with a narrow quantization width and a large dynamic range is used in the whole of the decoding device in order to improve accuracy in the operation of the nonlinear function $\phi(|v_i|)$ and the operation of the inverse function $\phi^{-1}(\Sigma\phi(|v_i|))$ to a certain degree or higher, the bit number of such a quantized value becomes so large that a large capacity memory is required as a memory serving as a constituent portion of the decoding device as described above, to thereby result in an increase of the scale of the device.

In the case where the operation of the nonlinear function $\phi(|v_i|)$ and the operation of the inverse function $\phi^{-1}(\Sigma\phi(|v_i|))$ are achieved by LUTs (121 and 128 in FIG. 11) as in the check node calculator 101 shown in FIG. 11, large capacity LUTs are required as LUTs each receiving or outputting a quantized value with a large bit number. Such large capacity LUTs occupy a large part of the circuit scale of the check node calculator 101.

The invention was developed under such circumstances. An object of the invention is to make it possible to decode an LDPC code with high accuracy while suppressing an increase of the scale of a device.

Means for Solving the Problems

According to one aspect of the invention, there is provided a decoding device or method including: a function operation unit/step in the first operation unit for receiving as an input a first quantized value which is a bit string expressing a numerical value with a fixed quantization width, and outputting a result of an operation of a nonlinear function as a second quantized value which is a bit string expressing a numerical value with a quantization width determined by a part of the bit string, the first operation unit being provided for performing a check node operation of a check node for decoding an LDPC code, the check node operation including an operation of the nonlinear function and an operation of an inverse function of the nonlinear function; and an inverse function operation unit/step in the first operation unit for receiving the second quantized value as an input, and outputting a result of the operation of the inverse function of the nonlinear function as the first quantized value.

In the decoding device or method according to the aspect, when a check node operation which is a check node operation of a check node for decoding an LDPC code and which includes an operation of a nonlinear function and an operation of an inverse function of the nonlinear function is performed, a first quantized value which is a bit string expressing a numerical value with a fixed quantization width is received as an input and a result of the operation of the nonlinear function is outputted as a second quantized value which is a bit string expressing a numerical value with a quantization width determined by a part of the bit string whereas the second quantized value is received as an input and a result of the operation of the inverse function of the nonlinear function is outputted as the first quantized value.

Effect of the Invention

According to the invention, it is possible to decode an LDPC code with high accuracy while suppressing an increase of the scale of a device.

BRIEF DESCRIPTION OF THE DRAWINGS

Figures 1, 2:
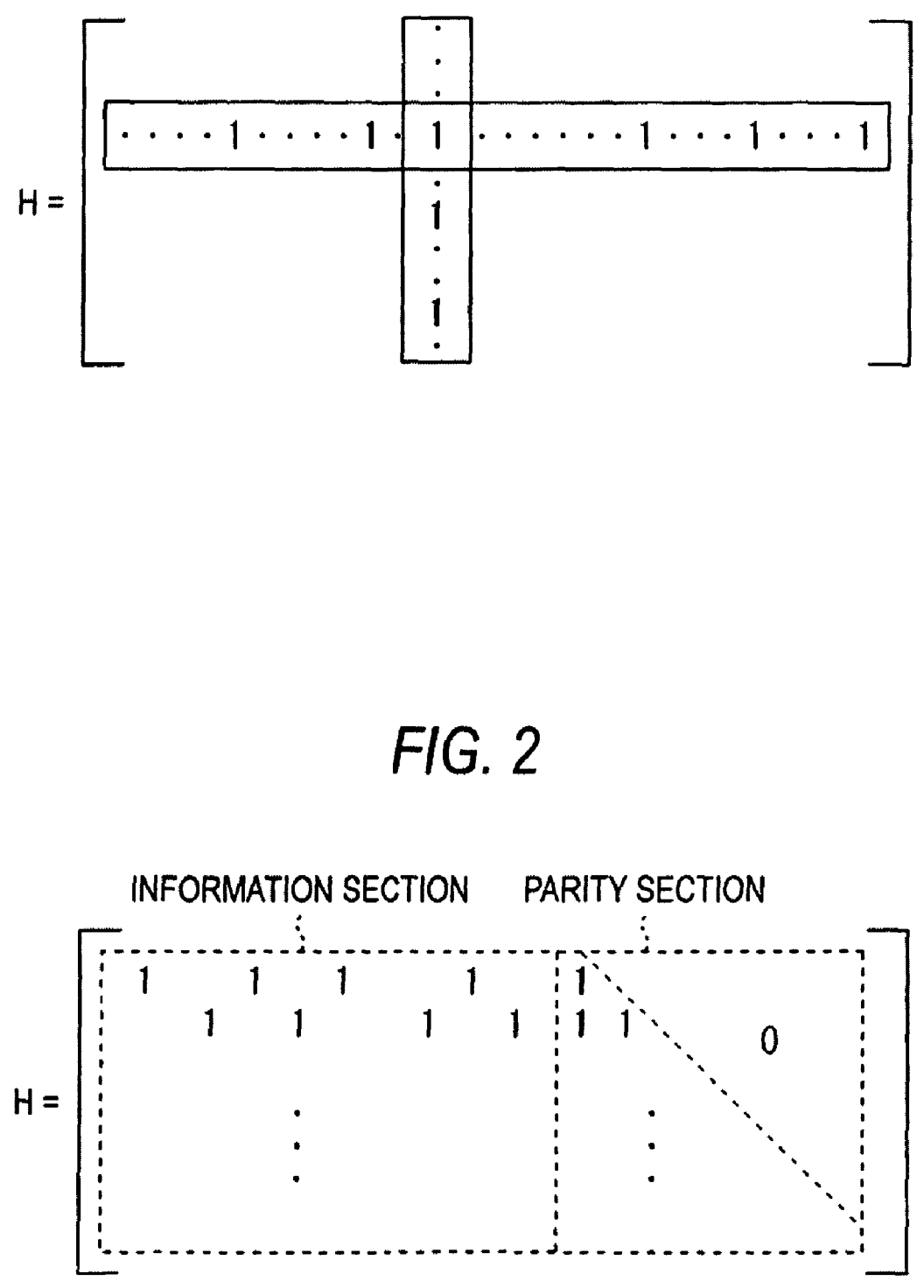

FIG. 1 A view for describing a parity check matrix H of an LDPC code.

FIG. 2 A view for showing a parity check matrix H having a lower triangular matrix as a parity section.

FIG. 5 A view showing an example of a parity check matrix H of an LDPC code.

FIG. 19 A view for describing an LUT 221.

FIG. 20 A view for describing a converting circuit 231.

FIG. 22 A view for describing a converting circuit 233.

DESCRIPTION OF REFERENCE NUMERALS

100, 102 branch memory, 103 variable node calculator, 104 receiving memory, 105 control section, 129 EXOR circuit, 130 register, 131 selector, 132 register, 133 FIFO memory, 134 EXOR circuit, 171, 181 check node calculator, 221, 228 LUT, 231 to 233 converting circuit, 410 memory for storing intermediate decoding results, 411 switch, 412 quasi-check node calculator, 413 branch memory, 415 quasi-variable node calculator, 416 receiving memory, 417 control section, 431 operation unit, 432 LUT, 433 operation unit, 434 register, 435 selector, 436 register, 437 operation unit, 438 FIFO memory, 439 LUT, 440 EXOR circuit, 441 register, 442 selector, 443 register, 444 FIFO memory, 445 EXOR circuit, 471 operation unit, 472 register, 473 selector, 474 register, 475 operation unit, 501 to 503 converting circuit, 504 LUT, 1211 LUT, 1122 operation unit, 1123 register, selector, 1125 register, 1126 operation unit, 1127 FIFO memory, 1128 LUT.

BEST MODES FOR CARRYING OUT THE INVENTION

Modes for carrying out the invention will be described hereinafter with reference to the drawings.

Figure 13:
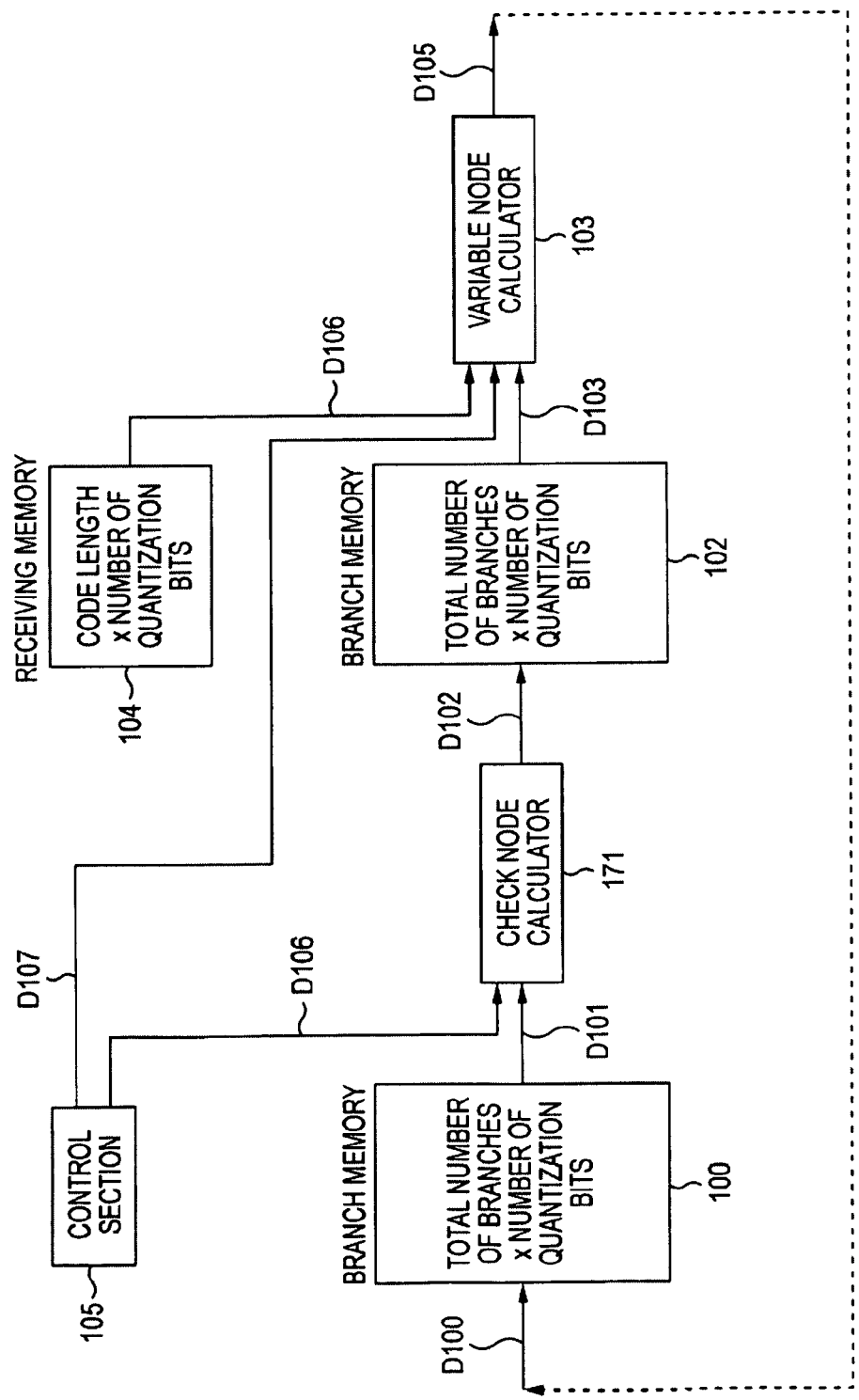
FIG. 13 A block diagram showing an example of configuration of a decoding device to which the invention is applied.

FIG. 13 shows an example of configuration of a decoding device which is used for decoding an LDPC code and to which the invention is applied.

Figure 10:
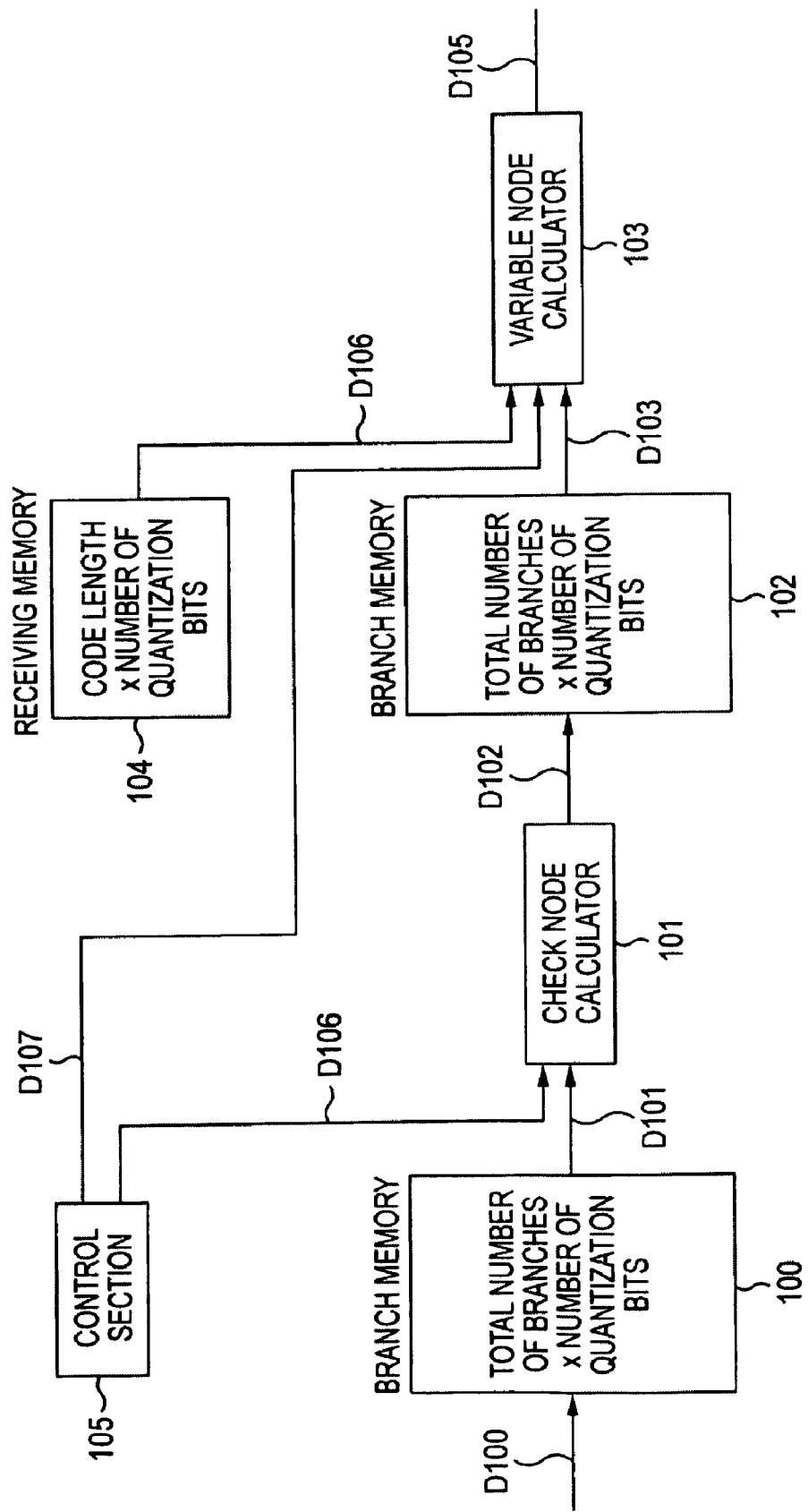
FIG. 10 A block diagram showing an example of configuration of an LDPC code decoding device for performing node operations one by one.

In FIG. 13, like numbers refer to like portions corresponding to the decoding device in FIG. 10. Description about these portions will be hereinafter omitted appropriately.

The decoding device in FIG. 13 is common to the decoding device in FIG. 10 in that branch memories 100 and 102, a variable node calculator 103, a receiving memory 104 and a control section 105 are provided. The decoding device in FIG. 13 is different from the decoding device in FIG. 10 in that a check node calculator 171 is provided in place of the check node calculator 101.

Figure 3:
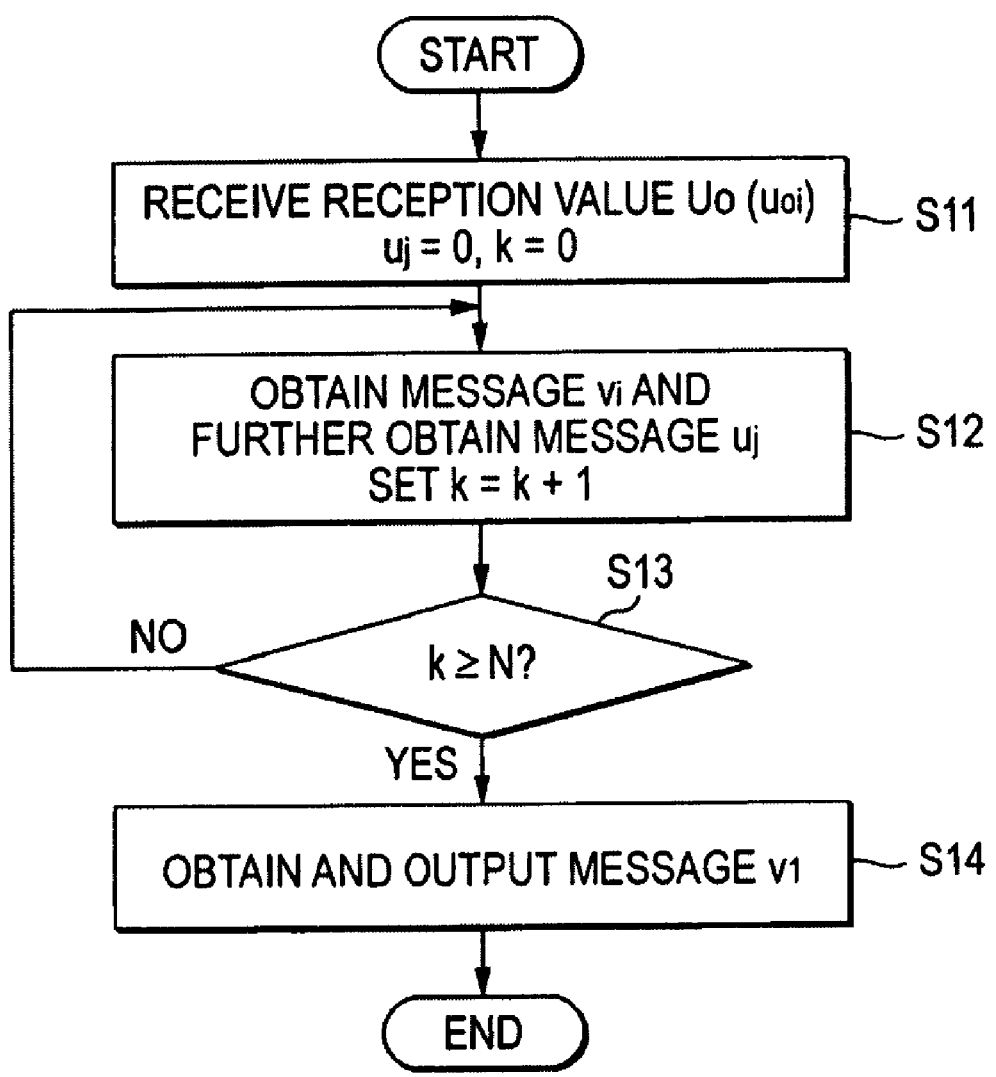
FIG. 3 A flow chart for describing a procedure of decoding an LDPC code.
Figure 4:
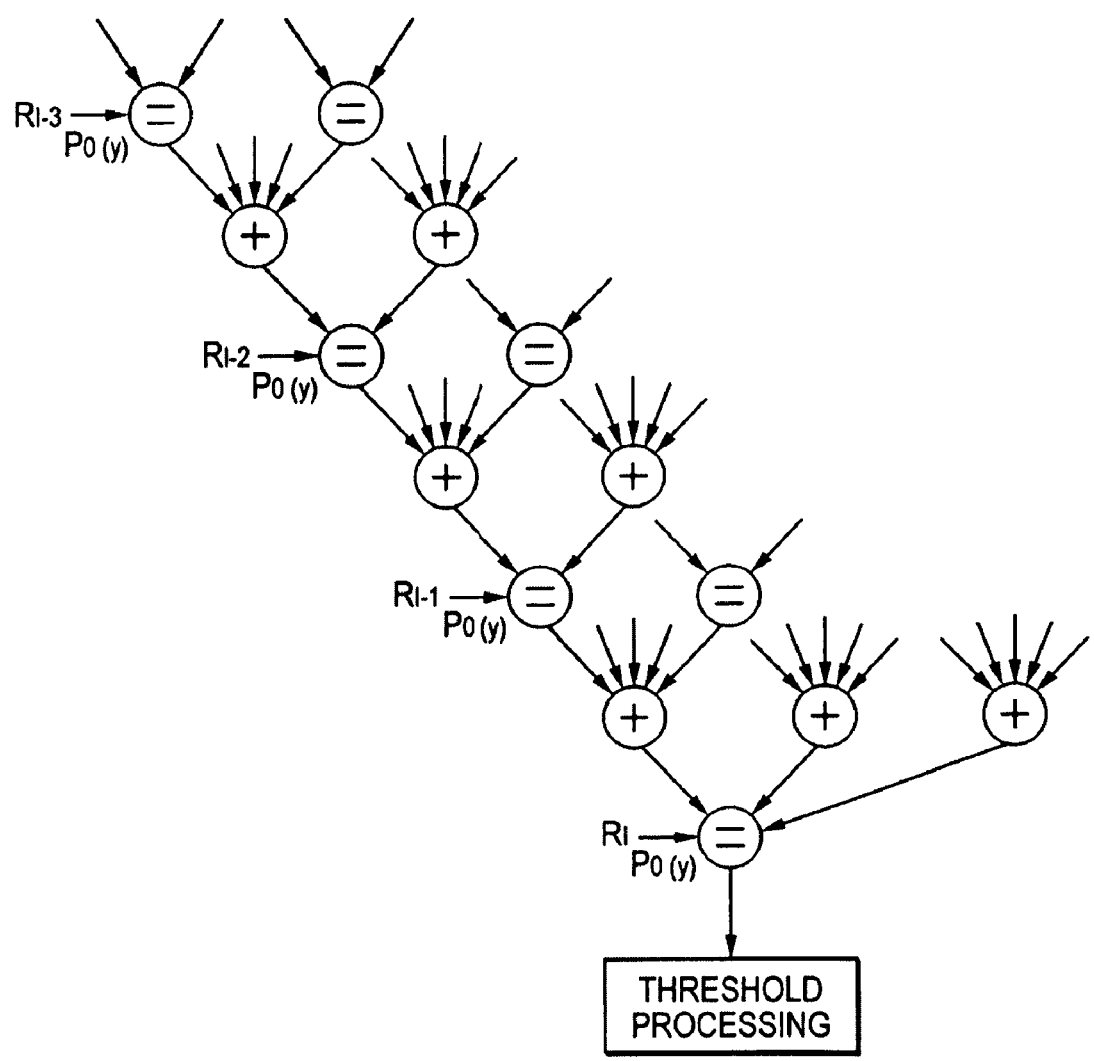
FIG. 4 A view for describing a flow of messages.
Figure 6:
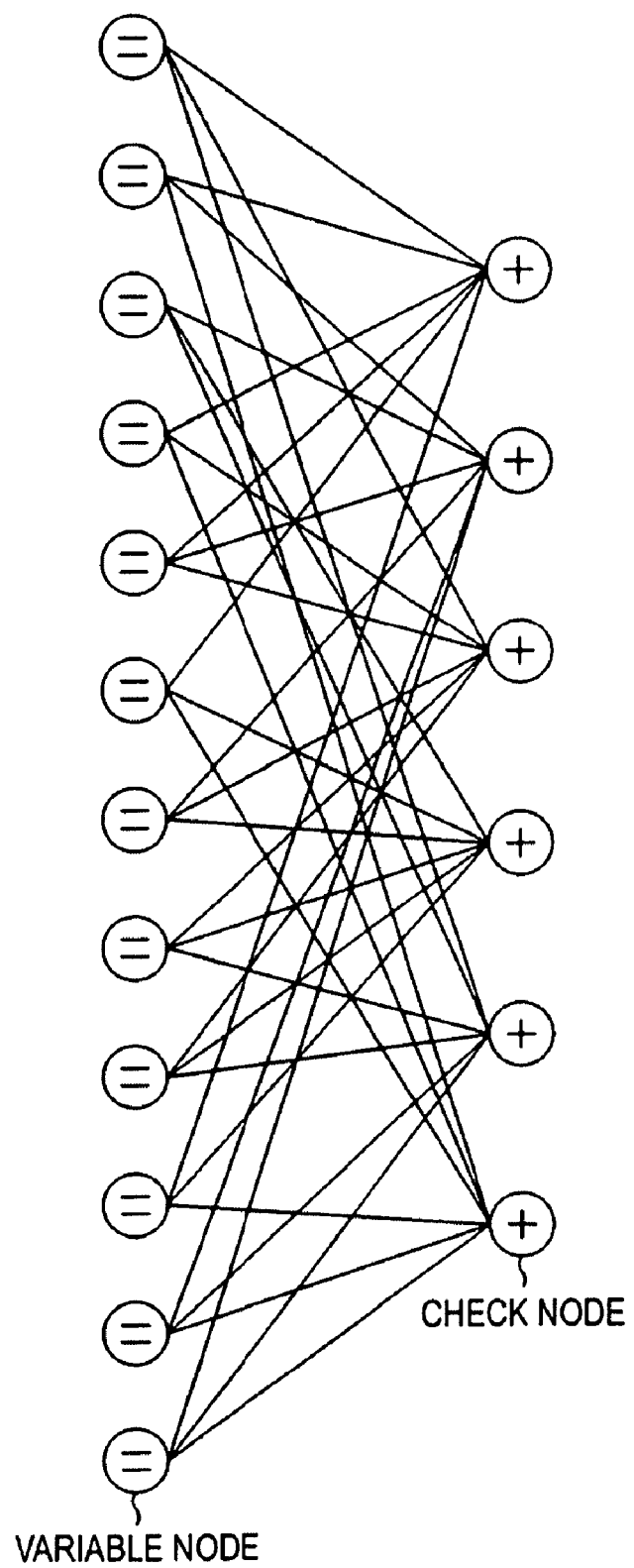
FIG. 6 A view showing a Tanner graph of a parity check matrix.
Figure 7:
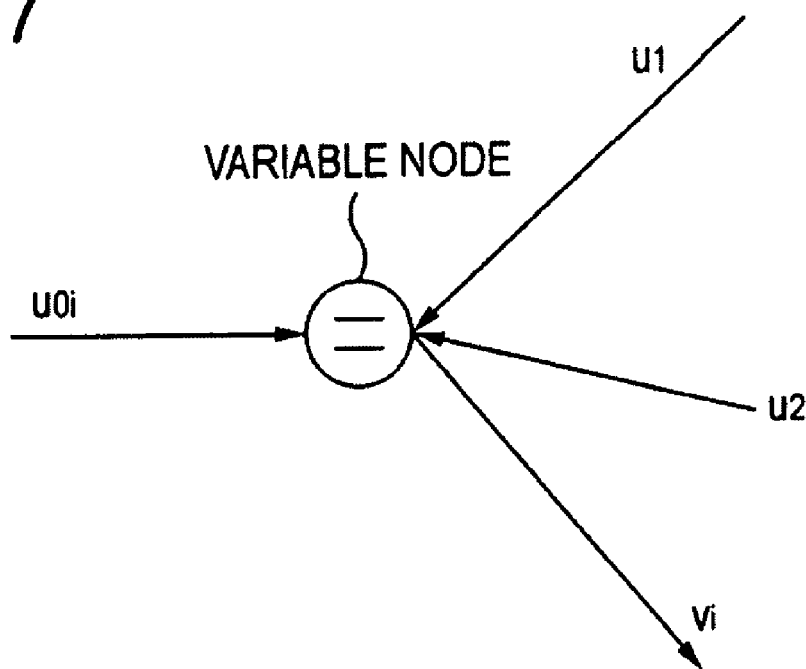
FIG. 7 A view showing a variable node.
Figure 8:
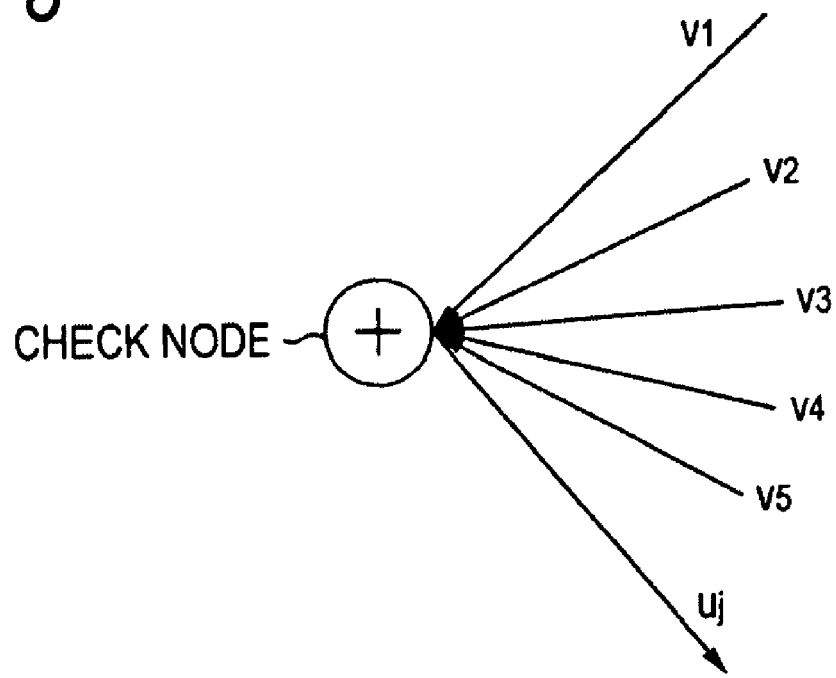
FIG. 8 A view showing a check node.
Figure 9:
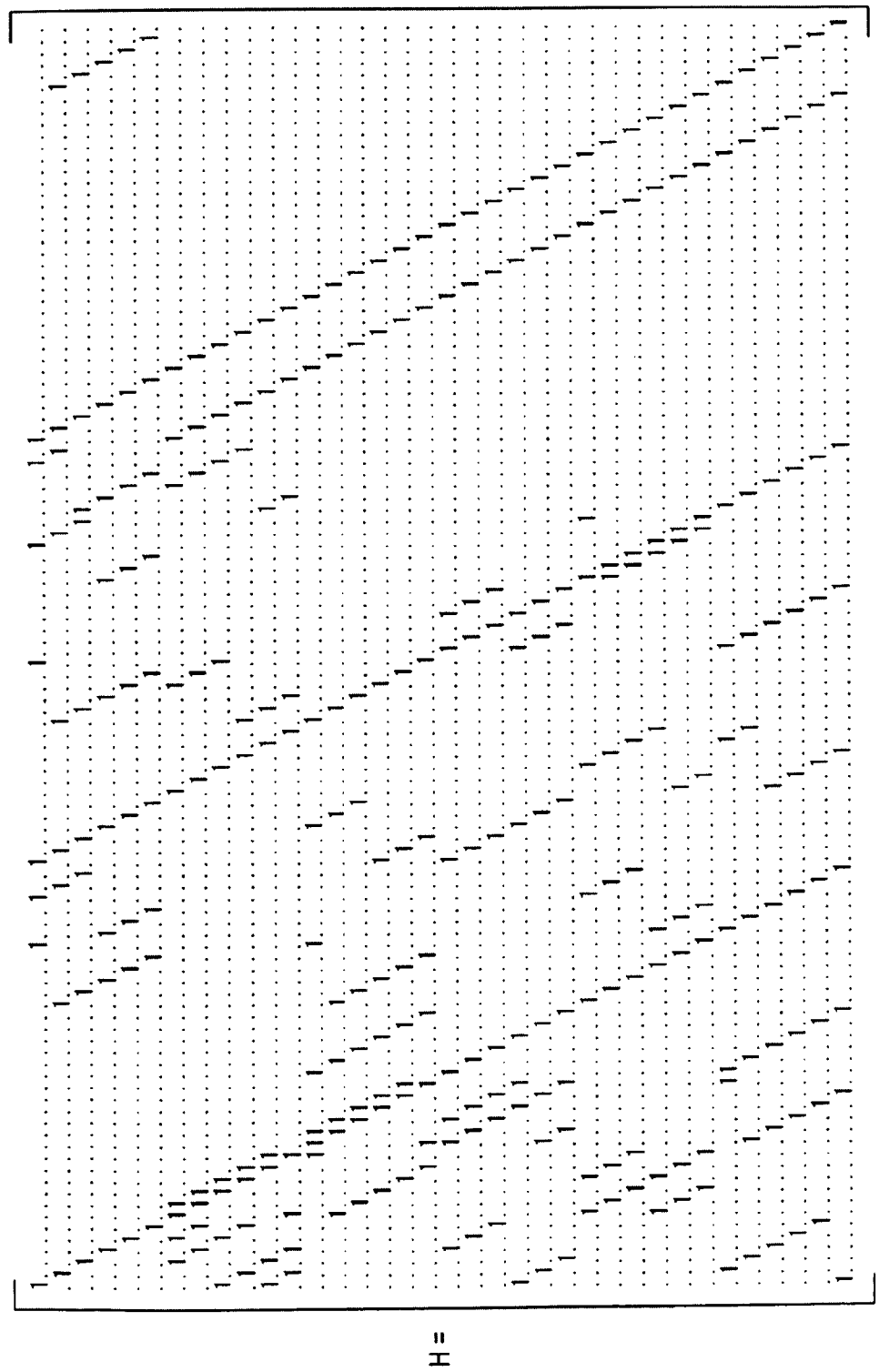
FIG. 9 A view showing an example of a parity check matrix H of an LDPC code.

Assume that, for example, the aforementioned LDPC code (of coding rate 2/3 and code length 108) expressed by the parity check matrix H shown in FIG. 9 is decoded in the decoding device in FIG. 13. The same assumption applies to decoding devices of FIGS. 17 and 26 which will be described later.

In the decoding device in FIG. 13, the check node calculator 171 performs a check node operation while the variable node calculator 103 performs a variable node operation. By performing the check note operation and the variable node operation alternately, the LDPC code is decoded.

That is, reception data $u_{0i}$ of the LDPC code are successively supplied and stored in the receiving memory 104 at intervals of a code length (108 in this case as described above).

The variable node calculator 103 performs the variable node operation of each variable node for decoding the LDPC code.

That is, messages D102 (check node messages $u_j$) as results of the check node operations performed by the check node calculator 171 which will be described later are stored in the branch memory 102. The branch memory 102 supplies the messages D102 as messages D103 to the variable node calculator 103. Further, a control signal D107 is supplied from the control section 105 to the variable node calculator 103 while each reception data D104 is supplied from the receiving memory 104 to the variable node calculator 103.

Figure 12:
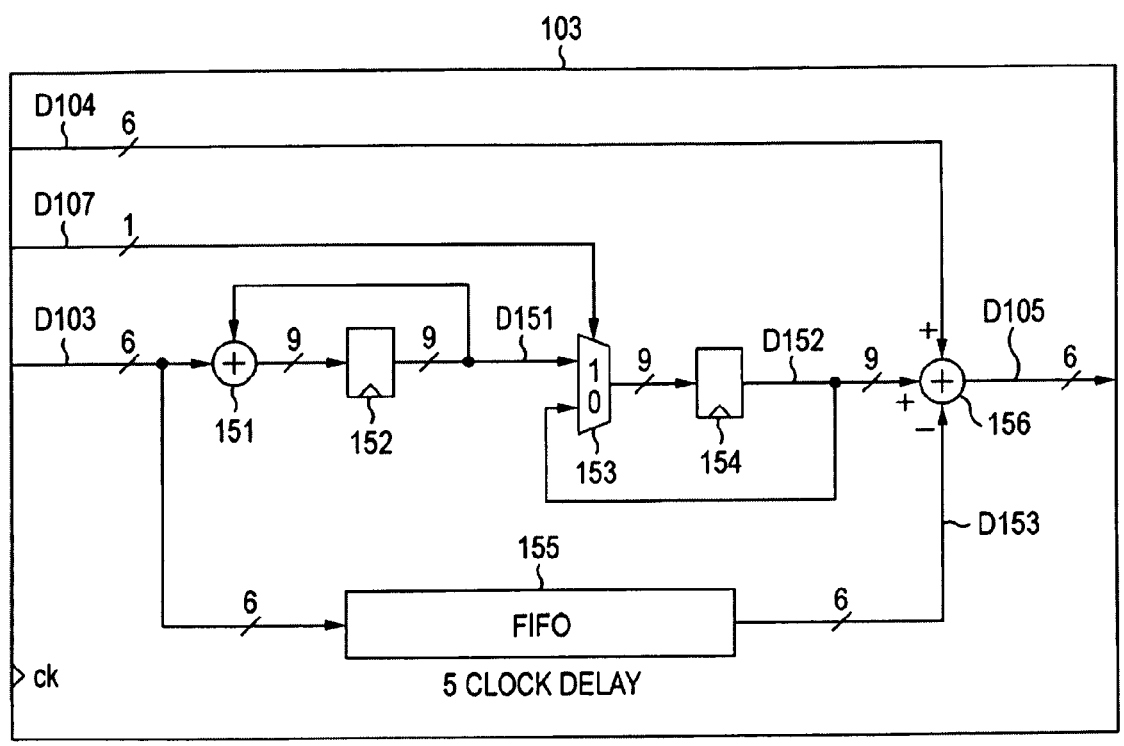
FIG. 12 A block diagram showing an example of configuration of a variable node calculator 103 for calculating messages one by one.

The variable node calculator 103 is configured as shown in FIG. 12 as described above. The variable node calculator performs the variable node operation in accordance with the expression (1) by using the messages D103 (check node messages $u_j$) supplied from the branch memory 100 and the reception data D104 ($u_{0i}$) supplied from the receiving memory 100 on the basis of the control signal D107, and supplies messages D105 (variable node messages $v_i$) obtained as results of the variable node operation, as messages D100, to the branch memory 100.

The branch memory 100 stores the messages D100 (variable node messages $v_i$) which are obtained as the results of the variable node operation and which are supplied from the variable node calculator 103. The branch memory 100 reads the messages D100 as messages D101 and supplies the messages D101 to the check node calculator 171.

The check node calculator 171 performs a check node operation which is a check node operation of each check node for decoding the LDPC code and which includes an operation of a nonlinear function and an operation of an inverse function of the nonlinear function.

That is, the check node calculator 171 performs a check node operation in accordance with the expression (7) including an operation of a nonlinear function $\phi(x)$ and an operation of an inverse function $\phi^{-1}(x)$ of the nonlinear function $\phi(x)$ by using the messages D101 (variable node messages $v_i$) given from the branch memory 100 on the basis of the control signal D106 supplied from the control section 105, and supplies messages D102 (check node messages $u_j$) obtained by the check node operation to the post-stage branch memory 102.

The branch memory 102 stores the messages D102 supplied from the ante-stage check node calculator 171. As described above, the messages D102 stored in the branch memory 102 are read as messages D103, so that the messages D103 are supplied to the variable node calculator 103.

In the decoding device in FIG. 13, the variable node operation and the check node operation are carried out iteratively, for example, a predetermined number of times, on each reception data $u_{0i}$ of a code length stored in the receiving memory 104. At the last time, an operation represented by the expression (5) is performed in place of the variable node operation represented by the expression (1), so that a result of the operation represented by the expression (5) is outputted as an ultimate decoding result of each reception data $u_{0i}$ (LDPC code) of a code length stored in the receiving memory 104.

The decoding device of FIG. 13 is common to the aforementioned decoding device of FIG. 10 in that an LDPC code is decoded by performing the check node operation and the variable node operation iteratively.

The decoding device of FIG. 13 uses a quantized value expressing a numerical value with higher accuracy than that of a quantized value used by the decoding device of FIG. 10, in a process part of from the operation of the nonlinear function φ(x) to the operation of the inverse function φ⁻¹(x) in a process performed as the check node operation and the variable node operation, but uses the same quantized value as that used by the decoding device of FIG. 10 in the other process part.

Here, in the decoding device of FIG. 10, as described above, messages (reception data $u_{0i}$ are processed in the same manner) are expressed by 6-bit quantized values assigned to numerical values which are obtained by equally dividing a predetermined numerical value range into 64 values which can be expressed by 6 bits including a sign bit. That is, when the predetermined numerical value range is from −R/2 to +R/2 (R>0), 6-bit quantized values expressing messages respectively are assigned to 64 numerical values in the range of from −R/2 to +R/2−R/64 at intervals of a quantization width of R/64, and express the numerical values respectively. Each 6-bit quantized value expressing a message is now referred to as ordinary quantized value.

In the decoding device in FIG. 13, a quantized value which expresses a numerical value with higher accuracy than the ordinary quantized value and which is used in the process part of from the operation of the nonlinear function φ(x) to the operation of the inverse function φ⁻¹(x) is referred to as high-accuracy quantized value.

Since the high-accuracy quantized values express numerical values with higher accuracy than the ordinary quantized values, the quantization width of the high-accuracy quantized values, i.e. (the absolute value of) a difference between a numerical value assigned to a certain quantized value and a numerical value assigned to a quantized value smaller by one than the certain quantized value is smaller than that of the ordinary quantized values.

Accordingly, when the bit number of the high-accuracy quantized value is set to be the same as the bit number (6 bits in this case) of the ordinary quantized value, the numerical value range which can be expressed by the high-accuracy quantized value is narrower than the numerical value range which can be expressed by the ordinary quantized value. That is, the difference (dynamic range) between the maximum and minimum values which can be expressed by the high-accuracy quantized value is narrower than the difference (dynamic range) between the maximum and minimum values which can be expressed by the ordinary quantized value.

Under the condition that the dynamic range which can be expressed by the high-accuracy quantized value when the bit number of the high-accuracy quantized value is set to be the same as the bit number of the ordinary quantized value is represented by Dy1 while the quantization width of such a high-accuracy quantized value is represented by Qd1, it is necessary that the bit number of the high-accuracy quantized value is larger than the bit number of the ordinary quantized value, for example, in the case where a numerical value range with a dynamic range of Dy2 wider than Dy1 is expressed by the high-accuracy quantized value while the quantization width of the high-accuracy quantized value is kept as Qd1 or in the case where a numerical value range with a dynamic range of Dy1 is expressed by the high-accuracy quantized value while the quantization width of the high-accuracy quantized value is set to be Qd2 which is narrower than Qd1.

Although a quantized value expressing a numerical value with higher accuracy than the ordinary quantized value, that is, a quantized value with a quantization width narrower than the ordinary quantized value can be employed as the high-accuracy quantized value regardless of the dynamic range and the bit number, a quantized value with a quantization width smaller than the ordinary quantized value, with a dynamic range wider than the ordinary quantized value and with a bit number larger than the ordinary quantized value is employed here as the high-accuracy quantized value.

For example, assuming that the bit number of the high-accuracy quantized value is 10 (bits), inclusive of a sign bit, which is larger than the bit number (6 bits) of the ordinary quantized value, then the decoding device of FIG. 13 uses the high-accuracy quantized value of 10 bits in a process part (hereinafter referred to as nonlinear function in-operation process appropriately) of from the operation of the nonlinear function φ(x) to the operation of the inverse function φ⁻¹(x), and uses the ordinary quantized value of 6 bits in the other process part.

Here, the nonlinear function in-operation process is a part of the check node operation process. The high-accuracy quantized value of 10 bits is used only in the nonlinear function in-operation process. Accordingly, since the ordinary quantized value of 6 bits is used either in each of messages stored in the branch memories 100 and 102 or in each of reception data $u_{0i}$ stored in the receiving memory 104, necessary storage capacities of the branch memories 100 and 102 and the receiving memory 104 in the decoding device of FIG. 13 are the same as those in the decoding device of FIG. 10.

Figure 14:
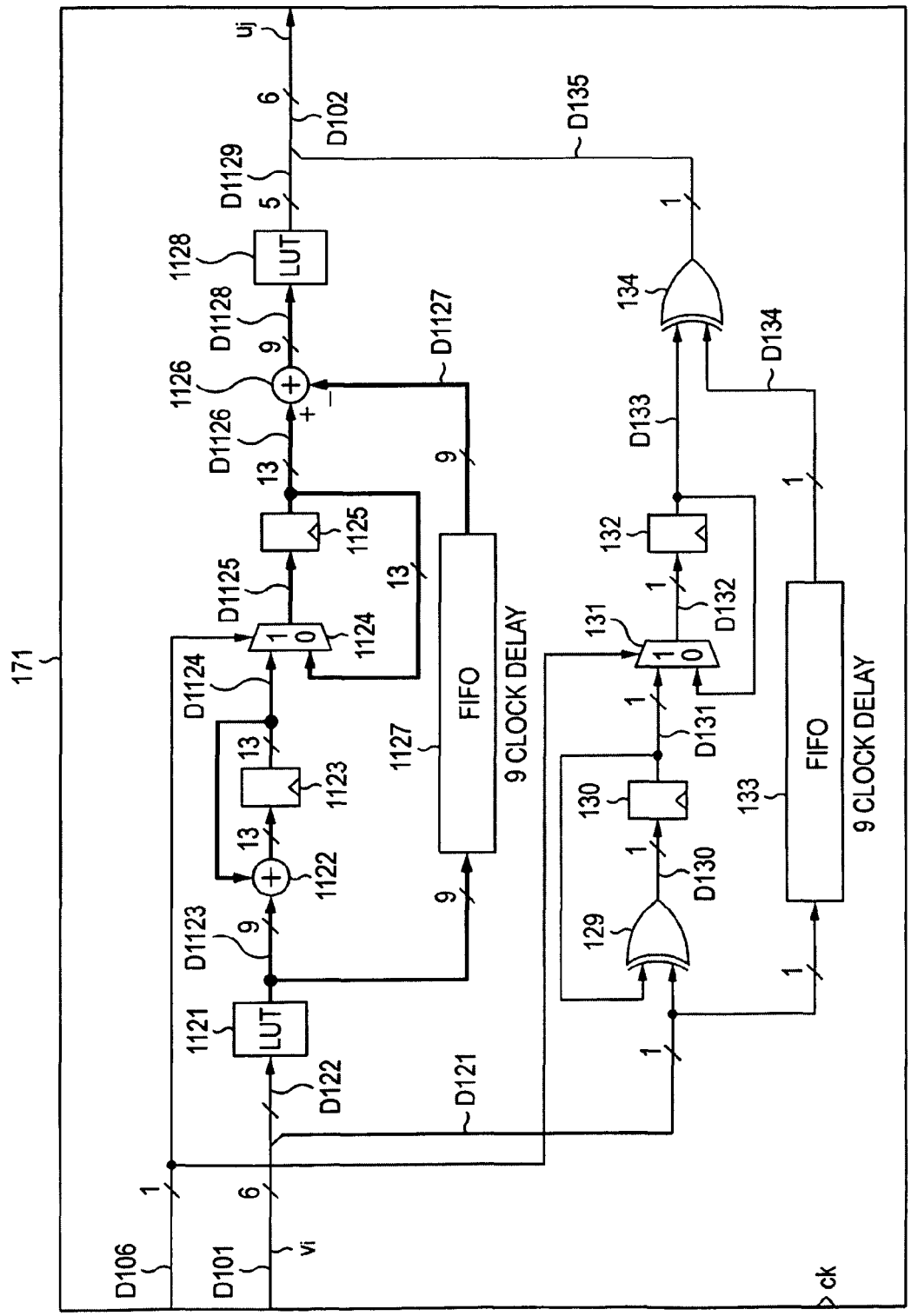
FIG. 14 A block diagram showing an example of configuration of a check node calculator 171.

Next, FIG. 14 shows an example of configuration of the check node calculator 171 in FIG. 13. Incidentally, in FIG. 14, like numerals refer to like portions corresponding to the check node calculator 101 in FIG. 11. Description about these portions will be hereinafter omitted appropriately.

Figure 11:
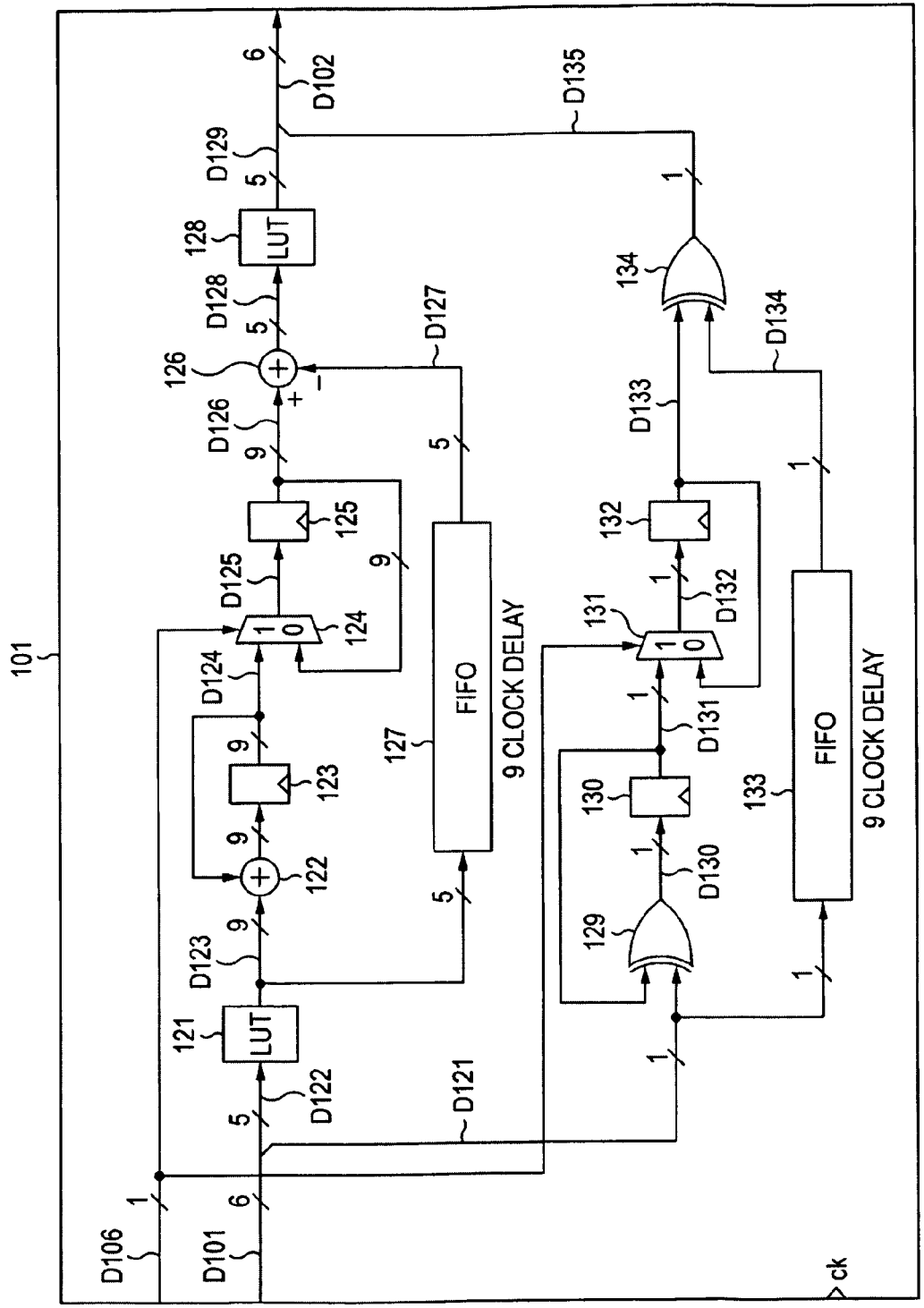
FIG. 11 A block diagram showing an example of configuration of a check node calculator 102 for calculating messages one by one.

In the check node calculator 171, an LUT 1121, an operation unit 1122, a register 1123, a selector 1124, a register 1125, an operation unit 1126, an FIFO memory 1127 and an LUT 1128 are provided in place of the LUT 121, the operation unit 122, the register 123, the selector 124, the register 125, the operation unit 126, the FIFO memory 127 and the LUT 128 of FIG. 11. Further, the check node calculator 171 is different from the check node calculator 101 of FIG. 11 in that the bit number of each portion shown in thick line in FIG. 14 is larger by 4 which is the bit number difference between the high-accuracy quantized value and the ordinary quantized value.

In the same manner as the check node calculator 101 in FIG. 11, the check node calculator 171 in FIG. 14 also performs a check node operation in accordance with the expression (7) by using messages D101 (variable node messages $v_i$) read one by one from the branch memory 100, for example, on the basis of a 1-bit control signal D106 supplied from the control section 105.

Figure 15:
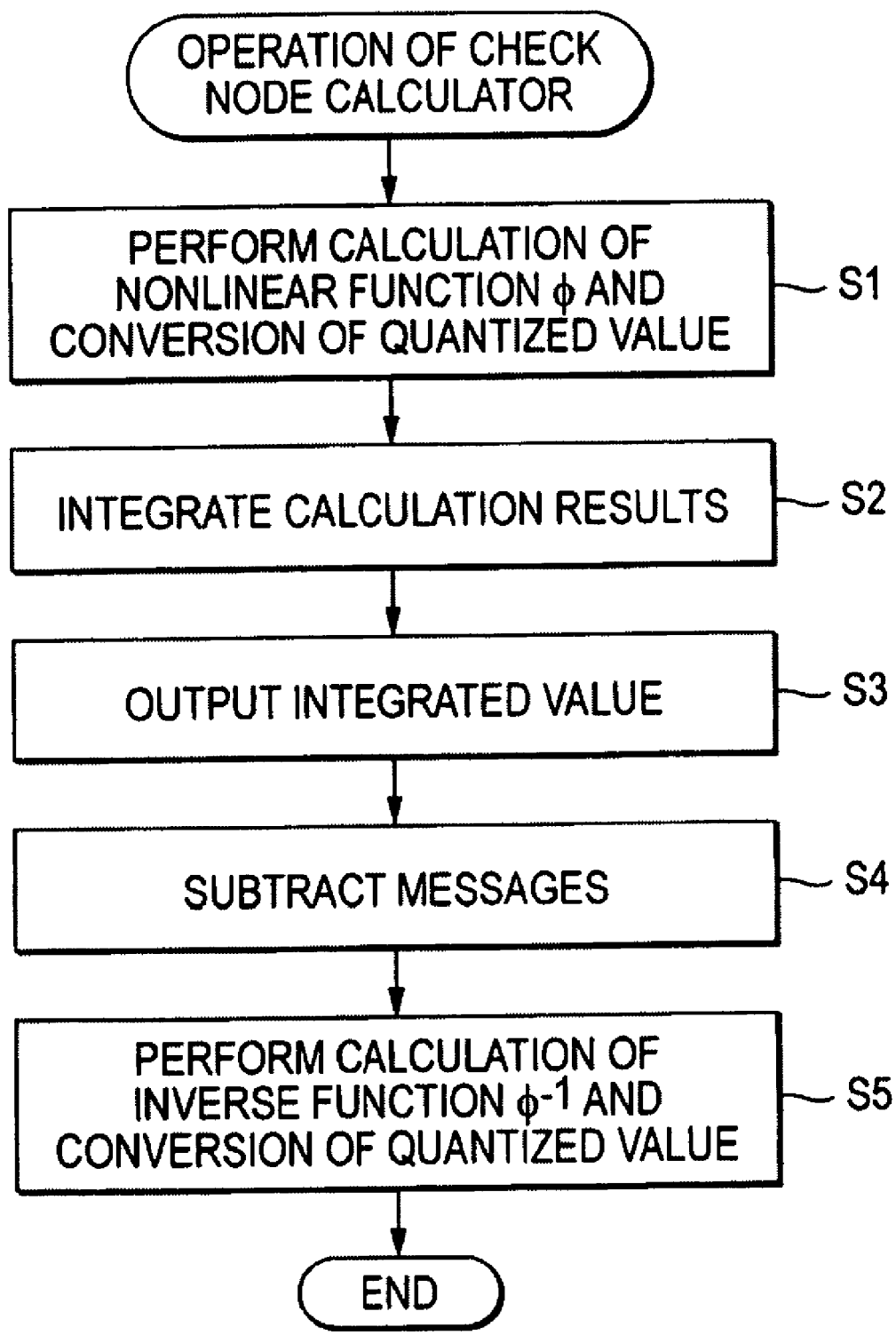
FIG. 15 A flow chart for describing processing of the check node calculator 171.

That is, FIG. 15 shows a process performed by the check node calculator 171.

In the check node calculator 171, messages D101 (variable node messages $v_i$) of 6 bits given from variable nodes corresponding to each column in the parity check matrix H are read one by one from the branch memory 100 (FIG. 13), so that an absolute value D122($|v_i|$) which is the lower 5 bits of each 6-bit message is supplied to the LUT 1121 whereas a sign bit D121 which is the most significant bit of each 6-bit message is supplied to an EXOR circuit 129 and an FIFO (First In First Out) memory 133. A control signal D106 is given to the check node calculator 171 from the control section 105 so that the control signal D106 is supplied to the selector 1124 and a selector 131.

The LUT 1121 stores operation results D1123 (φ($|v_i|$)) of the nonlinear function φ($|v_i|$) in the expression (7) in association with the 5-bit absolute values D122 ($|v_i|$). Further, in the LUT 1121, each absolute value D122 ($|v_i|$) is expressed by an ordinary quantized value while each operation result D1123

($\phi(|v_i|)$) of the nonlinear function $\phi(|v_i|)$ is expressed by a high-accuracy quantized value with no sign bit. That is, the LUT 1121 stores the operation results D1123 ($\phi(|v_i|)$) of the nonlinear function $\phi(|v_i|)$, for example, of 9 bits expressed by high-accuracy quantized values, in association with the 5-bit absolute values D122 ($|v_i|$) expressed by ordinary quantized values.

In step S1, the LUT 1121 receives as an input an absolute value D122 ($|v_i|$) of 5 bits expressed by an ordinary quantized value, reads an operation result D1123 ($\phi(|v_i|)$) of the nonlinear function $\phi(|v_i|)$, of 9 bits expressed by a high-accuracy quantized value in association with the absolute value D122 ($|v_i|$), and outputs the operation result D1123 ($\phi(|v_i|)$) to the operation unit 1122 and the FIFO memory 1127.

Accordingly, in the step S1, the LUT 1121 equivalently performs a process for performing an operation of the nonlinear function $\phi(|v_i|)$ in the expression (7) and a process for converting an ordinary quantized value into a high-accuracy quantized value. After that, processing is performed by using such a high-accuracy quantized value, until a process for converting a high-accuracy quantized value into an ordinary quantized value is performed in the LUT 1128 which will be described later.

Then, in step S2, the operation unit 1122 integrates the operation result D1123 by adding the operation result D1123 ($\phi(|v_i|)$) of 9 bits to a value D1124 of 13 bits stored in the register 1123, and stores an integrated value of 13 bits as a result of the integration in the register 1123 again. Incidentally, when operation results for absolute values D122 ($|v_i|$) of messages D101 from all branches corresponding to one row in the parity check matrix H are integrated completely, the register 1123 is reset.

Here, in the operation unit 1122 and the register 1123, the operation result D1123 ($\phi(|v_i|)$) of 9 bits supplied from the LUT 1121 is integrated at maximum up to a number of maximum delay times in the FIFO memory 1127, i.e. the number of times equal to the maximum weight of one row in the parity check matrix H. The maximum weight of one row in the parity check matrix H in FIG. 9 is 9 now. Accordingly, in the operation unit 1122 and the register 1123, the high-accuracy quantized value of 9 bits is integrated at maximum up to 9 times (nine 9-bit high-accuracy quantized values are integrated). For this reason, at an output from the operation unit 1122 and at outputs from portions after the operation unit 1122, the bit number of the high-accuracy quantized value is 13 which is larger by 4 (the minimum bit number capable of expressing 9 (times)) than the 9 bits of the operation result D1123 ($\phi(|v_i|)$) outputted from the LUT 1121 so that a value obtained as a result of integration of the 9-bit high-accuracy quantized value 9 times can be expressed.

When the messages D101 (variable node messages $v_i$) corresponding to one row in the parity check matrix H have been read one by one and the integrated value as a result of integration of the operation results D1123 corresponding to one row have been stored in the register 1123, the control signal D106 supplied from the control section 105 changes from "0" to "1". When, for example, the row weight in the parity check matrix H is "9", the control signal D106 takes "0" for the first clock to the eighth clock and takes "1" for the ninth clock.

When the control signal D106 is "1", the selector 1124 selects a value stored in the register 1123, i.e. a 13-bit integrated value D1124 ($\Sigma\phi(|v_i|)$ from i=1 to i=$d_c$) as a result of integration of $\phi(|v_i|)$ obtained from the messages D101 (variable node messages $v_i$) given from all branches corresponding to one row in the parity check matrix H, and outputs the 13-bit value D1124 as a 13-bit value D1125 so that the 13-bit value D1125 is stored in the register 1125 in step S3. The register 1125 supplies the stored value D1125 as a 13-bit value D1126 to the selector 1124 and the operation unit 1126.

When the control signal D106 is "0", the selector 1124 selects a value D1126 supplied from the register 1125, and outputs the value D1126 so that the value D1126 is stored in the register 1125 again. That is, unless $\phi(|v_i|)$ obtained from the messages D101 (variable node messages $v_i$) from all branches corresponding to one row in the parity check matrix H are integrated completely, the register 1125 supplies $\phi(|v_i|)$ integrated at the last time, to the selector 1124 and the operation unit 1126.

On the other hand, the FIFO memory 1127 delays the 9-bit operation result D1123 ($\phi(|v_i|)$) outputted from the LUT 1121 until a new value D1126 ($\Sigma\phi(|v_i|)$ from i=1 to i=$d_c$) is outputted from the register 1125, and supplies the 9-bit calculation result D1123 ($\phi(|v_i|)$) as a 9-bit value D1127 to the operation unit 1126. In step S4, the operation unit 1126 subtracts the 9-bit value D1127 supplied from the FIFO memory 1127, from the 13-bit value D1126 supplied from the register 1125 (integrates a value obtained by multiplying the 9-bit value D1127 supplied from the FIFO memory 1127 by −1, with the 13-bit value D1126 supplied from the register 1125), and supplies a result of the subtraction as a 9-bit difference value D1128 to the LUT 1128.

That is, the operation unit 1126 subtracts $\phi(|v_i|)$ obtained from a message D101 (variable node message $v_i$) given from a branch intended to calculate a check node message $u_j$, from the integrated value of $\phi(|v_i|)$ obtained from the messages D101 (variable node messages $v_i$) given from all branches corresponding to one row in the parity check matrix H, and supplies the difference value ($\Sigma\phi(|v_i|)$ from i=1 to i=$d_c$−1) as a difference value D1128 to the LUT 1128.

Incidentally, when a quantized value (high-accuracy quantized value) as a subtraction result obtained by subtracting the 9-bit value D1127 supplied from the FIFO memory from the 13-bit value D1126 supplied from the register 1125 exceeds the maximum value which can be expressed by the 9-bit difference value D1128, the operation unit 1126 clips the high-accuracy quantized value as a subtraction result to the maximum value which can be expressed by a 9-bit high-accuracy quantized value, and outputs the clipped high-accuracy quantized value as a 9-bit difference value D1128.

The LUT 1128 stores an operation result D1129 ($\phi^{-1}(\Sigma\phi(|v_i|))$) of the operation of the inverse function $\phi^{-1}(\Sigma\phi(|v_i|))$ in the expression (7) in association with the difference value D1128 ($\Sigma\phi(|v_i|)$ from i=1 to i=$d_c$−1). Further, in the LUT 1128, the difference value D1128 ($\Sigma\phi(|v_i|)$ from i=1 to i=$d_c$−1) is expressed by a high-accuracy quantized value whereas the operation result D1129 ($\phi^{-1}(\Sigma\phi(|v_i|))$) of the inverse function $\phi^{-1}(\Sigma\phi(|v_i|))$ is expressed by an ordinary quantized value with no sign bit. That is, the LUT 1128 stores the operation result D1129 ($\phi^{-1}(\Sigma\phi(|v_i|))$) of the inverse function $\phi^{-1}(\Sigma\phi(|v_i|))$, of 5 bits expressed by the ordinary quantized value, in association with the difference value D1128 ($\Sigma\phi(|v_i|)$ from i=1 to i=$d_c$−1) of 9 bits expressed by the high-accuracy quantized value.

In step S5, the LUT 1128 receives as an input the difference value D1128 ($\Sigma\phi(|v_i|)$ from i=1 to i=$d_c$−1) of 9 bits expressed by the high-accuracy quantized value, and reads and outputs the operation result D1129 ($\phi^{-1}(\Sigma\phi(|v_i|))$) of the inverse function $\phi^{-1}(\Sigma\phi(|v_i|))$, of 5 bits expressed by the ordinary quantized value, in association with the difference value D1128.

Accordingly, in the step S5, the LUT 1128 equivalently performs a process of performing the operation of the inverse function $\phi^{-1}(\Sigma\phi(|v_i|))$ in the expression (7) and a process of converting a high-accuracy quantized value into an ordinary quantized value. After that, processing is performed by using the ordinary quantized value until a process of converting an ordinary quantized value into a high-accuracy quantized value is performed in the aforementioned LUT 1121.

In parallel with the above processing, the same processing as that in the check node calculator 101 of FIG. 11 is performed in an EXOR circuit 129, a register 130, a selector 131, a register 132, an FIFO memory 133 and an EXOR circuit 134. Thus, the EXOR circuit 134 divides a value obtained by multiplication of sign bits D121 (sign|$v_i$|) of messages D101 (variable node message $V_i$) given from all branches corresponding to one row in the parity check matrix H, by a sign bit D121 (sign|$v_i$|) of a message D101 from a branch intended to calculate a check note message $u_j$, and outputs the quotient value ($\Pi$sign(|$v_i$|) from i=I to i=$d_c$−1) as a quotient value D135.

The check node calculator 171 outputs a message D102 (check node message $u_j$) expressed by an ordinary quantized value of a total of 6 bits which includes the 5-bit operation result D1129 of the ordinary quantized value outputted from the LUT 1128 as the lower 5 bits, and the 1-bit quotient value D135 outputted from the EXOR circuit 134 as the most significant bit (sign bit).

Accordingly, in the check node calculator 171, the LUT 1121 converts the ordinary quantized value into a high-accuracy quantized value and the LUT 1128 converts the high-accuracy quantized value into an ordinary quantized value, so that the high-accuracy quantized value is used in a process part of from the operation of the nonlinear function $\phi(x)$ to the operation of the inverse function $\phi^{-1}(x)$ thereof among a process of performing the check node operation and the variable node operation whereas the ordinary quantized value is used in the other process part. Accordingly, it is possible to perform decoding of an LDPC code with high accuracy while suppressing an increase of the scale of the decoding device.

Figure 16:
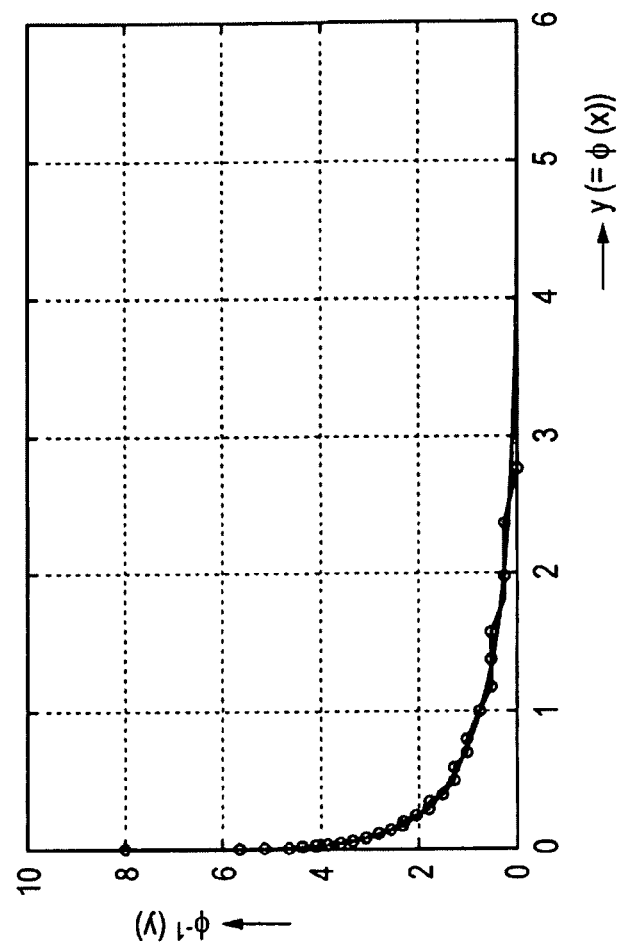
FIG. 16 A view showing a linear function $\phi(x)$ and an inverse function $\phi^{-1}(y)$ thereof.
Figure 16:
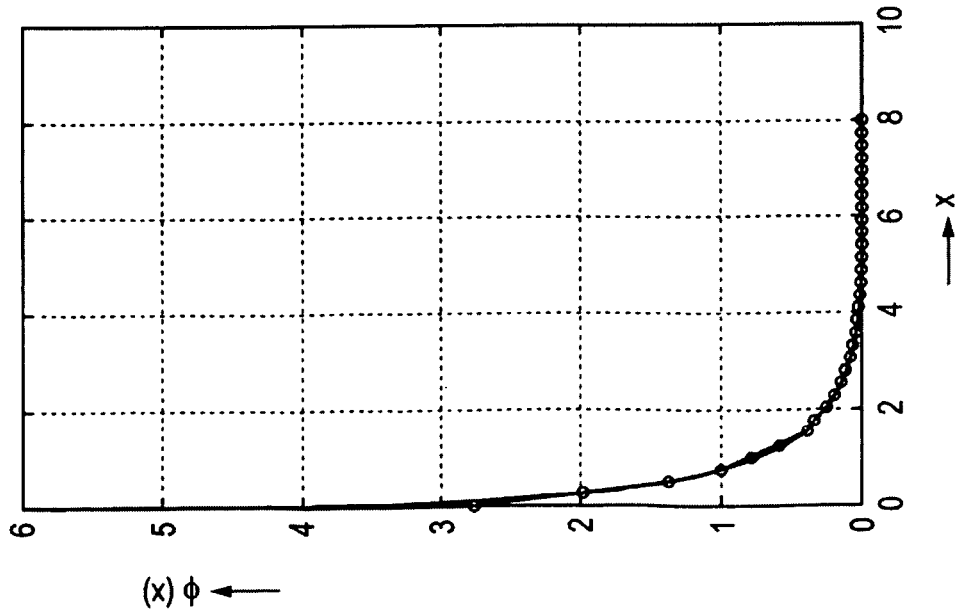

That is, FIG. 16 shows a nonlinear function $\phi(x)$ and an inverse function $\phi^{-1}(y)$ thereof. Incidentally, in FIG. 16, the symbol ○ indicates a numerical value which can be taken by a result of the operation of the nonlinear function $\phi(x)$ and an argument x thereof and a numerical value which can be taken by the inverse function $\phi^{-1}(y)$ and an argument y thereof when the ordinary quantized value is used.

The left side of FIG. 16 shows the nonlinear function $\phi(x)$. The right side of FIG. 16 shows the inverse function $\phi^{-1}(y)$ thereof.

The nonlinear function $\phi(x)$ shown on the left side of FIG. 16 becomes substantially 0 when its argument x is not smaller than a certain large numerical value.

On the other hand, the inverse function $\phi^{-1}(y)$ shown on the right side of FIG. 16 changes suddenly when its argument y is near the numerical value 0.

Accordingly, when the process part of from the operation of the nonlinear function $\phi(|v_i|)$ to the operation of the inverse function $\phi^{-1}(x)$ thereof in the operation of the expression (7) which is the check node operation is performed using the ordinary quantized value, accuracy in the operation deteriorates.

That is, if results of the operation of the nonlinear function $\phi(x)$ are expressed by ordinary quantized values, ordinary quantized values expressing the same numerical value 0 are obtained as all results of the operation of the nonlinear function $\phi(x)$ when the argument x is not smaller than a certain large value. That is, it is difficult to express a result of the operation of the nonlinear function $\phi(x)$ with high accuracy by an ordinary quantized value, because the result of the operation of the nonlinear function $\phi(x)$ becomes substantially zero when the argument x is not smaller than a certain large value.

Although the argument y of the inverse function $\phi^{-1}(y)$ in the check node operation represented by the expression (7) is an integrated value ($\Sigma\phi(|v_i|)$ from i=1 to i=$d_c$−1) of the nonlinear function $\phi(|v_i|)$, all ordinary quantized values expressing results of the operation of the nonlinear function $\phi(|v_i|)$ become ordinary quantized values expressing the numeral value 0 when the argument |$v_i$| is not smaller than a certain large numerical value, as described above.

Accordingly, if all ordinary quantized values expressing the numerical value 0 are obtained as results of the operation of the nonlinear function $\phi(|v_i|)$ to be integrated in the expression (7), the integrated value ($\Sigma\phi(|v_i|)$ from i=1 to i=$d_c$−1) becomes an ordinary quantized value expressing the numerical value 0, so that the ordinary quantized value expressing the numerical value 0 is given as the argument y of the inverse function $\phi^{-1}(y)$.

On the other hand, since the inverse function $\phi^{-1}(y)$ changes suddenly when the argument y is near the numerical value 0, it is particularly preferable that the argument y is expressed by a quantized value expressing a numerical value near the numerical value 0 with high accuracy in order to obtain a high-accuracy operation result as a result of the operation of the inverse function $\phi^{-1}(y)$.

If the ordinary quantized value is used, all ordinary quantized values expressing the numerical value 0 are however obtained as results of the operation of the nonlinear function $\phi(|v_i|)$ when the argument |$v_i$| is not smaller than a certain large numerical value, as described above. As a result, the ordinary quantized value expressing the integrated value $\Sigma\phi(|v_i|)$ serving as the argument of the inverse function $\phi^{-1}$ ($\Sigma\phi(|v_i|)$) also becomes an ordinary quantized value expressing the numerical value 0.

For this reason, in the case where integrated values $\Sigma\phi(|v_i|)$ are values near the numerical value 0, all the integrated values $\Sigma\phi(|v_i|)$ near the numerical value 0 are expressed by an ordinary quantized value expressing the numerical value 0, although the result of the operation of the inverse function $\phi^{-1}(\Sigma\phi(|v_i|))$ ought to vary greatly originally when the integrated value $\Sigma\phi(|v_i|)$ varies slightly. Therefore, the same operation results, that is, operation results with large errors are obtained as results of the operation of the inverse function $\phi^{-1}(\Sigma\phi(|v_i|))$ when the integrated value $\Sigma\phi(|v_i|)$ varies slightly.

On the contrary, in the case where the process part of from the operation of the nonlinear function $\phi(|v_i|)$ to the operation of the inverse function $\phi^{-1}(x)$ thereof is performed using a high-accuracy quantized value, a high-accuracy quantized value expressing a numerical value near the numerical value 0 with high accuracy can be obtained as a result of the operation of the nonlinear function $\phi(x)$ even when the argument x is not smaller than a certain large numerical value. As a result, even when the integrated value $\Sigma\phi(|v_i|)$ serving as the argument of the inverse function $\phi^{-1}(\Sigma\phi(|v_i|))$ is a numerical value near 0, a high-accuracy quantized value expressing the numerical value with high accuracy can be obtained.

Accordingly, even when the integrated value $\Sigma\phi(|v_i|)$ is a value near the numerical value 0, (a high-accuracy quantized value for expressing) a result of the operation of the inverse function $\phi^{-1}(\Sigma\phi(|v_i|))$ can be obtained with high accuracy so that the result of the operation varies greatly as the integrated value $\Sigma\phi(|v_i|)$ varies slightly. As a result, decoding of an LDPC code can be performed with high accuracy.

Further, since only the process part of from the operation of the nonlinear function $\phi(|v_i|)$ to the operation of the inverse function $\phi^{-1}(x)$ thereof is performed using a high-accuracy quantized value but the other process part is performed using an ordinary quantized value, the scale of portions using the high-accuracy quantized value in the check node calculator 171 (FIG. 14), that is, the scale of the LUTs 1121 and 1128 slightly increases by a difference in bit number between the high-accuracy quantized value and the ordinary quantized value. As described above, necessary storage capacities for the branch memories 100 and 102 and the receiving memory 104 in the decoding device of FIG. 13 are unchanged compared with those in the decoding device of FIG. 10 using the ordinary quantized value.

Accordingly, it is possible to perform decoding of an LDPC code with high accuracy while suppressing an increase of the scale of the decoding device.

Incidentally, since the maximum weight of one row in the parity check matrix H in FIG. 9 is 9, that is, since the maximum number of messages supplied to a check node is 9, the check node calculator 171 (FIG. 14) has the FIFO memory 1127 and the FIFO memory 133 for delaying nine messages ($\phi(|v_i|)$). To calculate messages corresponding to a row whose row weight is smaller than 9, the delay amount in the FIFO memory 1127 and the FIFO memory 133 is reduced to a value equal to the row weight.

In the check node calculator 171 in FIG. 14, the operation of the nonlinear function $\phi(|v_i|)$ and the operation of the inverse function $\phi^{-1}(x)$ in the check node operation are performed by the LUTs 1121 and 1128, respectively.

That is, the operation of the nonlinear function $\phi(|v_i|)$ is performed by the LUT 1121 receiving a 5-bit ordinary quantized value as an input and outputting a result of the operation of the nonlinear function $\phi(|v_i|)$ as a 9-bit high-accuracy quantized value whereas the operation of the inverse function $\phi^{-1}(x)$ is performed by the LUT 1128 receiving the 9-bit high-accuracy quantized value as an input and outputting a result of the operation of the inverse function $\phi^{-1}(x)$ as a 5-bit ordinary quantized value.

Assuming that the bit number of the quantized value as an input is a bits and the bit number of the quantized value as an output is b bits, then a capacity of $2^a \times b$ bits is required as the capacity of the LUT such as the LUT 1121 or the LUT 1128.

Accordingly, each of the LUTs 121 and 128 in FIG. 11 needs a capacity of $2^5 \times 5$ bits because each of the LUTs 121 and 128 receives a 5-bit ordinary quantized value as an input quantized value and sends a 5-bit ordinary quantized value as an output quantized value.

On the other hand, the LUT 1121 receiving a 5-bit ordinary quantized value as an input quantized value and sending a 9-bit high-accuracy quantized value as an output quantized value needs a capacity of $2^5 \times 9$ bits whereas the LUT 1128 receiving a 9-bit high-accuracy quantized value as an input quantized value and sending a 5-bit ordinary quantized value as an output quantized value needs a capacity of $2^9 \times 5$ bits.

Accordingly, the necessary capacity of the LUT 1121 or the LUT 1128 in the check node calculator 171 in FIG. 14 is larger than that of the LUT 121 or the LUT 128 in the check node calculator 101 in FIG. 11, so that the size of the check node calculator 171 in FIG. 14 becomes correspondingly larger than that of the check node calculator 101 in FIG. 11. Further consequently, the scale of the decoding device in FIG. 13 becomes larger than that of the decoding device in FIG. 10.

Figure 17:
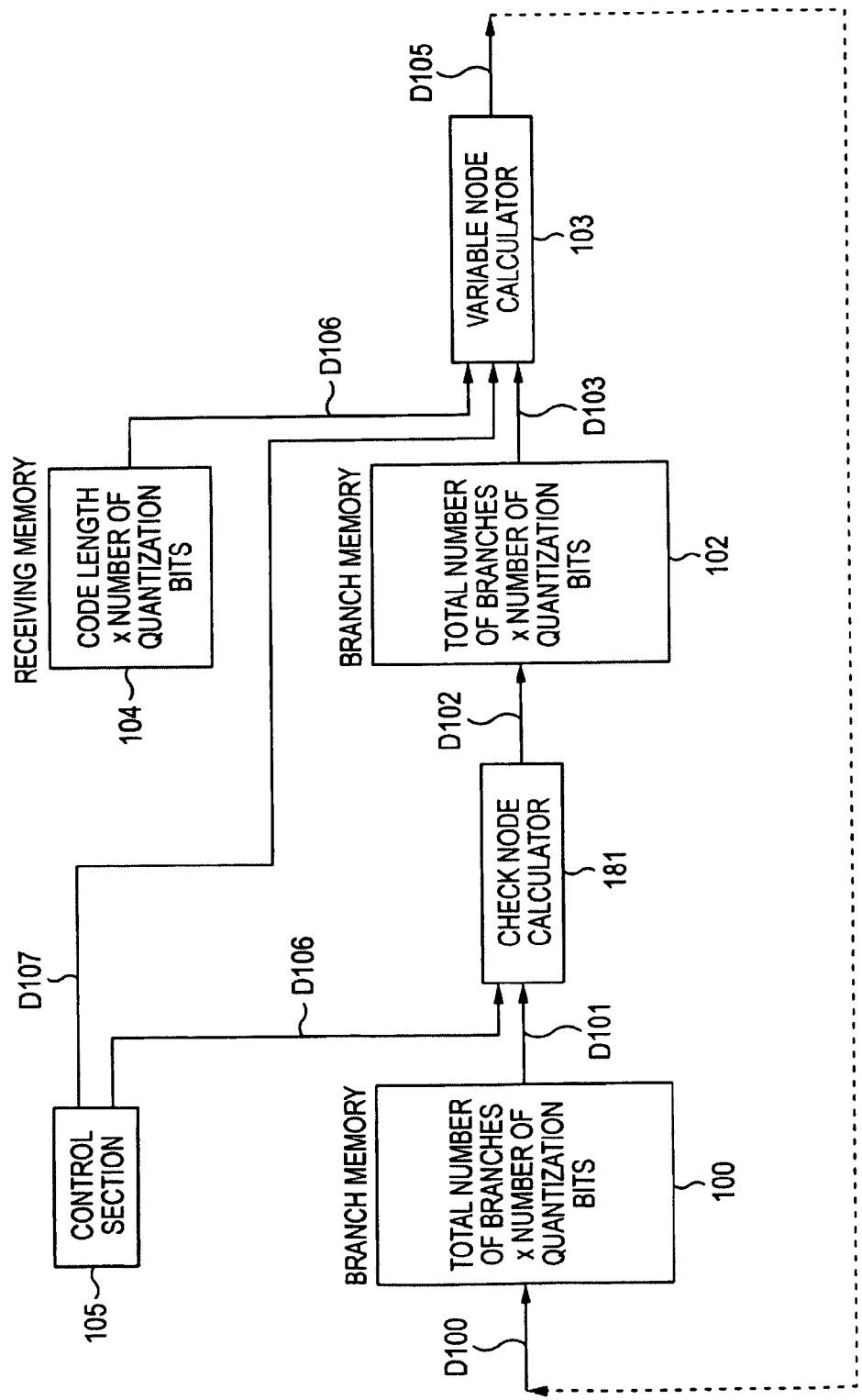
FIG. 17 A block diagram showing an example of configuration of a first embodiment of the decoding device to which the invention is applied.

Therefore, FIG. 17 shows an example of configuration of a first embodiment of the decoding device to which the invention is applied. In FIG. 17, like numbers refer to like portions corresponding to the decoding device of FIG. 13. The description about these portions will be hereinafter omitted appropriately.

The decoding device in FIG. 17 is common to the decoding device in FIG. 13 in that branch memories 100 and 102, a variable node calculator 103, a receiving memory 104 and a control section 105 are provided. The decoding device in FIG. 17 is different from the decoding device in FIG. 13 in that a check node calculator 181 is provided in place of the check node calculator 171.

Here, in the decoding device in FIG. 17, an LDPC code (of coding rate 2/3 and code length 108), for example, expressed by the aforementioned parity check matrix H shown in FIG. 9 is decoded as described above with reference to FIG. 13.

In the decoding device of FIG. 17, in the same manner as the decoding device of FIG. 13, the check node calculator 181 corresponding to the check node calculator 171 of FIG. 13 performs a check node operation while the variable node calculator 103 performs a variable node operation, so that an LDPC code is decoded in such a manner that the check node operation and the variable node operation are performed alternately.

Accordingly, a check node operation which is an operation of a check node for decoding an LDPC code and which includes an operation of a nonlinear function and an operation of an inverse function of the nonlinear function is performed in the check node calculator 181 in the same manner as the check node calculator 171 of FIG. 13. That is, a check node operation is performed in accordance with the expression (7) including an operation of a nonlinear function $\phi(x)$ and an operation of an inverse function $\phi^{-1}(x)$ of the nonlinear function $\phi(x)$ by the check node calculator 181 using messages D101 (variable node messages $v_i$) supplied from the branch memory 100 on the basis of a control signal D106 supplied from the control section 105, so that the messages D102 (check node messages $u_j$) obtained by the check node operation are supplied to the post-stage branch memory 102.

The check node calculator 181 is however different form the check node calculator 171 of FIG. 13 in that a first quantized value which is a bit string expressing a numerical value with a fixed quantization width is received as an input and a result of the operation of the nonlinear function $\phi(x)$ is outputted as a second quantized value which is a bit string expressing a numerical value with a quantization width determined in accordance with a part of the bit string, and in that the second quantized value is received as an input and a result of the operation of the inverse function $\phi^{-1}(x)$ is outputted as a first quantized value.

Here, with respect to the first quantized value which is a bit string expressing a numerical value with a fixed quantization width, a numerical value expressed by a first quantized value (bit string) $Q_1+1$ is always a numerical value larger by S than a numerical value expressed by a first quantized value $Q_1$ when S represents the fixed quantized width and $Q_1$ represents the first quantized value. Accordingly, the first quantized value is equivalent to a bit string expressing a numerical value in a so-called fixed point representation format. The first quantized value is hereinafter referred to as a fixed point quantized value or a fixed point format quantized value appropriately.

With respect to the second quantized value which is a bit string expressing a numerical value with a quantization width determined by a part of the bit string, the difference by which a numerical value expressed by a second quantized value $Q_2+1$ is larger than a numerical value expressed by a second quantized value $Q_2$ varies in accordance with part of the bit strings of the second quantized values $Q_2$ and $Q_2+1$ in which $Q_2$ represents a second quantized value, because the quantization width changes in accordance with a part of the bit string of the second quantized value.

That is, in accordance with part of the bit strings of the second quantized values $Q_2$ and $Q_2+1$, the numerical value expressed by a second quantized value $Q_2+1$ may be a numerical value larger by a number S or larger by a number S' different from S than the numerical value expressed by a second quantized value $Q_2$. That is, as the second quantized value increases by one, the numerical value expressed by the second quantized value may increase, for example, by S or by S' different from S.

On the other hand, the bit string expressing a numerical value in a so-called floating point representation format generally expresses a numerical value represented by $f \times 2^e$ in such a manner that an exponent e is assigned to a part of the bit string and a mantissa f is assigned to the other part of the bit string, unless a sign bit (bit discriminating between plus and minus) is taken into consideration.

As for the bit string expressing a numerical value $f \times 2^e$ in floating point representation, when, for example, the bit string of the exponent e is 0, the numerical value $f \times 2^e$ expressed by the bit string which consists of the exponent e and the mantissa f and which is expressed in floating point representation increases by 1 as the bit string of the mantissa f increases by 1. When, for example, the bit string of the exponent e is 1, the numerical value $f \times 2^e$ expressed by the bit string which consists of the exponent e and the mantissa f and which is expressed in floating point representation increases by 2 as the bit string of the mantissa f increases by 1.

Accordingly, as for the bit string expressing a numerical value in floating point representation, the numerical value expressed by the bit string which consists of the exponent e and the mantissa f and which expresses a numerical value in floating point representation may increase, for example, by or by 2 in accordance with the exponent e assigned to a part of the bit string as the mantissa f assigned to the other part of the bit string increases by 1.

The second quantized value which is a bit string expressing a numerical value with a quantization width determined in accordance with a part of the bit string is common to a bit string which expresses a numerical value in floating point representation and in which the way of increasing the numerical value varies in accordance with the exponent e, with respect to the viewpoint that the way of increasing the numerical value expressed by the second quantized value varies in accordance with a part of the bit string.

As described above, since the second quantized value is a kind of bit string expressing a numerical value in floating point representation, the second quantized value is hereinafter referred to as a semi-floating point quantized value or a semi-floating point format quantized value appropriately.

Incidentally, both the ordinary quantization value and the high-accuracy quantization value as described above are fixed point quantized values.

Figure 18:
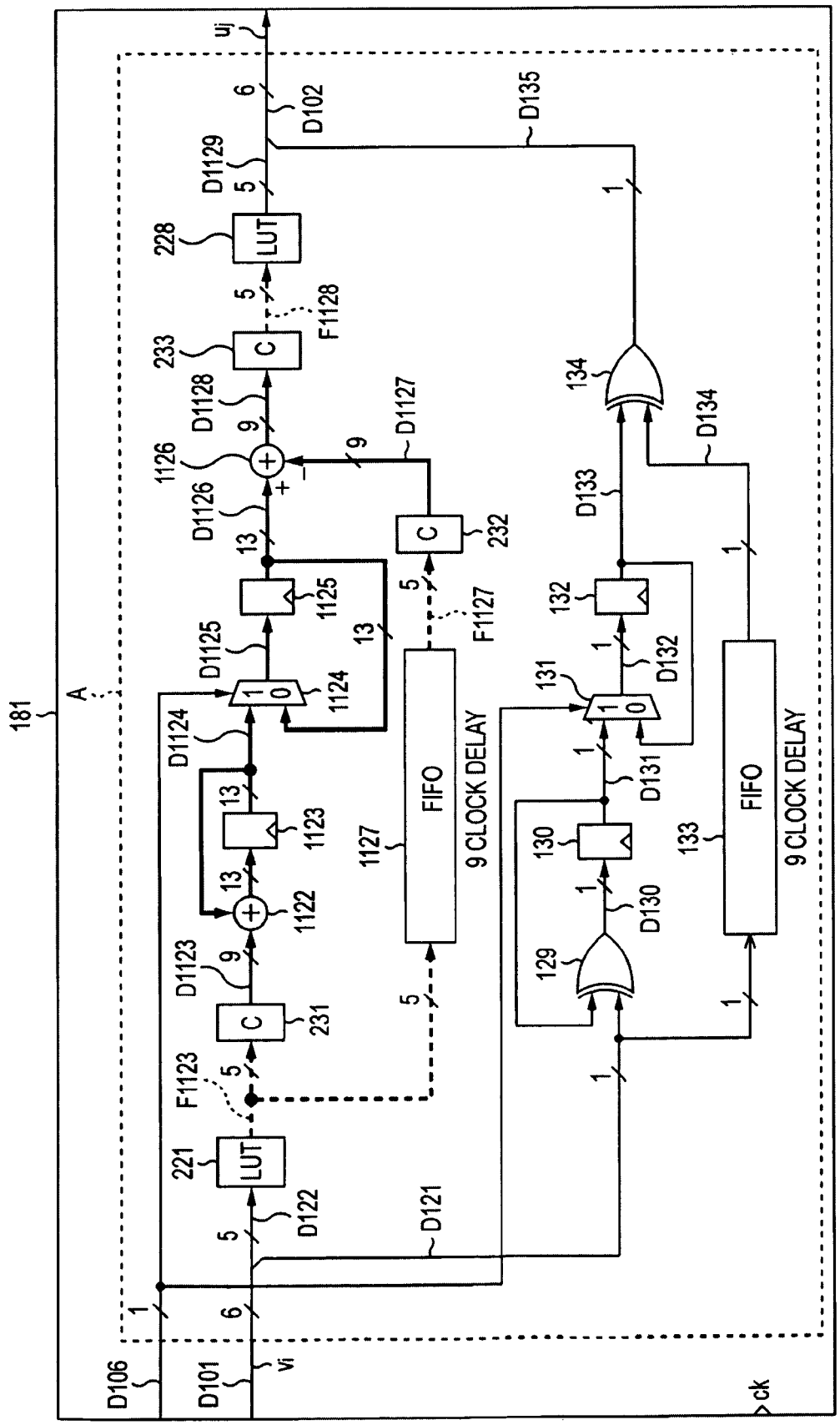
FIG. 18 A block diagram showing an example of configuration of a check node calculator 181.

Next, FIG. 18 shows an example of configuration of the check node calculator 181 in FIG. 17.

Incidentally, in FIG. 18, like numerals refer to like portions common to those of the check node calculator 171 in FIG. 14. Description about these portions will be hereinafter omitted appropriately.

That is, the check node calculator 181 of FIG. 18 is configured in the same manner as the check node calculator 171 of FIG. 14, except that an LUT 221 and an LUT 228 are provided in place of the LUT 1121 and the LUT 1128 and converting circuits 231, 232 and 233 are provided newly.

The check node calculator 181 performs a check node operation represented by the expression (7). On this occasion, as described above, the check node calculator 181 receives a fixed point quantized value as an input and outputs a result of the operation of a nonlinear function $\phi(x)$ as a semi-floating point quantized value while receiving the semi-floating point quantized value as an input and outputting a result of the operation of an inverse function $\phi^{-1}(x)$ as a fixed point quantized value.

That is, the LUT 221 stores a result of the operation of a nonlinear function $\phi(|v_i|)$ in the expression (7) in association with a 5-bit absolute value D122 ($|v_i|$) of an ordinary quantized value which is also a fixed point quantized value, in the same manner as the LUT 1121 of FIG. 14. Incidentally, the result of the operation of the nonlinear function $\phi(|v_i|)$ in the LUT 1121 is expressed by a high-accuracy quantized value of 9 bits whereas the result of the operation of the nonlinear function $\phi(|v_i|)$ in the LUT 221 is expressed by a semi-floating point quantized value of 5 bits.

Accordingly, the LUT 221 receives as an input a numerical value $|v_i|$ expressed by a 5-bit fixed point quantized value and stores a 5-bit semi-floating point quantized value expressing a numerical value obtained as a result of the operation of the nonlinear function $\phi(|v_i|)$ on the 5-bit fixed point quantized value in association with the 5-bit fixed point quantized value.

The LUT 221 supplies the 5-bit semi-floating point quantized value expressing a result of the operation of the nonlinear function $\phi(|v_i|)$ in association with the absolute value D122 ($|v_i|$) which is a 5-bit fixed point quantized value supplied to the LUT 221, to the converting circuit 231 and an FIFO 1127.

The LUT 228 stores a 5-bit ordinary quantized value expressing a result of the operation of the inverse function $\phi^{-1}(y)$ ($=\phi^{-1}(\Sigma\phi(|v_i|))$) in the expression (7) in association with a 5-bit quantized value y ($=\Sigma\phi(|v_i|)$) in the same manner as the LUT 1128 of FIG. 14. Incidentally, the argument y of the inverse function $\phi^{-1}(y)$ is given as a high-accuracy quantized value which is also a 9-bit fixed point quantized value, to the LUT 1128, whereas the argument y of the inverse function $\phi^{-1}(y)$ is given as a 5-bit floating point quantized value to the LUT 228 from the converting circuit 233 which will be described later.

Accordingly, the LUT 228 receives as an input a numerical value $\Sigma\phi(|v_i|)$ expressed by a 5-bit semi-floating point quantized value (semi-floating point quantized value with no sign bit) and stores a 5-bit fixed point quantized value (fixed point quantized value with no sign bit) expressing a numerical value obtained as a result of the operation of the inverse function $\phi^{-1}(\Sigma\phi(|v_i|))$ on the 5-bit semi-floating point quantized value, in association with the 5-bit semi-floating point quantized value.

The LUT 228 outputs the 5-bit fixed point quantized value which expresses a result of the operation of the inverse function $\phi^{-1}(\Sigma\phi(|v_i|))$ and which is also an ordinary quantized value, as an operation result D1129 of the inverse function $\phi^{-1}(\Sigma\phi(|v_i|))$ associated with the 5-bit semi-floating point quantized value F1128 ($\Sigma\phi(|v_i|)$) supplied to the LUT 228.

The converting circuit 231 performs conversion of the representation format of the numerical value in such a manner that a 5-bit semi-floating point quantized value which expresses a result of the operation of the nonlinear function $\phi(|v_i|)$ and which is supplied from the LUT 221, is converted into a 9-bit fixed point quantized value (fixed point quantized value with no sign bit) which expresses a result of the operation of the nonlinear function $\phi(|v_i|)$ and which is also a high-accuracy quantized value. The converting circuit 231 supplies a 9-bit fixed point quantized value D1123 obtained as a result of the conversion, to an operation unit 1122.

Here, as described above, since the 5-bit semi-floating point quantized value expressing a result of the operation of the nonlinear function $\phi(|v_i|)$ outputted from the LUT 221 is a bit string expressing a numerical value with a quantization width determined in accordance with a part of the bit string, it is difficult to perform integration in a post-stage operation unit 1122 directly. For this reason, the converting circuit 231 converts the 5-bit semi-floating point quantized value outputted from the LUT 221 into a fixed point quantized value which is also a 9-bit high-accuracy quantized value.

The converting circuit 232 performs conversion of the representation format of the numerical value in the same manner as the converting circuit 231. That is, a 5-bit floating point quantized value expressing a result of the operation of the nonlinear function $\phi(|v_i|)$ outputted from the LUT 221 is supplied to the converting circuit 232 after delayed in the FIFO 1127. The converting circuit 232 converts the (delayed) 5-bit floating point quantized value supplied from the FIFO 1127 into a 9-bit fixed point quantized value which is also a high-accuracy quantized value, and supplies the fixed point quantized value to the operation unit 1126.

That is, for the same reason that a semi-floating point quantized value is converted into a fixed point quantized value by the converting circuit 231, the converting circuit 232 converts a 5-bit semi-floating point quantized value to be integrated by the post-stage operation unit 1126, into a 9-bit fixed pointed quantized value which is also a high-accuracy quantized value.

The converting circuit 233 performs conversion of the representation format inverse to conversion in the converting circuit 231 or 232. That is, the 9-bit fixed point quantized value which is also a high-accuracy quantized value is supplied to the converting circuit 233 from the operation unit 1126. The converting circuit 233 converts the 9-bit fixed point quantized value supplied from the operation unit 1126 into a 5-bit semi-floating point quantized value and supplies the 5-bit semi-floating point quantized value as an input to the LUT 228.

Incidentally, in FIG. 18, a connection line in which a 9-bit fixed point quantized value (and a result of an operation performed by using the 9-bit fixed point quantized value) is exchanged is represented by a solid thick line, whereas a connection line in which a 5-bit semi-floating point quantized value is exchanged is represented by a dotted thick line. The same rule also applies to FIG. 28 which will be described later.

Next, the LUT 221 of FIG. 18 will be further described with reference to FIG. 19.

A fixed point quantized value which is also a 5-bit ordinary quantized value shown on a left table of FIG. 19 is supplied to the LUT 221. Incidentally, a bit string as a 5-bit fixed point quantized value and a decimal numerical value expressed by the bit string are shown together on the left table of FIG. 19.

The LUT 221 receives as an input a numerical number x expressed by a 5-bit fixed point quantized value and outputs a 5-bit semi-floating point quantized value expressing a numerical value $\phi(x)$ obtained as a result of the operation of the nonlinear function $\phi(|v_i|)$ in the expression (7) on the 5-bit fixed point quantized value.

A right table of FIG. 19 shows the 5-bit semi-floating point quantized value outputted from the LUT 221. Here, a bit string as the 5-bit semi-floating point quantized value, 9 bits as a fixed point quantized value corresponding to the semi-floating quantized value (i.e. as a fixed point quantized value expressing a numerical value expressed by the semi-floating point quantized value) and a decimal numerical value expressed by the 9 bits are shown together on the right table of FIG. 19.

A decimal numerical value range expressed by the 5-bit fixed point quantized value on the left table of FIG. 19 is from 0 to 31 whereas a decimal numerical value range expressed by (the 9-bit fixed point quantized value corresponding to) the 5-bit semi-floating point quantized value on the right table of FIG. 10 is from 0 to 448. Accordingly, even with the same 5 bits, the semi-floating point quantized value can express a numerical value with a wider dynamic range than the fixed point quantized value. Incidentally, for example, since the decimal numerical value range expressed by the 9-bit fixed point quantized value is from 0 to 511, the 5-bit semi-floating point quantized value can express a numerical value with a dynamic range as wide as the 9-bit fixed point quantized value.

The quantization width of each semi-floating point quantized value of 5 bits on the right table of FIG. 19 varies in accordance with upper 3 bits which are part of the 5 bits.

That is, in terms of decimal numerical values, when the upper 3 bits of the 5-bit semi-floating point quantized value are either 000 or 001, the decimal numerical value expressed by the 5-bit semi-floating point quantized value increases by 1 as the remaining lower 2 bits increase by 1. Accordingly, the quantization width becomes 1.

When the upper 3 bits of the 5-bit semi-floating point quantized value are 010, the decimal numerical value expressed by the 5-bit semi-floating point quantized value increases by 2 as the remaining lower 2 bits increase by 1. Accordingly, the quantization width becomes 2.

When the upper 3 bits of the 5-bit semi-floating point quantized value are 011, the decimal numerical value expressed by the 5-bit semi-floating point quantized value increases by 4 as the remaining 2 bits increase by 1. Accordingly, the quantization width becomes 4.

Hereinafter similarly, when the upper 3 bits of the 5-bit semi-floating point quantized value are 100, 101, 110 or 111, the quantization width becomes 8, 16, 32 or 64, respectively.

Assuming now that the upper 3 bits of the 5-bit semi-floating point quantized value on the right table of FIG. 19 are referred to as quasi-exponent e and the remaining lower 2 bits thereof are referred to as quasi-mantissa f, the decimal numerical value expressed by the 5-bit semi-floating point quantized value becomes $(1+f/2^2) \times 2^{e+1}$ except the case where the quasi-exponent e is 000. Accordingly, it can be said that the semi-floating point quantized value is a floating point (number) having a mantissa of $(1+f/2^2)$, an exponent of e+1 and a radix of 2. For example, a 5-bit semi-floating point quantized value 10001 is $(1+1/2^2) \times 2^{4+1} = 40$ in decimal numerical value representation because the upper 3 bits of the 5-bit semi-floating point quantized value 10001 serving as a quasi-exponent e are 100 (4 in decimal representation) and the lower 2 bits thereof serving as a quasi-mantissa f are 01 (1 in decimal representation).

Incidentally, when the quasi-exponent e is 000, the decimal numerical value expressed by the 5-bit semi-floating point quantized value becomes $f/2 \times 2^{e+1}$. In this case, it can be said that the semi-floating point quantized value is a floating point (number) having a mantissa of f/2, an exponent of e+1 and a radix of 2.

As described above, the quantization width of a semi-floating point quantized value increases (decreases) as a numerical value expressed by the semi-floating point quantized value increases (decreases). In this embodiment, for example, the minimum quantization width of a 5-bit semi-floating point quantized value is not larger than the quantization width of a high-accuracy quantized value which is also a 9-bit fixed point quantized value (i.e. equal to or smaller than the quantization width of the high-accuracy quantized value). Accordingly, when such a 5-bit semi-floating point quantized value is used, a numerical value near 0 can be expressed as a result of the operation of the nonlinear function φ(x) (on the left side of FIG. 16) with high accuracy in the same manner as in the case where the 9-bit fixed point quantized value is used.

That is, according to such a 5-bit semi-floating point quantized value, it is possible to express a numerical value with a dynamic range wider than the 5-bit fixed point quantized value (ordinary quantized value) and as wide as the 9-bit fixed point quantized value (high-accuracy quantized value) and it is possible to express a numerical value near 0 with accuracy equal to or higher than the 9-bit fixed point quantized value (high-accuracy quantized value).

Next, the converting circuit 231 of FIG. 18 will be further described with reference to FIG. 20.

FIG. 20 shows the relation between a 5-bit semi-floating point quantized value inputted (given) to the converting circuit 231 and a 9-bit fixed point quantized value outputted from the converting circuit 231.

As described above, the converting circuit 231 performs conversion of the numerical value representation format for converting a 5-bit semi-floating point quantized value supplied from the LUT 221 into a 9-bit fixed point quantized value which is also a high-accuracy quantized value.

That is, the converting circuit 231 converts a 5-bit semi-floating point quantized value shown in the first column from the left of FIG. 20 into a 9-bit fixed point quantized value shown in the second column from the left of FIG. 20, and outputs the 9-bit fixed point quantized value.

Specifically, when the quasi-exponent (upper 3 bits) e of a 5-bit semi-floating point quantized value is 000, the converting circuit 231 outputs a 9-bit fixed point quantized value which has a quasi-mantissa (lower 2 bits) f equal to the lower 2 bits of the 5-bit semi-floating point quantized value, and the remaining upper 7 bits set at 0.

When the quasi-exponent e of a 5-bit semi-floating point quantized value is 001, the converting circuit 231 outputs a 9-bit fixed point quantized value in which the third lower bit (third bit from the least significant bit) is set at 1, the lower 2 bits just after the third lower bit are set as its quasi-mantissa f, and the remaining upper 6 bits are set at 0.

When the quasi-exponent e of a 5-bit semi-floating point quantized value is 010, the converting circuit 231 outputs a 9-bit fixed point quantized value in which the fourth lower bit is set at 1, the lower 2 bits just after the fourth lower bit are set as its quasi-mantissa f, and the remaining 6 bits are set at 0.

Hereinafter, in the same manner, when a 5-bit semi-floating point quantized value having a quasi-exponent represented by e and a quasi-mantissa represented by f is given, the converting circuit 231 outputs a 9-bit fixed point quantized value in which the (e+1)-th lower bit is set at 1, the lower 2 bits just after the (e+1)-th lower bit are set as its quasi-mantissa f, and the remaining 6 bits are set at 0.

Incidentally, a decimal numerical value expressed by a 9-bit fixed point quantized value as well as a 5-bit semi-floating point quantized value and the fixed point quantized value is shown in the third (rightmost) column from the left of FIG. 20.

The converting circuit 232 of FIG. 18 also performs conversion of the representation format in the same manner as the aforementioned converting circuit 231 of FIG. 18 (conversion of a semi-floating point quantized value into a fixed point quantized value).

Next, the process of conversion of the representation format performed by the converting circuit 231 of FIG. 18 will be described with reference to FIG. 21.

Upon reception of a 5-bit semi-floating point quantized value, the converting circuit 231 decides a position (bits to be replaced with a quasi-mantissa f) where the quasi-mantissa f which is the lower 2 bits of the semi-floating point quantized value is inserted into a bit string of 9 bits, on the basis of the quasi-exponent e which are the upper 3 bits of the semi-floating point quantized value. The converting circuit 231 outputs the bit string of 9 bits with the quasi-mantissa f inserted in the position, as a 9-bit fixed point quantized value.

Figure 21:
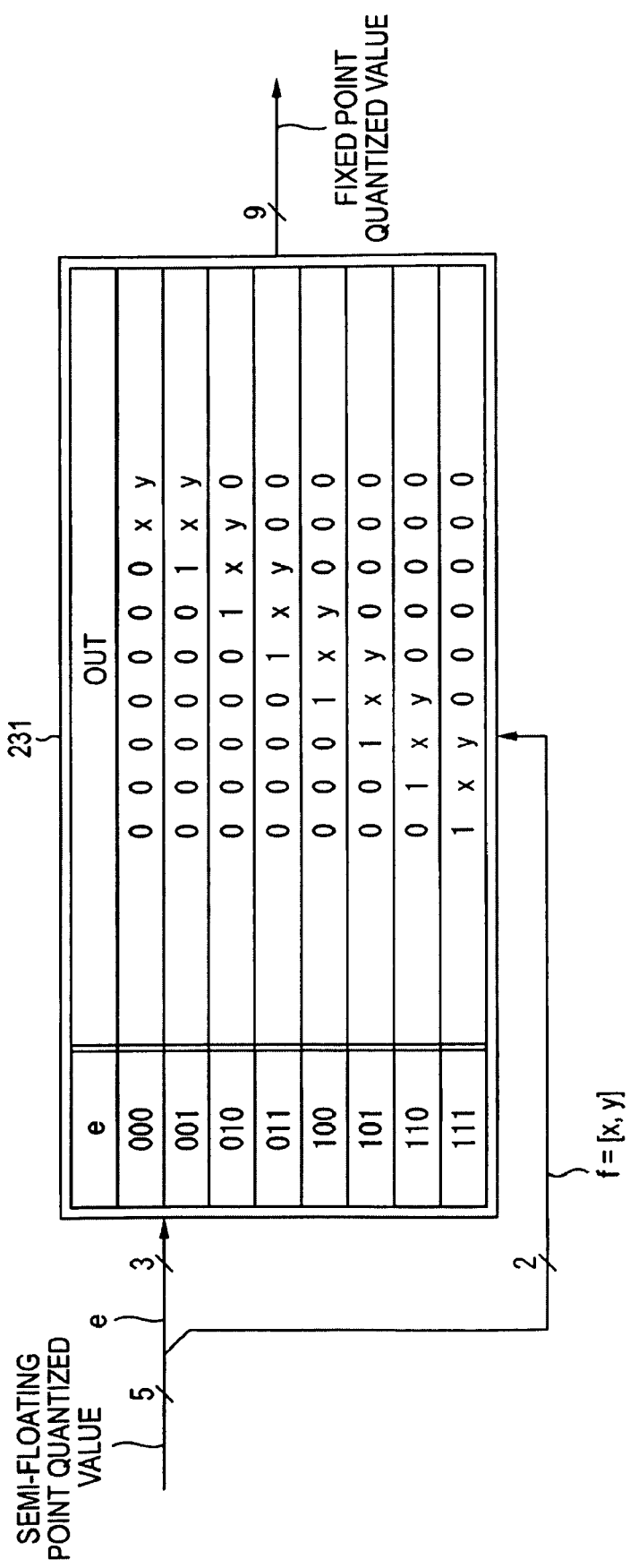
FIG. 21 A view for describing processing of the converting circuit 231.

That is, as shown in FIG. 21, the converting circuit 231 stores bit strings of 9 bits 0000000xy, 0000001xy, 000001xy0, 00001xy00, 0001xy000, 001xy0000, 01xy00000 and 1xy000000 in which the 2 bits xy are undefined, in association with values 000, 001, 010, 011, 100, 101, 110 and 111 expressed by 3 bits as a quasi-exponent e.

Assuming that the first and second bits from the left of a quasi-mantissa f which is the lower 2 bits of a semi-floating point quantized value are represented by x and y respectively, then the converting circuit 231 selects a bit string of 9 bits associated with a quasi-exponent e which is the upper 3 bits of the 5-bit semi-floating point quantized value, and sets the undefined 2 bits xy of the 9-bit bit string as the first bit x and the second bit y from the left of the quasi-mantissa f to thereby obtain the 9-bit bit string and output the 9-bit bit string as a 9-bit fixed point quantized value.

Accordingly, when, for example, a 5-bit semi-floating point quantized value 10001 is inputted to the converting circuit 231, the converting circuit 231 selects a 9-bit bit string 0001xy000 associated with 100 because the quasi-exponent e which is the upper 3 bits of the 5-bit semi-floating point quantized value is 100.

Since the quasi-mantissa f which is the lower 2 bits of the 5-bit semi-floating point quantized value 10001 is 01, the converting circuit 231 sets the undefined 2 bits xy of the selected 9-bit bit string 0001xy000 as the first bit 0 and the second bit 1 from the left of the quasi-mantissa f of 01 to thereby obtain a 9-bit bit string 000101000 and output the 9-bit bit string as a 9-bit fixed point quantized value.

Incidentally, when the minimum quantization width of a 5-bit semi-floating point quantized value and the quantization width of a 9-bit fixed point quantized value are equal to each other, (the bit string of) the quasi-mantissa f of the floating point quantized value can be used directly in the converting circuit 231 so that the semi-floating point quantized value can be converted into the fixed point quantized value as described in FIG. 21. Accordingly, the converting circuit 231 can be configured relatively simply, so that a great increase in the scale of the circuit can be suppressed.

Next, the converting circuit 233 of FIG. 18 will be further described with reference to FIG. 22.

FIG. 22 shows the relation between a 9-bit fixed point quantized value inputted (given) to the converting circuit 233 and a 5-bit semi-floating point quantized value outputted from the converting circuit 233.

As described above, the converting circuit 233 performs conversion of the numerical value representation format for converting a 9-bit fixed point quantized value which is also a high-accuracy quantized value and which is supplied from the operation unit 1126 (in FIG. 18), into a 5-bit semi-floating point quantized value.

That is, the converting circuit 233 converts a 9-bit fixed point quantized value shown on a left table of FIG. 22 into a 5-bit semi-floating point quantized value shown on a right table of FIG. 22, and outputs the 5-bit semi-floating point quantized value.

Here, the 9-bit fixed point quantized value together with a decimal numerical value expressed by the fixed point quantized value is shown on the left table of FIG. 22.

In addition, the right table of FIG. 22 is the same as FIG. 20. Accordingly, the right table of FIG. 22 shows the correspondence between the 5-bit semi-floating point quantized value and the 9-bit fixed point quantized value.

Upon reception of a 9-bit fixed point quantized value shown on the left table of FIG. 22, the converting circuit 233 outputs a 5-bit semi-floating point quantized value corresponding to a fixed point quantized value provided on the right table of FIG. 22 for expressing a decimal number near the decimal number expressed by the fixed point quantized value, that is, for expressing the maximum decimal number not larger than the decimal number expressed by the 9-bit fixed point quantized value, for example, shown on the left table of FIG. 22.

Specifically, upon reception of a 9-bit fixed point quantized value shown on the left table of FIG. 22 when the upper 6 bits of the 9-bit fixed point quantized value are 0's, the converting circuit 233 outputs a 5-bit semi-floating point quantized value corresponding to the 9-bit fixed point quantized value on the right table of FIG. 22.

In addition, upon reception of a 9-bit fixed point quantized value shown on the left table of FIG. 22 when the upper 5 bits of the 9-bit fixed point quantized value are 0's and the upper sixth bit (the sixth bit from the most significant bit) of the 9-bit fixed point quantized value is 1, the converting circuit 233 rounds down the lower 1 bit (least significant bit) of the 9-bit fixed point quantized value to and outputs a 5-bit semi-floating point quantized value corresponding to the rounded-down fixed point quantized value on the right table of FIG. 22.

Further, upon reception of a 9-bit fixed point quantized value shown on the left table of FIG. 22 when the upper 4 bits of the 9-bit fixed point quantized value are 0's and the upper fifth bit of the 9-bit fixed point quantized value is 1, the converting circuit 233 rounds down the lower 2 bits of the 9-bit fixed point quantized value to 0's and outputs a 5-bit semi-floating point quantized value corresponding to the rounded-down fixed point quantized value on the right table of FIG. 22.

Further, upon reception of a 9-bit fixed point quantized value shown on the left table of FIG. 22 when the upper 3 bits of the 9-bit fixed point quantized value are 0's and the upper fourth bit of the 9-bit fixed point quantized value is 1, the converting circuit 233 rounds down the lower 3 bits of the 9-bit fixed point quantized value to 0's and outputs a 5-bit semi-floating point quantized value corresponding to the rounded-down fixed point quantized value on the right table of FIG. 22.

Upon reception of a fixed point quantized value when the upper 2 bits of the fixed point quantized value are 0's and the upper third bit of the fixed point quantized value is 1 or when the upper 1 bit of the fixed point quantized value is 0 and the upper second bit of the fixed point quantized value is 1, the converting circuit 233 also outputs a 5-bit semi-floating point quantized value in the same manner as in the aforementioned cases.

Upon reception of a fixed point quantized value when the lower 1 bit (most significant bit) of the fixed point quantized value is 1, the converting circuit 233 rounds down the lower bits of the 9-bit fixed point quantized value to 0's and outputs a 5-bit semi-floating point quantized value corresponding to the rounded-down fixed point quantized value on the right table of FIG. 22.

Next, the process of conversion of the representation format performed by the converting circuit 233 of FIG. 18 will be described with reference to FIG. 23.

Upon reception of a 9-bit fixed point quantized value, the converting circuit 233 detects the position of 1 located on the uppermost bit side of the 9-bit fixed point quantized value and obtains a quasi-exponent e of 3 bits and a quasi-mantissa f of 2 bits based on the position so that a 5-bit bit string in which the quasi-exponent e of 3 bits and the quasi-mantissa f of 2 bits are arranged in order from the most significant bit side is outputted as a 5-bit semi-floating point quantized value.

That is, a 9-bit fixed point quantized value is represented by IN, and the (a+1)-th bit counted from the least significant bit of the 9-bit fixed point quantized value IN is represented by IN[a] in which a=0, 1, ..., 8. Further, a bit string of from the (a+1)-th bit to the (b+1)-th bit counted from the least significant bit of the 9-bit fixed point quantized value TN is represented by IN[a:b] in which b=0, 1, ..., 8 and a>b.

Figure 23:
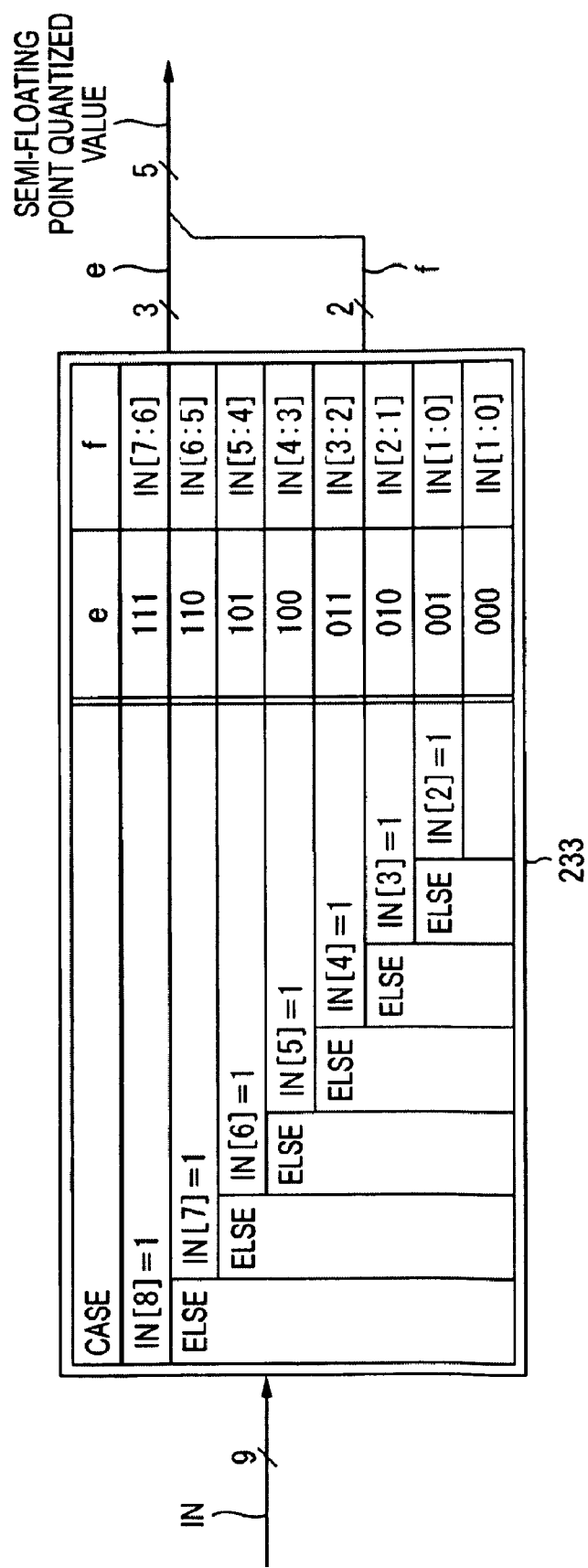
FIG. 23 A view for describing processing of the converting circuit 233.

As shown in FIG. 23, when the bit IN[8] (most significant bit) of the 9-bit fixed point quantized value IN is 1, the converting circuit 233 sets the exponent e to be equal to 111 and sets the mantissa f to be equal to the 2 bits IN[7:6] of the 9-bit fixed point quantized value IN.

When the bits IN[8] and IN[7] of the 9-bit fixed point quantized value IN are 0 and 1 respectively, the converting circuit 233 sets the exponent e to be equal to 110 and sets the mantissa f to be equal to the 2 bits IN[6:5] of the 9-bit fixed point quantized value IN.

When the 2 bits IN[8:7] of the 9-bit fixed point quantized value IN are 0's and the bit IN[6] thereof is 1, the converting circuit 233 sets the exponent e to be equal to 101 and sets the mantissa f to be equal to the 2 bits IN[5:4] of the 9-bit fixed point quantized value IN.

When the 3 bits IN[8:6] of the 9-bit fixed point quantized value IN are 0's and the bit IN [5] thereof is 1, the converting circuit 233 sets the exponent e to be equal to 100 and sets the mantissa f to be equal to the 2 bits IN[4:3] of the 9-bit fixed point quantized value IN.

When the 4 bits IN[8:5] of the 9-bit fixed point quantized value IN are 0's and the bit IN[4] thereof is 1, the converting circuit 233 sets the exponent e to be equal to 011 and sets the mantissa f to be equal to the 2 bits IN[3:2] of the 9-bit fixed point quantized value IN.

When the 5 bits IN[8:4] of the 9-bit fixed point quantized value IN are 0's and the bit IN[3] thereof is 1, the converting circuit 233 sets the exponent e to be equal to 010 and sets the mantissa f to be equal to the 2 bits IN[2:1] of the 9-bit fixed point quantized value IN.

When the 6 bits IN[8:3] of the 9-bit fixed point quantized value IN are 0's and the bit IN[2] thereof is 1, the converting circuit 233 sets the exponent e to be equal to 001 and sets the mantissa f to be equal to the 2 bits IN[1:0] of the 9-bit fixed point quantized value IN.

When the 7 bits IN[8:2] of the 9-bit fixed point quantized value IN are 0's, the converting circuit 233 sets the exponent e to be equal to 000 and sets the mantissa f to be equal to the 2 bits IN[1:0] of the 9-bit fixed point quantized value IN.

The converting circuit 233 outputs, as a 5-bit semi-floating point quantized value, a bit string of 5 bits having a quasi-exponent e as its upper 3 bits and a quasi-mantissa f as its lower 2 bits.

Accordingly, when, for example, a 9-bit fixed point quantized value 000011000 is inputted to the converting circuit 233, the converting circuit 233 sets the exponent e to be equal to 011 and sets the mantissa to be equal to the 2 bits 10 of IN[3:2] of the 9-bit fixed point quantized value IN because the 4 bits IN[8:5] of the 9-b t fixed point quantized value IN are 0's and the bit IN[4] thereof is 1. The converting circuit 233 outputs, as a 5-bit semi-floating point quantized value, a bit string of 5 bits 01110 having a quasi-exponent e of 011 as its upper 3 bits and a quasi-mantissa f of 10 as its lower 2 bits.

Incidentally, when the minimum quantization width of a 5-bit semi-floating point quantized value and the quantization width of a 9-bit fixed point quantized value are equal to each other, the converting circuit 233 can convert the fixed point quantized value into the semi-floating point quantized value by using a part of the bit string of the fixed point quantized value as a quasi-mantissa f directly as described above with reference to FIG. 23. Accordingly, the converting circuit 233 can be configured relatively simply, so that a great increase in the scale of the circuit can be suppressed.

Next, the LUT 228 of FIG. 18 will be further described with reference to FIG. 24.

Figure 24:
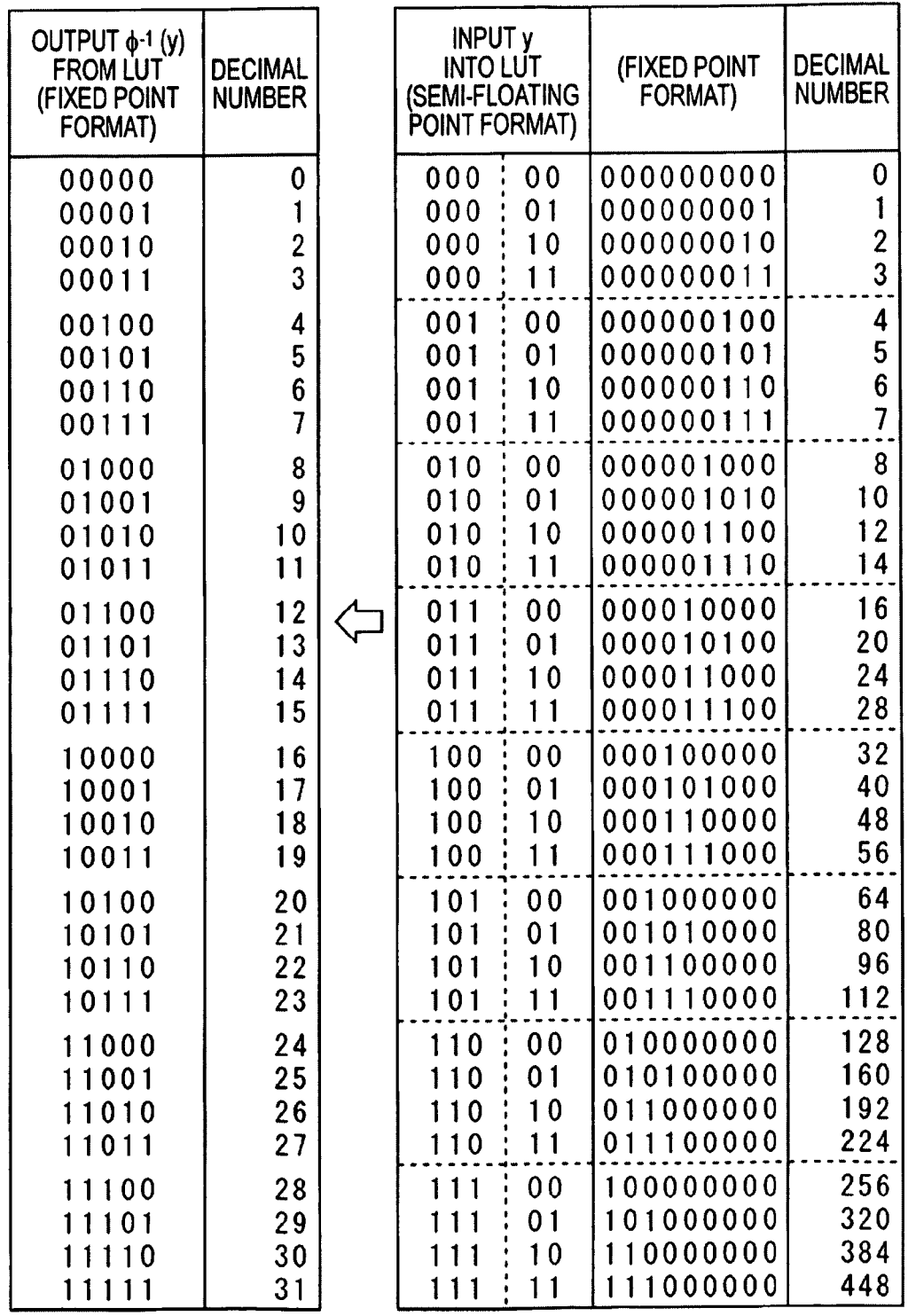
FIG. 24 A view for describing an LUT 228.

A 5-bit semi-floating point quantized value shown on a right table of FIG. 24 is supplied to the LUT 221.

Here, 9 bits as a fixed point quantized value corresponding to the 5-bit semi-floating point quantized value and a decimal numerical value expressed by the 9 bits, as well as a bit string as the semi-floating point quantized value, are shown on the right table of FIG. 24.

The LUT 221 receives a numerical value y expressed by a 5-bit semi-floating point quantized value and outputs a 5-bit fixed point quantized value expressing a numerical value $\phi^{-1}(y)$ obtained as a result of the operation of the inverse function $\phi^{-1}(\Sigma\phi(|v_i|))$ in the expression (7) on the semi-floating point quantized value.

That is, a left table of FIG. 24 shows a 5-bit fixed point quantized value outputted from the LUT 228. Incidentally, the left table of FIG. 24 shows a bit string as the 5-bit fixed point quantized value and a decimal numerical value expressed by the bit string.

As described above with reference to FIG. 19, a decimal numerical value range expressed by a 5-bit fixed point quantized value is from 0 to 31 while a decimal numerical value range expressed by (a 9-bit fixed value quantized value corresponding to) a 5-bit semi-floating point quantized value is from 0 to 448. Moreover, a decimal numerical value range expressed by a 9-bit fixed point quantized value is from 0 to 511. Accordingly, the 5-bit semi-floating point quantized value can express a numerical value with a dynamic range wider than the 5-bit fixed point quantized value and as wide as the 9-bit fixed point quantized value.

In the embodiment, as described above, for example, the minimum quantization width of a 5-bit semi-floating point quantized value is not larger than the quantization width of a high-accuracy quantized value which is also a 9-bit fixed point quantized value. Accordingly, the 5-bit semi-floating point quantized value can express a numerical value near 0, as the argument y of the inverse function $\phi^{-1}(y)$ suddenly changing when the argument y is near 0, with high accuracy in the same manner as the 9-bit fixed point quantized value.

That is, the 5-bit semi-floating point quantized value can express a numerical value with a dynamic range wider than the 5-bit fixed point quantized value (normal quantized value) and as wide as the 9-bit fixed point quantized value (high-accuracy quantized value) and can express a numerical value near 0 with accuracy as high as (or higher than) the 9-bit fixed point quantized value (high-accuracy quantized value).

As described above, the LUT 221 outputs a 5-bit semi-floating point quantized value expressing a numerical value near 0 with high accuracy, as a result of the operation of the nonlinear function $\phi(x)$ which will be a value near 0 when the argument x is not smaller than a certain large numerical value.

Further, upon a 5-bit floating point quantized value which expresses a numerical value near 0 with high accuracy and which is inputted as the integrated value $\Sigma\phi(|v_i|)$ serving as the argument of the inverse function $\phi^{-1}(\Sigma\phi(|v_i|))$, the LUT 228 outputs a result of the operation of the inverse function $\phi^{-1}(\Sigma\phi(|v_i|))$ as a fixed point quantized value which is also a 5-bit ordinary quantized value.

Therefore, according to the 5-bit semi-floating point quantized value, it is possible to highly accurately express a numerical value near 0 which is a result of the operation of the nonlinear function $\phi(x)$ for the argument x not smaller than a certain large numerical value. Moreover, even when the integrated value $\Sigma\phi(|v_i|)$ serving as the argument of the inverse function $\phi^{-1}(\Sigma\phi(|v_i|))$ is a numerical value near 0, it is possible to express the numerical value with high accuracy. Accordingly, even when the integrated value $\Sigma\phi(|v_i|)$ is a value near a numerical value 0, a high-accurate result of the operation of the inverse function $\phi^{-1}(\Sigma\phi(|v_i|))$ can be obtained in such a manner that the operation result varies as the integrated value $\Sigma\phi(|v_i|)$ varies slightly. Consequently, decoding of an LDPC code can be performed with high accuracy.

Since both input and output of the LUT 221 and the LUT 228 are of 5 bits, the necessary capacity of each of the LUTs 221 and 228 becomes $2^5 \times 5$ bits. Accordingly, the capacity required of the LUT 221 and in proportion to the scale of the circuit is only 5/9 as much as the capacity ($2^5 \times 9$ bits) of the corresponding LUT 1121 of FIG. 14. In addition, the capacity required of the LUT 228 and in proportion to the scale of the circuit is only $\frac{1}{2}^4$ as much as the capacity ($2^9 \times 5$ bits) of the corresponding LUT 1128 of FIG. 14.

Accordingly, it is possible to configure the LUTs 221 and 228 compactly. As a result, it is possible to suppress an increase in the scale of the check node calculator 181 (FIG. 18), hence, the decoding devise of FIG. 17.

Figure 25:
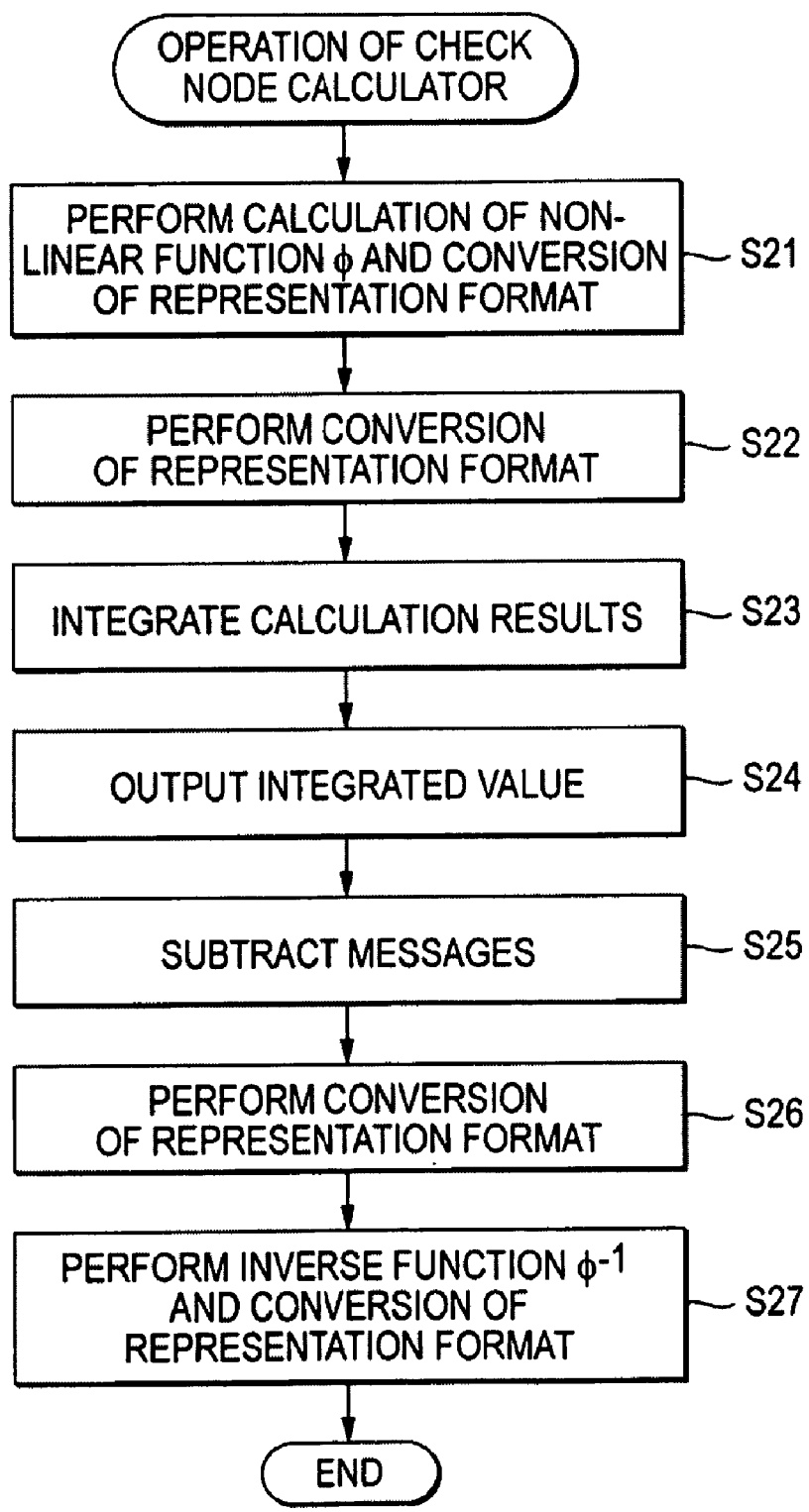
FIG. 25 A flow chart for describing processing of the check node calculator 181.

Next, processing in the check node calculator 181 of FIG. 18 will be described with reference to the flow chart of FIG. 25.

In the check node calculator 181, messages D101 (variable node message $v_i$) of 6 bits given from variable nodes corresponding to one column in the parity check matrix H are read one by one from the branch memory 100 (FIG. 17), and an absolute value D122 ($|v_i|$) which is the lower 5 bits of each 6-bit message is supplied to the LUT 221 while a sign bit D121 which is the most significant bit of each 6-bit message is supplied to the EXOR circuit 129 and the FIFO memory 133. A control signal D106 is given to the check node calculator 181 from the control section 105 (FIG. 17) so that the control signal D106 is supplied to the selector 1124 and the selector 131.

In step S21, the LUT 221 receives as an input the 5-bit absolute value D122 ($|v_i|$) supplied thereto, reads a 9-bit semi-floating point quantized value F1123 expressing a result of the operation of the nonlinear function $\phi(|v_i|)$ in association with a fixed point quantized value (on the left table of FIG. 19) which is also a 5-bit ordinary quantized value consistent with the 5-bit absolute value D122 ($|v_i|$), and outputs the 9-bit semi-floating point quantized value F1123 to the converting circuit 231 and the FIFO memory 1127.

That is, in step S21, the LUT 221 equivalently performs a process for receiving as an input the absolute value D122 ($|v_i|$) expressed by a fixed point quantized value and performing an operation of the nonlinear function $\phi(|v_i|)$ in the expression (7), and conversion of the representation format for converting the fixed point quantized value expressing a result of the operation into a semi-floating point quantized value.

In step 522, the converting circuit 231 performs conversion of the representation format for converting the 5-bit semi-floating point quantized value F1123 expressing the result of the operation of the nonlinear function $\phi(|v_i|)$ given from the LUT 221 into a 9-bit fixed point quantized value which is also a high-accuracy quantized value as described above with reference to FIG. 20, and outputs the 9-bit fixed point quantized value D1123 obtained as a result of the conversion to the operation unit 1122.

Then, in step S23, the operation unit 1122 integrates the operation result D1123 by adding the nonlinear function operation result D1123 ($\phi(|v_i|)$) expressed by the 9-bit fixed point quantized value to a 13-bit value D1124 stored in the register 1123, and stores a 13-bit integrated value obtained as a result of the integration in the register 1123 again. Incidentally, when operation results for absolute values D122 ($|v_i|$) of messages D101 given from all branches corresponding to one row in the parity check matrix H have been integrated completely, the register 1123 is reset.

Here, in the operation unit 1122 and the register 1123, the operation result D1123 ($\phi(|v_i|)$) supplied from the converting circuit 231 and expressed by the 9-bit fixed point quantized value is integrated at maximum up to the number of maximum delay times in the FIFO memory 1127, i.e. the number of times equal to the maximum weight of one row in the parity check matrix H. Now, the maximum weight of one row in the parity check matrix H in FIG. 9 is 9. Accordingly, in the operation unit 1122 and the register 1123, the 9-bit fixed point quantized value is integrated at maximum up to 9 times (nine 9-bit fixed point quantized values are integrated). For this reason, at an output from the operation unit 1122 and at outputs from portions after the operation unit 1122, the bit number of a connection line is 13 which is larger by 4 (the minimum number of bits capable of expressing 9 (times)) than the 9-bit fixed point quantized value D1123 outputted from the LUT 221 so that a value obtained by integrating a 9-bit fixed point quantized value 9 times can be expressed.

When messages D101 (variable node messages $v_i$) corresponding to one row in the parity check matrix H have been read one by one from the branch memory 100 (FIG. 17) and the integrated value obtained by integrating operation results D1123 corresponding to one row has been stored in the register 1123, the control signal D106 supplied from the control section 105 changes from "0" to "1". When, for example, the row weight in the parity check matrix H is "9", the control signal D106 takes "0" for the first clock to the eighth clock and takes "1" for the ninth clock.

When the control signal D106 is "1", in step S24, the selector 1124 selects a value stored in the register 1123, i.e. a 13-bit integrated value D1124 ($\Sigma\phi(|v_i|)$ from i=1 to i=$d_c$) as a result of integration of $\phi(|v_i|)$ calculated from messages D101 (variable node messages $v_i$) given from all branches corresponding to one row in the parity check matrix H, and outputs the 13-bit integrated value D1124 as a 13-bit value D1125 so that the 13-bit value D1125 is stored in a register 1125. The register 1125 supplies the stored value D1125 as a 13-bit value D1126 to the selector 1124 and the operation unit 1126. When the control signal D106 is "0", the selector selects a value D1126 supplied from the register 1125, and outputs the value D1126 so that the value D1126 is stored in the register 1125 again. That is, unless $\phi(|v_i|)$ calculated from the messages D101 (variable node messages $v_i$) given from all branches corresponding to one row in the parity check matrix H are integrated completely, the register 1125 supplies $\phi(|v_i|)$ integrated at the last time, to the selector 1124 and the operation unit 1126.

On the other hand, the FIFO memory 1127 delays the 5-bit semi-floating point quantized value expressed by the nonlinear function calculation result D1123 ($\phi(|v_i|)$) outputted from the LUT 221 until a new value D1126 ($\Sigma\phi(|v_i|)$ from i=1 to i=$d_c$) is outputted from the register 1125, and supplies the delayed 5-bit semi-floating point quantized value F1127 to the converting circuit 232 when the new value D1126 ($\Sigma\phi(|v_i|)$ from i=1 to i=$d_c$) is outputted from the register 1125.

Similarly to the converting circuit 231, the converting circuit 232 performs conversion of the representation format for converting the 5-bit semi-floating point quantized value F1127 which is supplied from the FIFO 1127 and which expresses a result of the operation of the nonlinear function $\phi(|v_i|)$, into a 9-bit fixed point quantized value which is also a high-accuracy quantized value. The converting circuit 232 supplies the 9-bit fixed point quantized value D1127 obtained as a result of the conversion to the operation unit 1126.

In step S25, the operation unit 1126 subtracts the 9-bit value D1127 outputted from the FIFO memory 1127 and having the representation format converted by the converting circuit 232, from the 13-bit value D1126 supplied from the register 1125 (integrates a value obtained by multiplying the 9-bit values D1127 by −1 with the 13-bit value D1126 supplied from the register 1125), and supplies a 9-bit fixed point quantized value D1128 which is also a high-accuracy quantized value expressing a result of the subtraction, to the converting circuit 233.

That is, the operation unit 1126 subtracts $\phi(|v_i|)$ calculated from a message D101 (variable node message $v_i$) from a branch intended to calculate a check node message $u_j$, from the integrated value of $\phi(|v_i|)$ calculated from messages D101 (variable node messages $v_i$) given from all branches corresponding to one row in the parity check matrix H, and supplies a 9-bit fixed point quantized value D1128 expressing the difference value ($\Sigma\phi(|v_i|)$ from i=1 to i=$d_c$−1) to the converting circuit 233.

Incidentally, when a quantized value as a result of subtraction of the 9-bit value D1127 supplied from the FIFO memory 1127, from the 13-bit value D1126 supplied from the register 1125 exceeds the maximum value which can be expressed by the 9-bit fixed point quantized value D1128, the operation unit 1126 clips the subtraction result to the maximum value which can be expressed by the 9-bit fixed point quantized value, and outputs the clipped subtraction result.

In step S26, the converting circuit 233 performs conversion of the representation format for converting the 9-bit fixed point quantized value D1128 given from the operation unit 1126 into a 5-bit semi-floating point quantized value as described above with reference to FIG. 22, and supplies a 5-bit semi-floating point quantized value F1128 obtained as a result of the conversion to the LUT 228.

In step S27, the LUT 228 receives the 5-bit semi-floating point quantized value F1128 which is supplied from the converting circuit 233 and which expresses an integrated value $\Sigma\phi(|v_i|)$ of the expression (7), reads a 5-bit fixed point quantized value D1129 ($\phi^{-1}(\Sigma\phi(|v_i|))$) which expresses a result of the operation of the inverse function $\phi^{-1}(\Sigma\phi(|v_i|))$ and which is also an ordinary quantized value, in association with the semi-floating point quantized value F1128, and outputs the 5-bit fixed point quantized value D1129.

That is, in step S27, the LUT 228 equivalently performs a process for receiving as an input the integrated value $\Sigma\phi(|v_i|)$ of the expression (7) expressed by the semi-floating point quantized value and performing the operation of the inverse function $\phi^{-1}(\phi(|v_i|))$ in the expression (7), and conversion of the representation format for converting the semi-floating point quantized value expressing a result of the operation into a fixed point quantized value.

In parallel with the aforementioned processing, the same processing as that in the check node calculator 101 of FIG. 11 is performed in the EXOR circuit 129, the register 130, the selector 131, the register 132, the FIFO memory 133 and the EXOR circuit 134. Thus, the EXOR circuit 134 divides a product value of sign bits D121 (sign(|v$_i$|)) of messages D101 (variable node messages v$_i$) given from all branches corresponding to one row in the parity check matrix H, by a sign bit D121 (sign(|v$_i$|)) of a message D101 given from a branch intended to calculate the check node message u$_j$ to thereby output the quotient value (Πsign(|v$_i$|) from i=1 to i=d$_c$−1) as a quotient value D135.

The check node calculator 181 outputs a message D102 (check node message u$_j$) expressed by a fixed point quantized value which is also an ordinary quantized value of a total of 6 bits in which the 5-bit fixed point quantized value D1129 outputted from the LUT 228 is set as its lower 5 bits and the 1-bit quotient value D135 outputted from the EXOR circuit 134 is set as its most significant bit (sign bit).

As described above, similarly to the check node calculator 171 of FIG. 14, the check node calculator 181 uses a 9-bit fixed point quantized value which is also a high-accuracy quantized value, or a 5-bit semi-floating point quantized value expressing a numerical value near 0 with accuracy as high as the 9-bit fixed point quantized value and with a dynamic range as wide as the 9-bit fixed point quantized value in a process part of from the operation of the nonlinear function $\phi(x)$ to the operation of the inverse function $\phi^{-1}(x)$, and uses a fixed point quantized value which is also an ordinary quantized value in the other process part. Accordingly, it is possible to decode an LDPC code with high accuracy while suppressing an increase in the scale of the decoding device (without increasing capacities of the branch memories 100 and the receiving memory 104 in FIG. 17).

Further, in the check node calculator 181, the LUT 221 receives a 5-bit fixed point quantized value as an input and outputs a result of the operation of the nonlinear function $\phi(x)$ as a 5-bit semi-floating point quantized value whereas the LUT 228 receives a 5-bit semi-floating point quantized value as an input and outputs a result of the operation of the inverse function $\phi^{-1}(x)$ as a 5-bit fixed point quantized value. Thus, from these points, it is possible to decide an LDPC code with high accuracy while suppressing an increase in the scale of the decoding device (using the LUTs 221 and 228 with small capacities).

Incidentally, the converting circuits 231 to 233 are newly required in the check node calculator 181, compared with the check node calculator 171 of FIG. 14. If the minimum value of the quantization width of a semi-floating point quantized value is as large as the quantization width of a fixed point quantized value which is also a high-accuracy quantized value, the converting circuits 231 to 233 can be configured simply as described above, so that a great increment of the circuit scale based on the new provision of the converting circuits 231 to 233 can be suppressed.

On the other hand, as described above, the capacity required of the LUT 221 and in proportion to the scale of the circuit is only 5/9 as much as that of the corresponding LUT 1121 of FIG. 14 and the capacity required of the LUT 228 and in proportion to the scale of the circuit is only $\frac{1}{2^4}$ as much as that of the corresponding LUT 1128 of FIG. 14. Accordingly, the amount of reduction in the circuit scale achieved by use of the LUTs 221 and 228 is extremely large.

Accordingly, in the case where the LUTs 221 and 228 are used, the circuit scale of the check node calculator 181 can be reduced even when increment of the circuit scale based on the new provision of the converting circuits 231 to 233 is taken into consideration.

Figure 26:
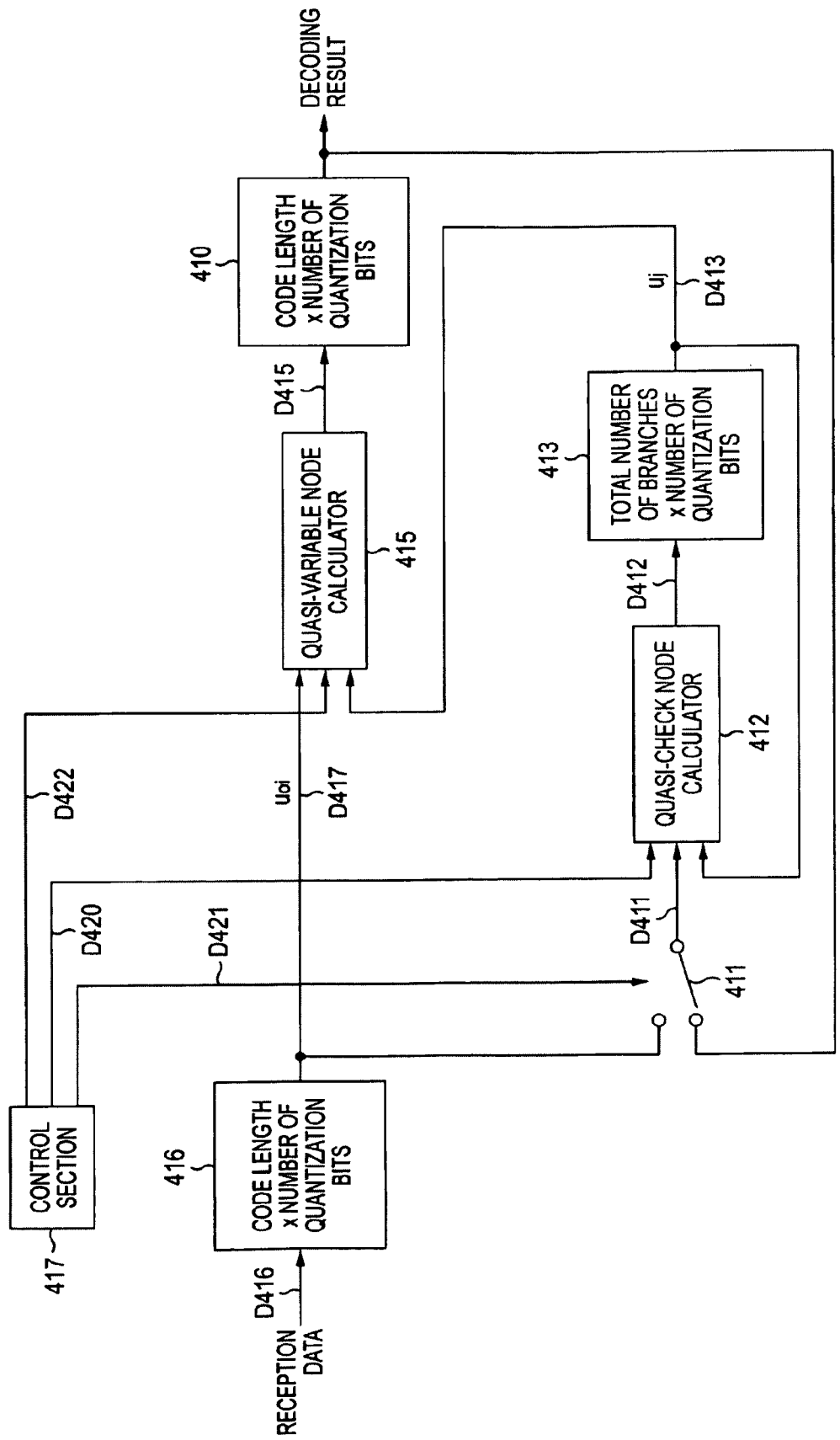
FIG. 26 A block diagram showing an example of configuration of a second embodiment of the decoding device to which the invention is applied.

Next, FIG. 26 shows an example of configuration of a second embodiment of a decoding device for decoding an LDPC code, to which the invention is applied.

The decoding device in FIG. 26 can decode an LDPC code with high accuracy while suppressing an increase in the scale of the decoding device. In addition, compared with the decoding device in FIG. 17, the decoding device in FIG. 26 can reduce a storage capacity of a memory required for the decoding device.

Incidentally, for example, an LDPC code (of coding rate 2/3 and code length 108) expressed by the aforementioned parity check matrix H shown in FIG. 9 is decoded by the decoding device of FIG. 26, for example, in a similar manner to the aforementioned decoding device of FIG. 17.

In FIG. 26, the decoding device includes an intermediate decoding result storage memory 410, a switch 411, a quasi-check node calculator 412, a branch memory 413, a quasi-variable node calculator 415, a receiving memory 416, and a control section 417, so that the decoding device decodes an LDPC code by equivalently iteratively performing the same check node operation and variable node operation as performed by the decoding device of FIG. 17.

Before description of respective portions of the decoding device in FIG. 26, the relation between the quasi-check node calculator 412/the quasi-variable node calculator 415 in FIG. 26 and the check node calculator 181/the variable node calculator 103 in FIG. 17 will be described herewith reference to the aforementioned FIG. 18 and FIGS. 27 to 29.

As described above, FIG. 18 shows an example of configuration of the check node calculator 181 of FIG. 17 for carrying out a check node operation.

Figure 27:
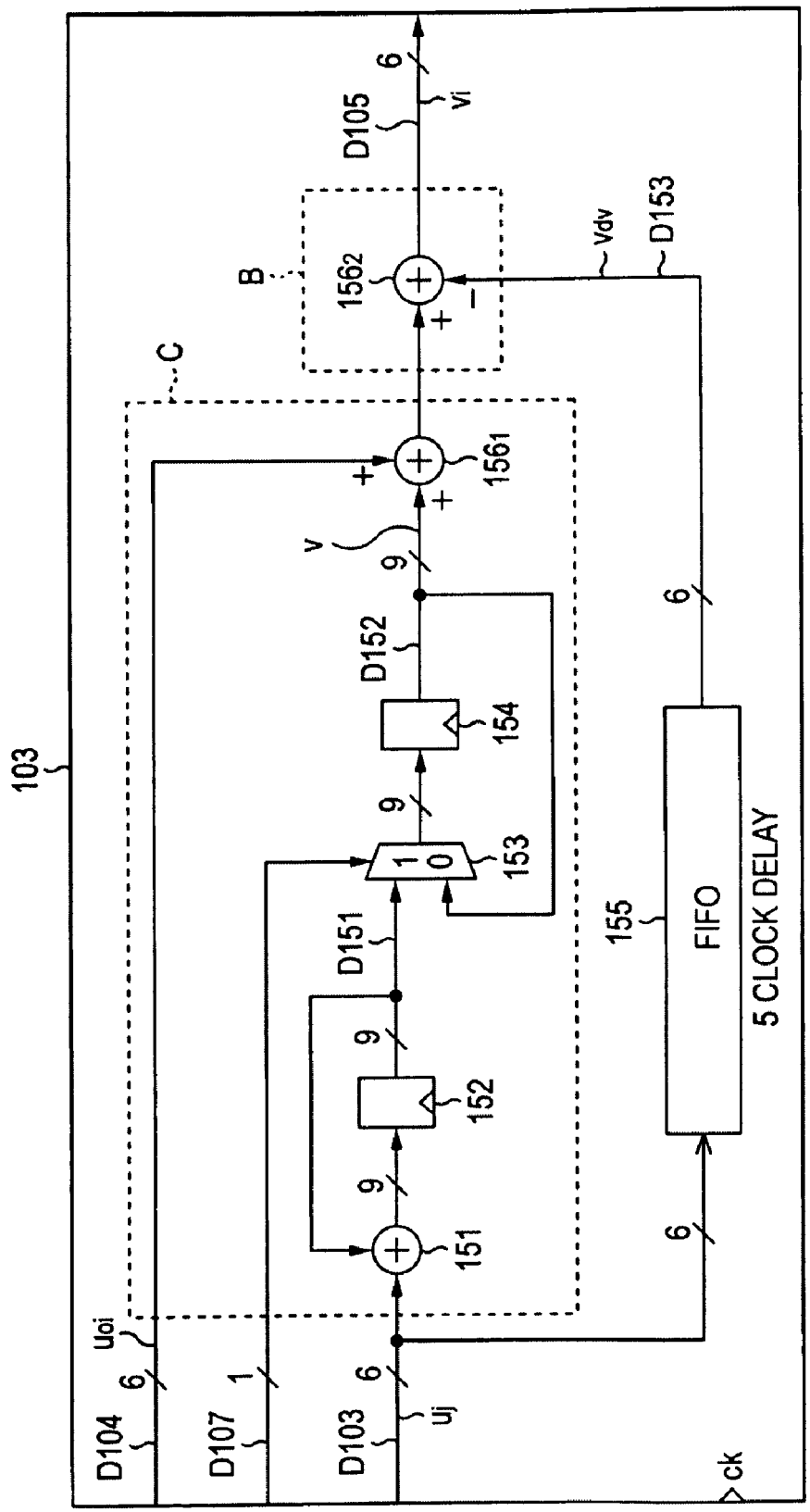
FIG. 27 A block diagram showing an example of configuration of a variable node calculator 103.

FIG. 27 shows an example of configuration of the variable node calculator 103 of FIG. 17 for carrying out a variable node operation. Incidentally, the variable node calculator 103 of FIG. 17 is identical to the variable node calculator 103 of FIG. 10. Accordingly, the variable node calculator 103 of FIG. 17 as shown in FIG. 27 has the same configuration as the variable node calculator 103 of FIG. 10 as shown in FIG. 12.

However, FIG. 27 illustrates the case where the operation unit 156 of FIG. 12 is separated into two operation units 156$_1$ and 156$_2$. That is, as describe above, the operation unit 156 of FIG. 12 subtracts a value D153 supplied from the FIFO memory 155, from a value D152 supplied from the register 154, adds reception data D104 supplied from the receiving memory 104 to a difference value as a result of the subtraction, and outputs a thus obtained 6-bit value as a message D105 (variable node message v$_i$). Therefore, the process performed by the operation unit 156 can be separated into a subtraction process for subtracting a value D153 supplied from the FIFO memory 155 from a value D152 supplied from the register 154, and an addition process for adding reception data D104 supplied from the receiving memory 104 thereto.

Therefore, FIG. 27 illustrates the case where the calculator 156 of FIG. 12 is separated into an operation unit 156$_1$ for performing the addition process and an operation unit 156$_2$ for performing the subtraction process.

Figure 28:
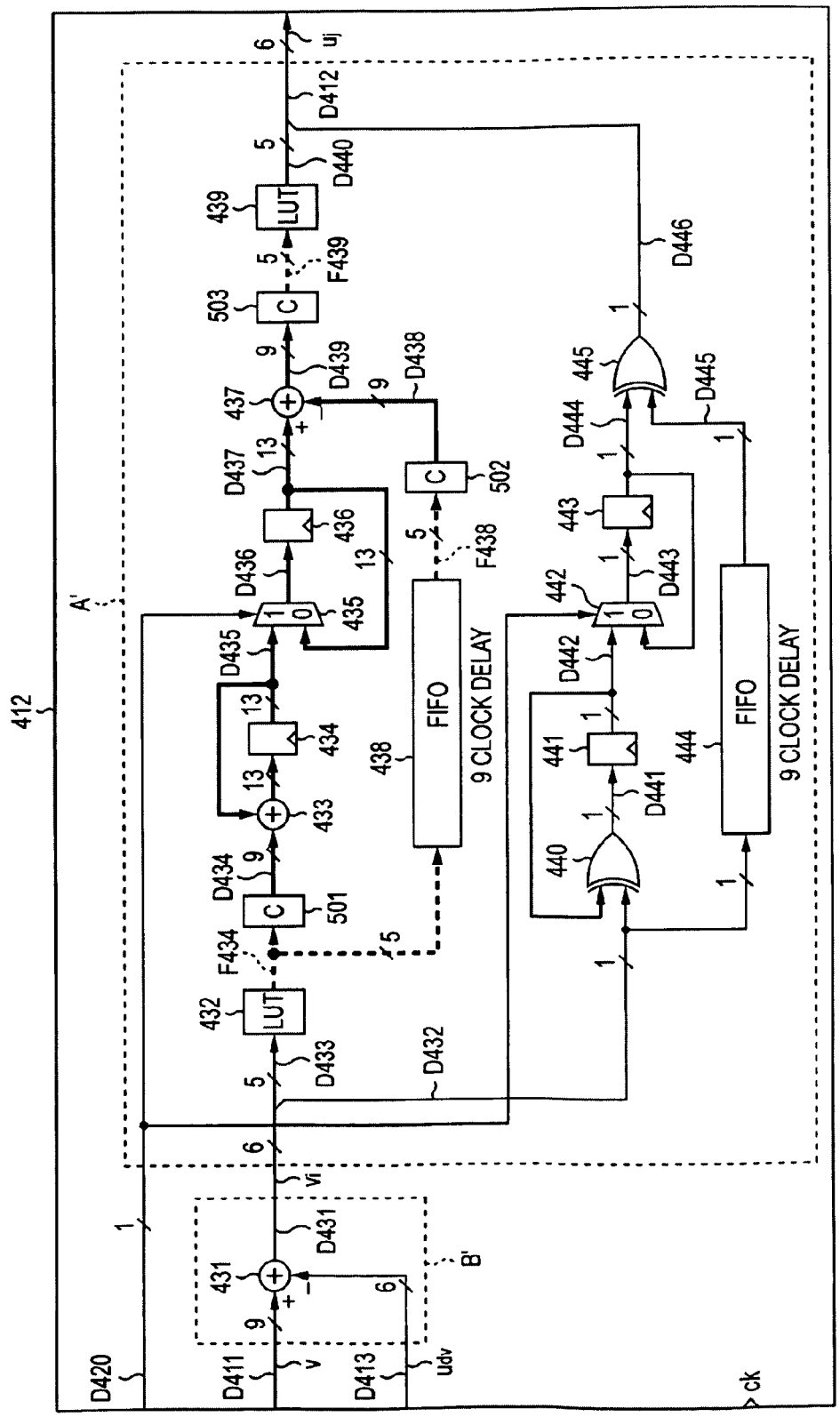
FIG. 28 A block diagram showing an example of configuration of a quasi-check node calculator 412.
Figure 29:
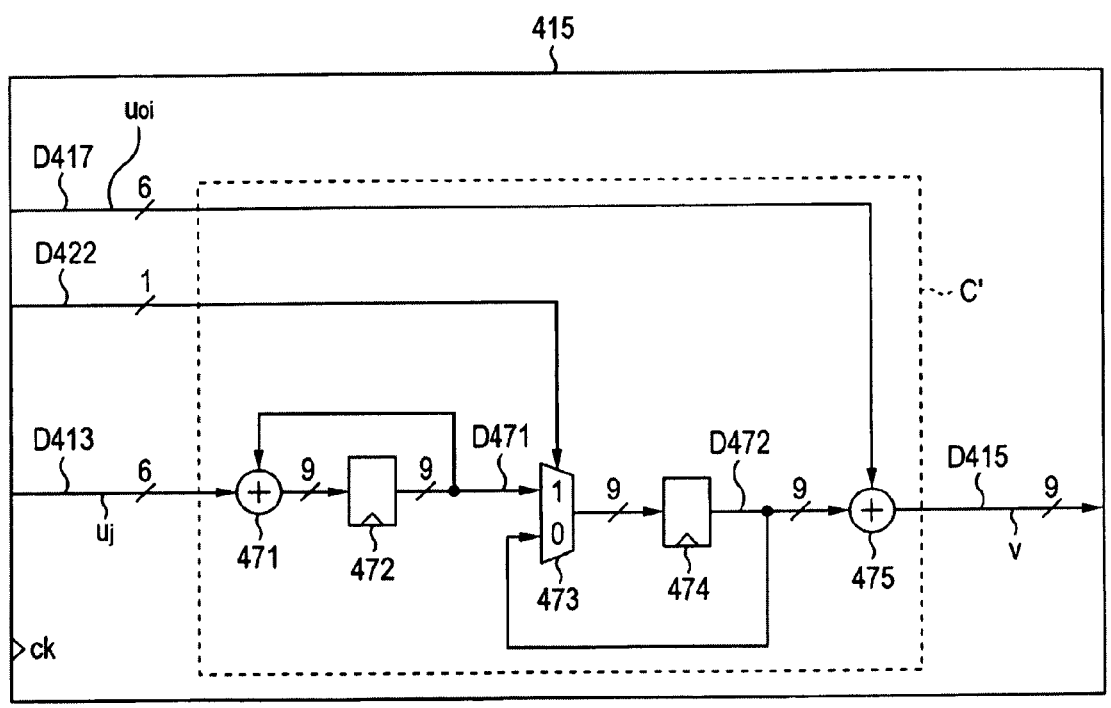
FIG. 29 A block diagram showing an example of configuration of a quasi-variable node calculator 415.

On the other hand, FIG. 28 shows an example of configuration of the quasi-check node calculator 412 of FIG. 26. FIG. 29 shows an example of configuration of the quasi-variable node calculator 415 of FIG. 26.

In the decoding device of FIG. 26, the quasi-check node calculator 412 performs a check node operation per se but the quasi-variable node calculator 415$_k$ does not perform a variable node operation per se. The quasi-check node calculator 412 performs a check node operation and a part of a variable node operation whereas the quasi-variable node calculator 415 performs the other part of the variable node operation.

That is, the quasi-check node calculator 412 of FIG. 28 is composed of a block A' and a block B'. The block A' corresponds to a block A in which the check node calculator of FIG. 18 performs a check node operation. The block B' corresponds to a block B which is a part of the variable node calculator 103 of FIG. 27 and in which a check node message $u_j$ corresponding to a branch intended to calculate a variable node message $v_i$ is subtracted from an integrated value of check node messages $u_j$ corresponding to all branches connected to each column in the parity check matrix H.

On the other hand, the quasi-variable node calculator of FIG. 29 is composed of a block C'. The block C' corresponds to a block C which is the other part of the variable node calculator 103 of FIG. 27 and in which check node messages $u_j$ corresponding to all branches connected to each column in the parity check matrix H are integrated and a reception data $u_{0i}$ is added to the integrated value as a result of the integration.

That is, the check node calculator 181 of FIG. 17 is composed of a block A for performing a check node operation per se as shown in FIG. 18. As shown in FIG. 27, the variable node calculator 103 of FIG. 17 can be separated into a block B for performing a part of a variable node operation in which a check node message $u_j$ corresponding to a branch intended to calculate a variable node message $v_i$ is subtracted from an integrated value of check node messages $u_j$ corresponding to all branches connected to each column in the parity check matrix H, and a block C for performing the other part of the variable node operation in which check node messages $u_j$ corresponding to all branches connected to each column in the parity check matrix H are integrated and a reception data $u_{0i}$ is added to the integrated value as a result of the integration.

The quasi-check node calculator 412 of FIG. 28 is composed of a block A' corresponding to the block A of FIG. 18 and a block B' corresponding to the block B of FIG. 27. The block B' performs a part of the variable node operation whereas the block A performs the check node operation per se. Here, a part of the variable node operation and the check node operation performed by the quasi-check node calculator 412 is hereinafter referred to as quasi-check node operation appropriately.

On the other hand, the quasi-variable node calculator 415 of FIG. 29 is composed of a block C' corresponding to the block C of FIG. 27. The block C' performs the other part of the variable node operation. The other part of the variable node operation performed by the quasi-variable node calculator 415 is hereinafter referred to as quasi-variable node operation appropriately.

In the decoding device of FIG. 26, the quasi-check node calculator 412 performs a quasi-check node operation (a part of a variable node operation and a check node operation) by using storage contents, etc. of the intermediate decoding result storage memory 410, and supplies a thus obtained check node message $u_j$ to the branch memory 413 so that the check node message $u_j$ is stored in the branch memory 413. Further, the quasi-variable node calculator 415 performs a quasi-variable node operation (the other part of the variable node operation) by using check node messages $u_j$ etc. stored in the branch memory 413, and supplies a thus obtained intermediate decoding result v to the intermediate decoding result storage memory 410 so that the intermediate decoding result v is stored in the intermediate decoding result storage memory 410.

Accordingly, in the decoding device of FIG. 26, the quasi-check node operation to be performed by the quasi-check node calculator 412 and the quasi-variable node operation to be performed by the quasi-variable node calculator 415 are performed alternately. As a result, the check node operation and the variable node operation are performed alternately, so that an LDPC code is decoded.

Incidentally, in the variable node calculator 103 of FIG. 27, the block C performs an addition process for integrating check node messages $u_j$ corresponding to all branches connected to each column in the parity check matrix H and adding a reception data $u_{0i}$ to the integrated value as a result of the integration whereas the block B performs a subtraction process for subtracting a check node message $u_j$ given from a branch intended to calculate a variable node message $v_i$ from a value obtained as a result of the addition process (a sum value of the integrated value of the check node messages $u_j$ corresponding to all branches connected to each column in the parity check matrix H and the reception data $u_{0i}$). For this reason, the variable node calculator 103 of FIG. 27 needs an FIFO memory for delaying the check node message $u_j$ given from the branch intended to calculate the variable node message $v_i$ unless the check node messages $u_j$ corresponding to all the branches connected to each column in the parity check matrix H are integrated completely.

On the other hand, the block B' of the quasi-check node calculator 412 of FIG. 28, like the corresponding block B (FIG. 27), performs a subtraction process for subtracting a check node message $u_j$ given from a branch intended to calculate a variable node message $v_i$, from the integrated value of check node messages $u_j$ corresponding to all branches connected to each column in the parity check matrix H. In the decoding device of FIG. 26, the check node messages $u_j$ are stored in the branch memory 413 and a check node message $u_j$ (message D411) given from a branch intended to calculate a variable node message $v_i$ is supplied to the quasi-check node calculator 412 from the branch memory 413.

Accordingly, the decoding device of FIG. 26 does not need the FIFO memory 155 (FIG. 27) which delays a check node message $u_j$ given from a branch intended to calculate a variable node message $v_i$ unless check node messages $u_j$ corresponding to all branches connected to each column in the parity check matrix H are integrated completely. Accordingly, the decoding device of FIG. 26 can be formed to be smaller by a size corresponding to the FIFO memory 155 than the decoding device of FIG. 17.

Next, a quasi-check node operation performed by the quasi-check node calculator 412 (FIG. 28) of FIG. 26 and a quasi-variable node operation performed by the quasi-variable node calculator 415 (FIG. 29) will be described on the basis of numerical expressions.

The quasi-check node calculator 412 performs an operation (a part of a variable node operation) represented by the following expression (8) and an operation (a check node operation) represented by the aforementioned expression (7) as a quasi-check node operation, and supplies a check node message $u_j$ as a result of the quasi-check node operation to the branch memory 413 so that the check node message $u_j$ is stored (saved) in the branch memory 413. On the other hand, the quasi-variable node calculator 415 performs an operation (the other part of the variable node operation) represented by the aforementioned expression (5) as a quasi-variable node operation, and supplies an intermediate decoding result v as a result of the quasi-variable node operation to the intermediate decoding result storage memory 410 so that intermediate decoding result V is stored in the intermediate decoding result storage memory 410.

[Numerical Expression 8]

$$v_i = v - u_{d_v} \tag{8}$$

Incidentally, $u_{dv}$ in the expression (8) represents a result of the operation (quasi-check node operation) of a check node given from a branch intended to calculate a variable node message $v_i$ corresponding to the i-th column in the parity check matrix H by the variable node operation. That is, $u_{dv}$ is a check node message $u_j$ corresponding to a branch (i.e. a check node message $u_j$ given from a branch) intended to calculate a variable node message $v_i$ by the variable node operation.

Here, the intermediate decoding result v obtained as a result of the operation represented by the aforementioned expression (5) is a sum of reception data $u_{0i}$ and check node messages $u_j$ obtained as operation results of check nodes given from all branches corresponding to 1 in respective rows on the i-th column in the parity check matrix H. Accordingly, a variable node message $v_i$ given from each branch can be obtained in such a manner that a check node message $u_{dv}$ which is given from a branch intended to calculate a variable node message $v_i$ and which is one of check node messages $u_j$ obtained by the operation of check nodes given from all branches corresponding to 1 in respective rows on the i-th column in the parity check matrix H is subtracted from such an intermediate decoding result v in accordance with the expression (8).

Accordingly, the variable node operation represented by the expression (1) for calculating a variable node message $v_1$ can be separated into an operation represented by the expression (5) and an operation represented by the expression (8).

On the other hand, the check node operation for calculating a check node message $u_j$ is represented by the expression (7).

Accordingly, a process of the variable node operation represented by the expression (1) and the check node operation represented by the expression (7) is equivalent to a process of the operation represented by the expression (5) and the operation represented by the expressions (7) and (8).

Therefore, in the decoding device of FIG. 26, the quasi-check node calculator 412 performs the operation (quasi-check node operation) represented by the expressions (8) and (7) while the quasi-variable node calculator 415 performs the operation (quasi-variable node operation) represented by the expression (5), so that an LDPC code is decoded.

Incidentally, since the intermediate decoding result v obtained by the quasi-variable node operation represented by the expression (5) is a sum of a variable node message $v_i$ of each branch obtained as a result of the variable node operation represented by the expression (1) and a check node message $u_j$ given from a branch corresponding to the variable node message $v_i$, only one intermediate decoding result v is obtained for one column (one variable node) in the parity check matrix H. Accordingly, intermediate decoding results v corresponding to the code length (the number of columns in the parity check matrix H) are obtained for reception data $u_{0i}$ of the code length.

In the decoding device of FIG. 26, the quasi-check node calculator 412 performs a quasi-check node operation by using an intermediate decoding result v which corresponds to each column in the parity check matrix H and which is a result of a quasi-variable node operation performed by the quasi-variable node calculator 415, so that a check node message (check node message outputted to each branch by each check node) $u_j$ obtained as a result of the quasi-check node operation is stored in the branch memory 413.

Accordingly, the necessary storage capacity of the branch memory 413 becomes a product of the number of 1's (the number of all branches) in the parity check matrix H and the number of quantization bits of a check node message $u_j$ (the number of bits of an ordinary quantized value which is also a fixed point quantized value in this embodiment), similarly to the branch memory 102 of FIG. 17 for storing results of the check node operation.

On the other hand, the quasi-variable node calculator 415 performs a quasi-variable node operation by using reception data $u_{0i}$ and check node messages $u_j$ which correspond to "1" in respective rows on the i-th column in the parity check matrix H and which are results of the quasi-check node operation performed by the quasi-check node calculator 412, so that an intermediate decoding result v which corresponds to the i-th column and which is obtained as a result of the quasi-variable node operation is stored in the intermediate decoding result storage memory 410.

Accordingly, the necessary storage capacity of the intermediate decoding result storage memory 410 becomes a product of the number of columns in the parity check matrix H smaller than the number of 1's in the parity check matrix H, i.e., the code length of an LDPC code, and the number of quantization bits in the intermediate decoding result v (the number of bits in an ordinary quantized value which is also a fixed point quantized value in this embodiment).

From the above description, according to the decoding device of FIG. 26 for decoding an LDPC code for which the number of 1's in a parity check matrix H is sparse, it is possible to reduce the storage capacity of the intermediate decoding result storage memory 410, compared with the branch memory 100 of FIG. 17. Accordingly, it is possible to reduce the device scale of the decoding device of FIG. 26.

Further, in the decoding device of FIG. 26, the quasi-variable node operation of the expression (5) performed by the quasi-variable node calculator 415 is an operation for obtaining an ultimate decoding result of an LDPC code when iterative decoding of the LDPC code is performed by alternate iteration of a check node operation and a variable node operation. Accordingly, such a not-shown block as provided in the decoding device of FIG. 17 for performing the operation represented by the expression (5) to obtain an ultimate decoding result of an LDPC code is not necessarily provided in the decoding device of FIG. 26. Accordingly, the device scale of the decoding device of FIG. 26 can be made smaller by a size corresponding to such an unnecessary block than the device scale of the decoding device of FIG. 17.

Next, respective portions of the decoding device of FIG. 26 will be described in detail.

Intermediate decoding results D415 (v in the expression (5)) obtained as results of the quasi-variable node operation of the expression (5) in accordance with respective columns in the parity check matrix H are supplied to the intermediate decoding result storage memory 410 from the quasi-variable node calculator 415. The intermediate decoding result storage memory 410 stores the intermediate decoding results D415 supplied from the quasi-variable node calculator 415, successively. The intermediate decoding results D415 in accordance with the respective columns in the parity check matrix H, stored in the intermediate decoding result storage memory 410 are read from the intermediate decoding result storage memory 410 and supplied to the switch 411, successively.

In addition to the intermediate decoding results D415 given from the intermediate decoding result storage memory 410, reception data D417 ($u_{0i}$) given from the receiving memory 416 are supplied to the switch 411. The switch 411 selects either an intermediate decoding result D415 supplied from the intermediate decoding result storage memory 410 or reception data D417 supplied from the receiving memory 416 on the basis of a control signal D421 supplied from the control section 417, and supplies the selected one as an intermediate decoding result D411 to the quasi-check node calculator 412.

That is, just after the reception data D417 is stored in the in the receiving memory 416 (after the reception data D417 is stored but before the first quasi-variable check node operation is performed by using the reception data D417), it is impossible to perform the quasi-check node operation using the intermediate decoding result D415 because the intermediate decoding result D415 for the reception data D417 has not been stored in the intermediate decoding result storage memory 410 yet. Therefore, just after the reception data D417 is stored in the receiving memory 416, the control section 417 supplies a control signal D421 for instructing selection of the reception data D417 to the switch 411. Consequently, the switch 411 selects the reception data D417 supplied from the receiving memory 416 and supplies the reception data D417 as an intermediate decoding result D411 to the quasi-check node calculator 412. Accordingly, in this case, the quasi-check node calculator 412 performs the quasi-check node operation by using the reception data D417 as an intermediate decoding result v in the expression (8). Although each check node message $u_j$ stored in the branch memory 413 is used in the quasi-check node operation, the check node message $u_j$ in the branch memory 413 is initialized to 0 when a new reception data D417 is stored in the receiving memory 416.

On the other hand, after the reception data D417 is stored in the receiving memory 416 and the first quasi-variable node operation using the reception data D417 is performed (and before an ultimate decoding result for the reception data D417 will be outputted), the intermediate decoding result D415 for the reception data D417 has been already stored in the intermediate decoding result storage memory 410. Accordingly, the control section 417 supplies a control signal D421 for instructing selection of the intermediate decoding result D415 to the switch 411. Consequently, the switch 411 selects the intermediate decoding result D415 supplied from the intermediate decoding result storage memory 410 and supplies the intermediate decoding result D415 as an intermediate decoding result D411 to the quasi-check node calculator 412. Accordingly, in this case, the quasi-check node calculator 412 performs the quasi-check node operation by using the intermediate decoding result D415 as an intermediate decoding result v in the expression (8).

In addition to the intermediate decoding result D411 given as an intermediate decoding result v in the expression (8) from the switch 411, a check node message $u_j$ obtained as a result of the last quasi-check node operation performed by the quasi-check node calculator 412 is supplied as a message D413 to the quasi-check node calculator 412 from the branch memory 413. A control signal D420 is supplied to the quasi-check node calculator 412 from the control section 417.

The quasi-check node calculator 412 performs a quasi-check node operation, i.e. performs an operation represented by the expression (8) by using the intermediate decoding result D411 (v in the expression (8)) given from the switch 411 and the message D413 (the last check node message $u_j$), and then performs an operation represented by the expression (7) to thereby calculate a check node message $u_j$ of the expression (7) in accordance with each branch (each component with a value of 1) in the parity check matrix H. The quasi-check node calculator 412 supplies the check node message $u_j$ of each branch obtained as a result of the quasi-check node operation of the expression (8), as a message D412, to the branch memory 413.

The branch memory 413 stores messages D412 of respective branches supplied from the quasi-check node calculator 412, successively. The messages D412 ($u_j$) of the respective branches stored in the branch memory 413 are read from the branch memory 413 successively for a next quasi-check node operation and a next quasi-variable node operation, so that each message D412 is supplied as a message D413 to the quasi-check node calculator 412 and the quasi-variable node calculator 415.

The message D413 (check node message $u_j$) of each branch is supplied to the quasi-variable node calculator 415 from the branch memory 413. The reception data D417 ($u_{0i}$ in the expression (5)) of an LDPC code is supplied to the quasi-variable node calculator 415 from the receiving memory 416. Further, a control signal D422 is supplied to the quasi-variable node calculator 415 from the control section 417.

The quasi-variable node calculator 415 performs a quasi-variable node operation represented by the expression (5) in accordance with each column in the parity check matrix H by using the message D413 ($u_j$) of each branch given from the branch memory 413 and the reception data D417 ($u_{0i}$) given from the receiving memory 416 to thereby obtain an intermediate decoding result v in accordance with each column in the parity check matrix H. The quasi-variable node calculator 415 supplies the intermediate decoding result v obtained as a result of the quasi-variable node operation represented by the expression (5), as an intermediate decoding result D415, to the intermediate decoding result storage memory 410.

Here, as described above, intermediate decoding results D415 supplied from the quasi-variable node calculator 415 are stored in the intermediate decoding result storage memory 410 successively, so that the stored intermediate decoding results D415 are read from the intermediate decoding result storage memory 410 and supplied to the switch 411, successively.

When an ultimate quasi-variable node operation has been performed by the quasi-variable node calculator 415, i.e. when a quasi-check node operation and a quasi-variable node operation have been performed iteratively, for example, a predetermined number of times on reception data D417 stored in the receiving memory 416, the intermediate decoding result storage memory 410 outputs an intermediate decoding result D415 obtained by the ultimate quasi-variable node operation as a result of ultimate decoding of the reception data D417 (LDPC code) stored in the receiving memory 416.

The receiving memory 416 stores a reception LLR (Logarithmic Likelihood Ratio) for one code length which is a value of "0" likelihood of each bit of an LDPC code calculated from a reception signal D416 received through a communication channel, as a reception data D417, and supplies the reception data D417 to the switch 411 and the quasi-variable node calculator 415.

The control section 417 supplies control signals D420, D421 and D422 to the quasi-check node calculator 412, the switch and the quasi-variable node calculator 415 respectively to thereby control the quasi-check node calculator 412 and the quasi-variable node calculator 415 respectively.

In the decoding device of FIG. 26 configured as described above, one-cycle's decoding (one-cycle's process in iterative decoding (a check node operation and a variable node operation)) is performed when data make one cycle in the order of the intermediate decoding result storage memory 410, the quasi-check node calculator 412, the branch memory 413 and the quasi-variable node calculator 415. In the decoding device of FIG. 26, after decoding is performed iteratively a predetermined number of times, an intermediate decoding result D415 which is a result of the quasi-variable node operation performed by the quasi-variable node calculator 415 is outputted as an ultimate decoding result.

Next, the quasi-check node calculator 412 and the quasi-variable node calculator 415 in FIG. 26 will be described in more detail.

First, FIG. 28 shows an example of configuration of the quasi-check node calculator 412 of FIG. 26.

In addition to the intermediate decoding result D411 given as an intermediate decoding result v in the expression (8) from the switch 411 (FIG. 26), a check node message $u_{dv}$ given from a branch intended to calculate a variable node message $v_i$ in accordance with the expression (8), among check node messages $u_j$ obtained at the last time as results of the quasi-check node operation by the quasi-check node calculator 412 (check node messages $u_j$ used in the quasi-variable node operation performed just before) is supplied to the quasi-check node calculator 412 as a message D413 to the quasi-check node calculator 412 from the branch memory 413 (FIG. 26). Further, the control signal D420 is supplied to the quasi-check node calculator 412 from the control section 417 (FIG. 26).

Here, the decoding device of FIG. 26 performs a quasi-check node operation and a quasi-variable node operation iteratively to thereby equivalently perform a check node operation and a variable node operation iteratively in the same manner as the decoding device of FIG. 17.

The decoding device of FIG. 17 is designed so that each of a message $u_j$ obtained by the check node operation and a message $v_i$ obtained by the variable node operation is expressed by a fixed point quantized value which is also an ordinary quantized value of 6 bits inclusive of a sign bit. Also the decoding device of FIG. 26 is designed so that each of the message $u_j$ and the message $v_i$ is expressed by a fixed point quantized value which is also an ordinary quantized value of bits inclusive of a sign bit. The decoding device of FIG. 26 is further designed so that a reception data D417 stored in the receiving memory 416 is also expressed by a fixed point quantized value which is also an ordinary quantized value of bits inclusive of a sign bit in the same manner as that in the decoding device of FIG. 17.

In this case, a message D413 (check node message $u_{dv}$) supplied to the quasi-check node calculator 412 from the branch memory 413 (FIG. 26) is expressed by a fixed point quantized value which is also an ordinary quantized value of 6 bits. In addition, an intermediate decoding result D411 (v) supplied to the quasi-check node calculator 412 from the switch 411 (FIG. 26) is expressed by a fixed point quantized value which is also an ordinary quantized value of 9 bits as will be described later.

Both the message D413 expressed by a fixed point quantized value which is also an ordinary quantized value of 6 bits supplied to the quasi-check node calculator 412 from the branch memory 413 (FIG. 26) (i.e. the check node message $u_{dv}$ given from a branch intended to calculate a variable node message $v_i$ in accordance with the expression (8), among check node messages $u_j$ obtained at the last time as results of the quasi-check node operation) and the intermediate decoding result D411 (v) expressed by a fixed point quantized value which is also an ordinary quantized value of 9 bits supplied to the quasi-check node calculator 412 from the switch 411 (FIG. 26) are supplied to an operation unit 431 in the block B'.

A control signal D420 supplied to the quasi-check node calculator 412 from the control section 417 (FIG. 26) is supplied to a selector 435 and a selector 442.

The operation unit 431 performs an operation represented by the expression (8), i.e. subtracts an intermediate decoding result D413 ($u_{dv}$) of 6 bits supplied to the operation unit 431, from an intermediate decoding result D411 (v) of 9 bits likewise supplied to the operation unit 431 to thereby obtain a variable node message $v_i$ and output a fixed point quantized value D431 ($v_i$) which is also an ordinary quantized value of 6 bits and which expresses the variable node message $v_i$.

Incidentally, when a result of the operation represented by the expression (8) is out of a numerical value range expressed by a fixed point quantized value which is an ordinary quantized value of 6 bits, the operation unit 431 clips the operation result and outputs the clipped operation result in the same manner as the operation unit 156 which is a constituent portion of the aforementioned variable node calculator 103 of FIG. 12.

The 6-bit fixed point quantized value D431 ($v_i$) outputted from the operation unit 431 is supplied to the block A'. In the block A', a sign bit D432 (sign($v_i$)) as the most significant bit discriminating between plus and minus, of the 6-bit fixed point quantized value D431 (the variable node message $v_i$) given from the operation unit 431 is supplied to an EXOR circuit 440 and an FIFO memory 444 while the absolute value D433($|v_i|$) of the lower 5 bits of the 6-bit fixed point quantized value D431 is supplied to an LUT 432.

As described above, the block A' corresponds to the block A of the check node calculator 181 shown in FIG. 18. Accordingly, the block A' performs the same processing as the block A.

That is, in the block A', an LUT 432, an operation unit 433, a register 434, a selector 435, a register 436, an operation unit 437, an FIFO memory 438, an LUT 439, an EXOR circuit 440, a register 441, a selector 442, a register 443, an FIFO memory 444, an EXOR circuit 445, and converting circuits 501 to 503 are configured similarly to the LUT 221, the operation unit 1122, the register 1123, the selector 1124, the register 1125, the operation unit 1126, the FIFO memory 1127, the LUT 228, the EXOR circuit 129, the register 130, the selector 131, the register 132, the FIFO memory 133, the EXOR circuit 134, and the converting circuits 231 to 233 respectively in the block A of FIG. 18.

In the block A', the LUT 432 receives as an input a fixed point quantized value which is also an ordinary quantized value of 5 bits consistent with a 5-bit absolute value D433 ($|v_i|$) given from the operation unit 431, reads a 5-bit semi-floating point quantized value F434 expressing a result of the operation of a nonlinear function $\phi(|v_i|)$ in association with the fixed point quantized value, and outputs the 5-bit semi-floating point quantized value F434 to the converting circuit 501 and the FIFO memory 438.

The converting circuit 501 converts the 5-bit semi-floating point quantized value F434 supplied from the LUT 432 into a fixed point quantized value D434 which is also a high-accuracy quantized value of 9 bits, and outputs the fixed point quantized value D434 to the operation unit 433 in the same manner as the converting circuit 231 in FIG. 18.

The operation unit 433 integrates the 9-bit fixed point quantized value D434 expressing a result of the operation of the nonlinear function $\phi(|v_i|)$ by adding the 9-bit fixed point quantized value D434 supplied from the converting circuit 501 and expressing a result of the operation of the nonlinear function $\phi(|v_i|)$ to a 13-bit value D435 stored in the register 434, so that a thus obtained integrated value D435 expressed by a fixed point quantized value which is also a high-accuracy quantized value of 13 bits is stored in the register 434 again. Incidentally, when operation results for absolute values D433 ($|v_i|$) of messages D431 (variable node messages $v_i$) given from all branches connected to one row in the parity check matrix H have been integrated completely, the register 434 is reset.

Here, the reason why the integrated value D435 outputted from the operation unit 433 consists of 13 bits but the operation result D434 ($\phi(|v_i|)$) as a subject of integration inputted to the operation unit 433 through the converting circuit 501 from the LUT 432 consists of 9 bits is the same as the reason why an output from the operation unit 1122 in FIG. 18 consists of 13 bits larger by 4 bits than a 9-bit operation result D434 ($\phi(|v_i|)$) inputted to the operation unit 1122.

When messages D431 (variable node messages $v_i$) corresponding to one row in the parity check matrix H have been read one by one and an integrated value as a result of integration of operation results D434 for one row has been stored in the register 434, the control signal D420 supplied from the control section 417 (FIG. 26) changes from "0" to "1". When, for example, the row weight in the parity check matrix H is "9", the control signal D420 takes "0" up to when the eighth operation result D434 is integrated, and takes "1" when the ninth operation result D434 is integrated.

When the control signal D420 is "1", the selector 435 selects a value stored in the register 434, i.e. a 13-bit fixed point quantized value D435 ($\Sigma\phi(|v_i|)$ from i=1 to i=$d_c$) as an integrated value of $\phi(|v_i|)$ calculated from the messages D431 (variable node messages $v_i$) given from all branches connected to one row in the parity check matrix H, and outputs the 13-bit fixed point quantized value D435 as a 13-bit fixed point quantized value D436 to the register 436 so that the 13-bit fixed point quantized value D436 is stored in the register 436. The register 436 supplies the stored fixed point quantized value D436 as a 13-bit fixed point quantized value D437 to the selector 435 and the operation unit 437. When the control signal D420 is "0", the selector 435 selects a fixed point quantized value D437 supplied from the register 436, and outputs the fixed point quantized value D437 to the register 436 so that the fixed point quantized value D437 is stored in the register 436 again. That is, unless $\phi(|v_i|)$ calculated from the messages D431 (variable node messages $v_i$) given from all the branches connected to one row in the parity check matrix H are integrated completely, the register 436 supplies $\phi(|v_i|)$ integrated at the last time, to the selector 435 and the operation unit 437.

On the other hand, the FIFO memory 438 delays the 5-bit semi-floating point quantized value F434 expressing a result of the operation of the nonlinear function $\phi(|v_i|)$ outputted from the LUT 432 unless a new fixed point quantized value D437 ($\Sigma\phi(|v_i|)$ from i=1 to i=$d_c$) is outputted from the register 436, and supplies the delayed 5-bit semi-floating point quantized value F434 as a 5-bit semi-floating point quantized value F438 to the converting circuit 502.

The converting circuit 502 converts the 5-bit semi-floating point quantized value F438 supplied from the FIFO 438 into a fixed point quantized value D438 which is also a high-accuracy quantized value of 9 bits, and supplies the fixed point quantized value D438 to the operation unit 437.

The operation unit 437 subtracts the 9-bit fixed point quantized value D438 supplied from the converting circuit 502, from the 13-bit fixed point quantized value D437 supplied from the register 436, and supplies a 9-bit fixed point quantized value D439 obtained as a result of the subtraction to the LUT 439.

That is, the operation unit 437 subtracts a result of the operation of the nonlinear function $\phi(|v_i|)$ calculated from a message D431 (variable node message $v_i$) given from a branch intended to calculate a check node message $u_j$, from the integrated value of the operation results of the nonlinear function $\phi(|v_i|)$ calculated from the messages D431 (variable node messages $v_i$) given from all branches connected to one row in the parity check matrix H, and supplies a 9-bit fixed point quantized value D439 expressing the difference value ($\Sigma\phi(|v_i|)$ from i=1 to i=$d_c$-1) to the converting circuit 503.

Incidentally, when the subtraction result as a result of subtraction of the 9-bit fixed point quantized value D438 supplied from the converting circuit 502 from the 13-bit fixed point quantized value D437 supplied from the register 436 exceeds the maximum value which can be expressed by a fixed point quantized value which is also a high-accuracy quantized value of 9 bits, the operation unit 437 clips the subtraction result to the maximum value which can be expressed by a fixed point quantized value which is also a high-accuracy quantized value of 9 bits, and outputs the clipped subtraction result.

The converting circuit 503 converts the 9-bit fixed point quantized value D439 which is supplied from the operation unit 437 and which expresses the difference value ($\Sigma\phi(|v_i|)$ from i=1 to i=$d_c$-1), into a 5-bit semi-floating point quantized value F439, and supplied the 5-bit semi-floating point quantized value F439 to the LUT 439.

The LUT 439 receives as an input the 5-bit semi-floating point quantized value F439 which is supplied from the converting circuit 503 and which expresses the difference value ($\Sigma\phi(|v_i|)$ from i=1 to i=$d_c$-1), and reads and outputs a 5-bit fixed point quantized value which expresses a result of the operation of the inverse function $\phi^{-1}(\Sigma\phi(|v_i|))$ and which is also an ordinary quantized value, in association with the 5-bit semi-floating point quantized value F439.

In parallel with the aforementioned processing, the EXOR circuit 440 multiplies sign bits by each other by performing EXORing of a 1-bit value D442 stored in the register 441 and a sign bit D432 and stores a 1-bit product value D441 in the register 441 again. Incidentally, when code bits D432 of variable node messages $v_i$ (D431) calculated from intermediate decoding results D441 corresponding to all 1's in one row in the parity check matrix H have been multiplied completely, the register 441 is reset.

When a multiplication result D441 ($\Pi$sign($v_i$) i=1 to i=$d_c$) as a result of multiplication of the sign bits D432 of the variable node messages $v_i$ (D431) calculated from the intermediate decoding results D411 corresponding to all 1's in one row in the parity check matrix has been stored in the register 441, the control signal D420 supplied from the control section 417 changes from "0" to "1".

When the control signal D420 is "1", the selector 442 selects a value stored in the register 441, i.e. a value D442 ($\Pi$sign($v_i$) i=1 to i=$d_c$) as a result of multiplication of the sign bits D432 calculated from the intermediate decoding results D411 corresponding to all 1's in one row in the parity check matrix, and outputs the value D442 as a 1-bit value D443 to the register 443 so that the 1-bit value D443 is stored in the register 443. The register 443 supplies the stored value D443 as a 1-bit value D444 to the selector 442 and the EXOR circuit 445. When the control signal D420 is "0", the selector 442 selects a value D444 supplied from the register 443, and outputs the value D444 to the register 443 so that the value D444 is stored in the register 443 again. That is, unless the sign bits D432 of the variable node messages $v_i$ (D431) calculated from the intermediate decoding results D411 (intermediate decoding results v) corresponding to all 1's in one row in the parity check matrix are integrated completed, the register 443 supplies a value integrated at the last time, to the selector 442 and the EXOR circuit 445.

On the other hand, the FIFO memory 444 delays each sign bit D432 until a new value D444 ($\Pi$sign($v_i$) i=1 to i=$d_c$) is supplied to the EXOR circuit 445 from the register 443, and supplies the sign bit D432 as 1-bit value D445 to the EXOR circuit 445. The EXOR circuit 445 performs EXORing of the value D444 supplied from the register 443 and the value D445 supplied from the FIFO memory 444 to thereby divide the value D444 by the value D445 and output a 1-bit division result as a quotient value D446. That is, the EXOR circuit 445 divides a product of the sign bits D432 (sign($v_i$)) of the variable node messages $v_i$ (D431) calculated from the intermediate decoding results D411 corresponding to all 1's in one row in the parity check matrix, by the sign bit D432 (sign($v_i$)) of the variable node message $v_i$ (D431) given from a branch intended to calculate a check node message $u_j$, so that the resulting quotient value ($\Pi$sign($v_i$) from i=1 to i=$d_c$−1) is outputted as a quotient value D446.

A message D412 (check node message $u_j$) expressed as an ordinary quantized value of 6 bits which has, as its lower 5 bits, the 5-bit ordinary quantized value D440 outputted from the LUT 439 and, as its most significant bit (sign bit), the 1-bit quotient value D446 outputted from the EXOR circuit 445, is outputted from the quasi-check node calculator 412.

As described above, the quasi-check node calculator 412 performs an operation represented by the expressions (7) and (8), so that a check node message $u_j$ expressed by a 6-bit ordinary quantized value is obtained as a result of the check node operation. This check node message $u_j$ is supplied to the branch memory 413 (FIG. 26) from the quasi-check node calculator 412 and stored in the branch memory 413.

Incidentally, since the maximum weight in one row in the parity check matrix in FIG. 9 is 9, the quasi-check node calculator 412 has an FIFO memory 438 for delaying 9 operation results D434 ($\phi$(|$v_i$|)) calculated from 9 intermediate decoding results D411, and an FIFO memory 444 for delaying 9 sign bits D432. When a check node message $u_j$ in a row whose row weight is smaller than 9 is calculated, the delay amount in the FIFO memory 438 and the FIFO memory 444 is reduced to a value equal to the row weight.

Next, FIG. 29 shows an example of configuration of the quasi-variable node calculator 415 in FIG. 26.

The quasi-variable node calculator 415 is composed of a block C'. The block C' corresponds to the block C of the variable node calculator 103 shown in FIG. 27, as described above. Accordingly, the block C' performs the same processing as the block C.

That is, an operation unit 471, a register 472, a selector 473, a register 474 and an operation unit 475 in the block C' are configured in the same manner as the operation unit 151, the register 152, the selector 153, the register 154 and the operation unit 156$_1$ respectively in the block C in FIG. 27.

A message D413 (check node message $u_j$) which is a result of the check node operation is supplied to the quasi-variable node calculator 415 from the branch memory 413 (FIG. 26). The message D413 is supplied to the operation unit 471. A reception data D417 ($u_{0i}$) is supplied to the quasi-variable node calculator 415 from the receiving memory 416 (FIG. 26). The reception data D417 is supplied to the operation unit 475. A control signal D422 is given to the quasi-variable node calculator 415 from the control section 417 (FIG. 26) so that the control signal D422 is supplied to the selector 473.

Here, each of the message D413 (check node message $u_j$) supplied to the quasi-variable node calculator 415 from the branch memory 413 (FIG. 26) and the reception data D417 ($u_{0i}$) supplied to the quasi-variable node calculator 415 from the receiving memory 416 (FIG. 26) is expressed by a fixed point quantized value which is also an ordinary quantized value of 6 bits, as described above.

The operation unit 471 integrates the message D413 $u_j$ by adding the message D431 to a 9-bit value D471 stored in the register 472, so that a 9-bit integrated value obtained as a result of the integration is stored in the register 472 again. Incidentally, when messages D413 (check node messages $u_j$) corresponding to all 1's in one column in the parity check matrix have been integrated completely, the register 472 is reset.

Here, the reason why the integrated value outputted from the operation unit 471 consists of 9 bits but the message D413 ($u_j$) as a subject of integration inputted to the operation unit consists of 6 bits is the same as the reason why an output from the operation unit 151 consists of 9 bits larger by 3 bits than a 6-bit message D103 inputted to the operation unit 151 in FIG. 12.

When an integrated value as a result of integration of messages D413 corresponding to one column has been stored in the register 472, the control signal D422 supplied from the control section 417 (FIG. 26) changes from "0" to "1". When, for example, the column weight is "5", the control signal D422 takes "0" up to when the fourth message D413 is integrated, and takes "1" when the fifth message D413 is integrated.

When the control signal D422 is "1", the selector 473 selects a value stored in the register 472, i.e. a 9-bit integrated value D471 ($\Sigma u_j$ from i=1 to i=$d_v$) as a result of integration of messages D413 (check node messages $u_j$) given from all branches connected to one column in the parity check matrix H, and outputs the 9-bit integrated value D471 to the register 474 so that the 9-bit integrated value D471 is stored in the register 474. The register 474 supplies the stored integrated value D471 as a 9-bit value D472 to the selector 471 and the operation unit 475. When the control signal D422 is "0", the selector 473 selects a 9-bit value D472 supplied from the register 474, and outputs the 9-bit value D472 to the register 474 so that the 9-bit value D472 is stored in the register D474 again. That is, unless messages D413 (check node messages $u_j$) given from all branches connected to one column in the parity check matrix are integrated completely, the register 474 supplies a value D472 integrated at the last time, to the selector 473 and the operation unit 475.

The operation unit 475 adds the 9-bit integrated value D472 to the 6-bit reception data D417 supplied from the receiving memory 416 (FIG. 26), so that a 9-bit value as a result of the addition is outputted as an intermediate decoding result D415 (intermediate decoding result v).

As described above, the quasi-variable node calculator 415 performs an operation represented by the expression (5) by directly using fixed point quantized values which are also ordinary quantized values, so that a 9-bit intermediate decoding result v is obtained. This intermediate decoding result v is supplied to the intermediate decoding result storage memory 410 (FIG. 26) from the quasi-variable node calculator 415 and stored in the intermediate decoding result storage memory 410.

Incidentally, the intermediate decoding result v expressed by a 9-bit fixed point quantized value (ordinary quantized value) is stored in the intermediate decoding result storage memory 410. This 9-bit intermediate decoding result v is supplied to the quasi-check node calculator 412 through the switch 411 (FIG. 26) as described above.

Also in the decoding device in FIG. 26, the quasi-check node calculator 412 uses a 9-bit fixed point quantized value which is also a high-accuracy quantized value, or a 5-bit semi-floating point quantized value which expresses a numerical value near 0 with accuracy as high as the 9-bit fixed point quantized value and which has a dynamic range as wide as the 9-bit fixed point quantized value, in a process part of from the operation of the nonlinear function $\phi$(x) to the operation of the inverse function $\phi^{-1}$(x) while using a fixed point quantized value which is also an ordinary quantized value in the other process part, in the same manner as in the decoding device of FIG. 17. Accordingly, it is possible to decode an LDPC code with high accuracy while suppressing an increase in the scale of the decoding device (increase in capacities of the intermediate decoding result storage memory 410 and the branch memory 413 for storing messages, etc.).

Further, in the quasi-check node calculator 412 (FIG. 28), the LUT 432 receives a fixed point quantized value as an input and outputs a result of the operation of the nonlinear function $\phi(x)$ as a 5-bit semi-floating point quantized value whereas the LUT 439 receives a 5-bit semi-floating point quantized value as an input and outputs a result of the operation of the inverse function $\phi^{-1}(x)$ as a fixed point quantized value. Thus, also from this point, it is possible to decode an LDPC code with high accuracy while suppressing an increase in the scale of the decoding device (increase in capacities of the LUT 432 and LUT 439).

Further, in the decoding device in FIG. 26, the quasi-check node calculator 412 performs a check node operation and a part of a variable node operation while the quasi-variable node calculator 415 performs the other part of the variable node operation. Accordingly, it is possible to reduce the scale of the decoding device in FIG. 26 compared with the decoding device in FIG. 17.

That is, in the decoding device of FIG. 26, the branch memory 413 corresponds to the branch memory 102 of FIG. 17, the intermediate decoding result storage memory 410 corresponds to the branch memory 100 of FIG. 17, and the receiving memory 416 corresponds to the receiving memory 104 of FIG. 17.

Since each of the branch memory 413 of FIG. 26 and the corresponding branch memory 102 of FIG. 17 needs to store a number of 6-bit check node messages $u_j$ corresponding to the total number of branches, each of the branch memory 413 of FIG. 26 and the corresponding branch memory 102 of FIG. 17 requires a storage capacity equal to 6 bit times as large as the total number of branches. In addition, since each of the receiving memory 416 of FIG. 26 and the corresponding receiving memory of FIG. 17 needs to store 6-bit reception data $u_{0i}$ in accordance with the code length, each of the receiving memory 416 of FIG. 26 and the corresponding receiving memory 104 of FIG. 17 requires a storage capacity equal to 6 bit times as large as the code length.

Further, since, similarly to the branch memory 102 of FIG. 17, the branch memory 100 of FIG. 17 needs to store a number of 6-bit variable node messages $v_i$ corresponding to the total number of branches, the branch memory 100 of FIG. 17 requires a storage capacity equal to 6 bit times as large as the total number of branches.

On the contrary, the intermediate decoding result storage memory 410 of FIG. 26 corresponding to the branch memory 100 of FIG. 17 needs to store a number of intermediate decoding results v (D415) outputted from the quasi-variable node calculator 415, in accordance with the code length. Since each intermediate decoding result v consists of (an ordinary quantized value of) 9 bits as shown in FIG. 29, the intermediate decoding result storage memory 410 requires a storage capacity equal to 9 bit times as large as the code length.

Accordingly, when the total number of branches is smaller than 3/2 times (=9 bits/6 bits) as large as the code length, the storage capacity of the intermediate decoding result storage memory 410 is larger than the storage capacity of the corresponding branch memory 100 of FIG. 17.

Although the parity check matrix H of an LDPC code is sparse, the total number of branches (the total number of components "1" in the parity check matrix H) is generally larger than 3/2 times as large as the code length (the number of columns in the parity check matrix H). For example, in the parity check matrix H in FIG. 9, the total number (323) of branches is about three times (nearly equal to 323/108) as large as the code length (108).

Accordingly, the storage capacity of the intermediate decoding result storage memory 410 can be made smaller than the storage capacity of the corresponding branch memory 100 of FIG. 17.

As a result, the scale of the decoding device of FIG. 26 can be made smaller than the scale of the decoding device of FIG. 17 to the extent by which the storage capacity of the intermediate decoding result storage memory 410 can be made smaller than the storage capacity of the corresponding branch memory 100 of FIG. 17.

As described above, neither provision of a block for performing an operation represented by the expression (5) (separately from the quasi-variable node calculator 415) and nor provision of an FIFO memory 155 of FIG. 27 (FIG. 12) is required of the decoding device of FIG. 26. Accordingly, the decoding device of FIG. 26 can be configured to be smaller in size than the decoding device of FIG. 17.

Figure 30:
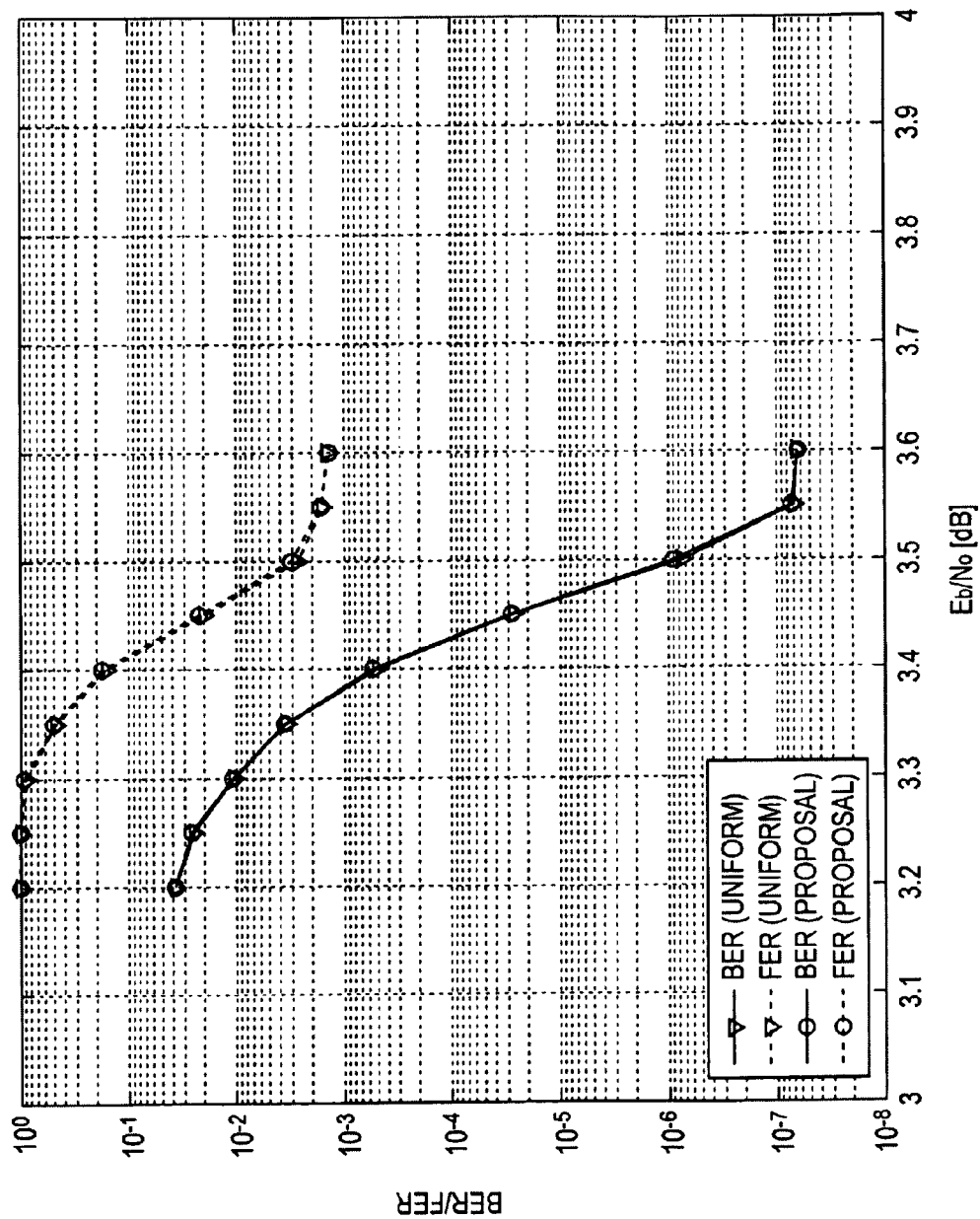
FIG. 30 A block diagram showing BER/FER.

Next, FIG. 30 shows results of BER/FER simulation about various kinds of decoding devices.

Incidentally, in FIG. 30, the abscissa axis expresses the ratio ($E_b/N_0$) of signal electric power to noise electric power per bit, and the ordinate axis expresses BER (Bit Error Rate) or FER (Frame Error Rate). In FIG. 30, BER and FER are shown by a solid line and a dotted line, respectively.

A symbol ∇ in FIG. 30 expresses BER and FER in the case where an LDPC code was decoded in the decoding device of FIG. 13, i.e. in the case where an LDPC code was decoded in such a manner that a fixed point quantized value which was also an ordinary quantized value of 5 bits was inputted to the LUT 1121 (FIG. 14) and a fixed point quantized value which was also a high-accuracy quantized value of 9 bits was outputted from the LUT 1121, and a fixed point quantized value which was also a high-accuracy quantized value of 9 bits was inputted to the LUT 1128 and a fixed point quantized value which was also an ordinary quantized value of 5 bits was outputted from the LUT 1128.

In addition, the symbol ○ in FIG. 30 expresses BER and FER in the case where an LDPC code was decoded in the decoding device of FIG. 17, i.e. in the case where an LDPC code was decoded in such a manner that a fixed point quantized value which was also an ordinary quantized value of 5 bits was inputted to the LUT 221 (FIG. 18) and a 5-bit semi-floating point quantized value was outputted from the LUT 221, and a 5-bit semi-floating quantized value was inputted to the LUT 228 and a fixed point quantized value which was also an ordinary quantized value of 5 bits was outputted from the LUT 228.

It can be understood from FIG. 30 that the decoding device of FIG. 17 has substantially equal performance to the decoding device of FIG. 13.

As described above, the LUT 221 and LUT 228 (FIG. 18) as constituent portions of the decoding device of FIG. 17 can be made remarkably smaller in size than the corresponding LUT 1121 and LUT 1128 (FIG. 14) as constituent portions of the decoding device of FIG. 13. Accordingly, the decoding device of FIG. 17 can be configured to be smaller in size than the decoding device of FIG. 13, while having substantially equal performance to the decoding device of FIG. 13.

Figure 31:
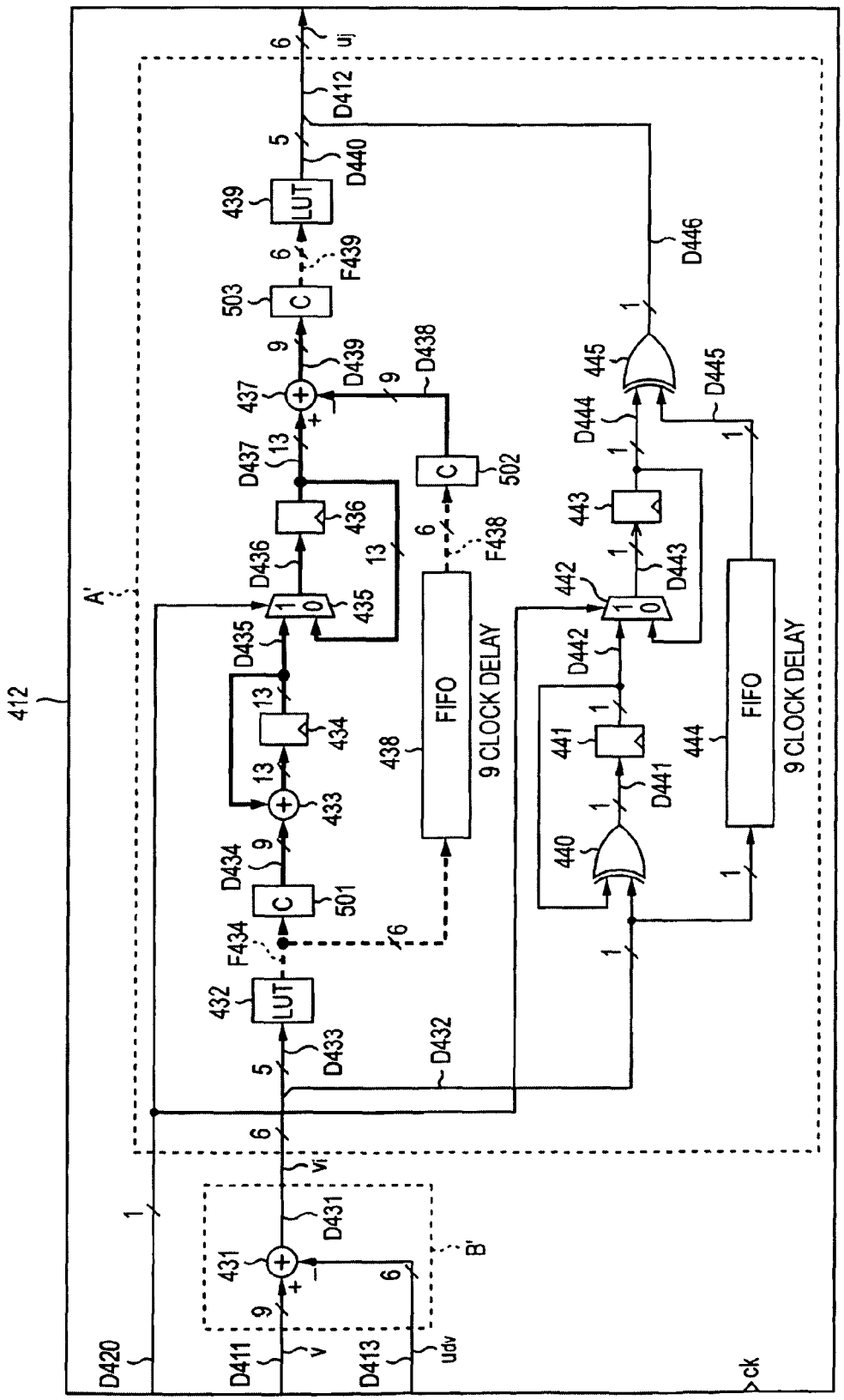
FIG. 31 A block diagram showing another example of configuration of the quasi-check node calculator 412.

Next, FIG. 31 shows another example of configuration of the quasi-check node calculator 412 of FIG. 26.

Incidentally, in FIG. 31, like numbers refer to like portions corresponding to the case of FIG. 28. Description about these portions will be hereinafter omitted appropriately. That is, the quasi-check node calculator 412 of FIG. 31 is configured fundamentally similarly to the quasi-check node calculator 412 of FIG. 28.

In the check node calculator 412 of FIG. 28, the LUT 432 receives a 5-bit fixed point quantized value as an input and outputs a 5-bit semi-floating point quantized value expressing a result of the operation of the nonlinear function $\phi(|v_i|)$ while the LUT 439 receives a 5-bit semi-floating point quantized value as an input and outputs a 5-bit fixed point quantized value expressing a result of the operation of the inverse function $\phi^{-1}(\Sigma\phi(|v_i|))$. On the other hand, in the check node calculator 412 of FIG. 31, an LUT 432 receives a 5-bit fixed point quantized value as an input and outputs a 6-bit semi-floating point quantized value expressing a result of the operation of the nonlinear function $\phi(|v_i|)$ while an LUT 439 receives a 6-bit semi-floating point quantized value as an input and outputs a 5-bit fixed point quantized value expressing a result of the operation of the inverse function $\phi^{-1}(\Sigma\phi(|v_i|))$.

That is, a semi-floating point quantized value of a total of 6 bits, for example, having a quasi-mantissa f of 3 bits and a quasi-exponent e of also 3 bits is used in the check node calculator 412 of FIG. 31.

Incidentally, in FIG. 31, configuration is made in accordance with such a semi-floating point quantized value of 6 bits so that each of converting circuits 501 and 502 converts a 6-bit semi-floating point quantized value into a 9-bit fixed point quantized value while a converting circuit 503 converts a 9-bit fixed point quantized value into a 6-bit semi-floating point quantized value.

In the quasi-check node calculator 412 of FIG. 31, a quasi-check node operation is performed in the same manner as the quasi-check node calculator 412 of FIG. 28, except that the semi-floating point quantized value consists of not 5 bits but 6 bits.

According to the quasi-check node calculator 412 of FIG. 31, a quasi-check node operation can be performed with higher accuracy though the capacities of the LUTs 432 and 439 are made more or less large compared with the check node calculator 412 of FIG. 28 using a semi-floating point quantized value of 5 bits including a quasi-mantissa f of 2 bits and a quasi-exponent e of 3 bits, because the quasi-check node calculator 412 of FIG. 31 uses a semi-floating point quantized value of 6 bits including a quasi-mantissa f of 3 bits and a quasi-exponent e of 3 bits.

Next, in the quasi-check node calculator 412, an FIFO memory 438 delays data for an operation which is performed by an operation unit 437 and which is a part of a quasi-check node operation. That is, in the quasi-check node calculator 412 of FIG. 28 or FIG. 31, the FIFO memory 438 delays a result of the operation of the nonlinear function $\phi(|v_i|)$ outputted from the LUT 432 and supplies the delayed result of the operation of the nonlinear function $\phi(|v_i|)$ to the operation unit 437 through the converting circuit 502, so that the operation unit 437 performs an operation by using the delayed result of the operation of the nonlinear function $\phi(|v_i|)$.

The LUT 432 in FIG. 28 receives a 5-bit fixed point quantized value as an input and outputs a 5-bit semi-floating point quantized value as a result of the operation of the nonlinear function $\phi(|v_i|)$, whereas the LUT 432 in FIG. 31 receives a 5-bit fixed point quantized value as an input and outputs a 6-bit semi-floating point quantized value as a result of the operation of the nonlinear function $\phi(|v_i|)$. Accordingly, in comparison with the case of FIG. 28 in which the FIFO memory 438 delays 5-bit semi-floating point quantized values, the case of FIG. 31 in which the FIFO memory 438 delays 6-bit semi-floating point quantized values requires an FIFO memory with a large capacity.

Therefore, the semi-check node calculator 412 (as well as the check node calculator 181 of FIG. 18) can be configured so that a quantized value with a smaller bit number selected from the fixed point quantized value inputted to the LUT 432 and the semi-floating point quantized value outputted from the LUT 432 is delayed in the FIFO memory 438.

Figure 32:
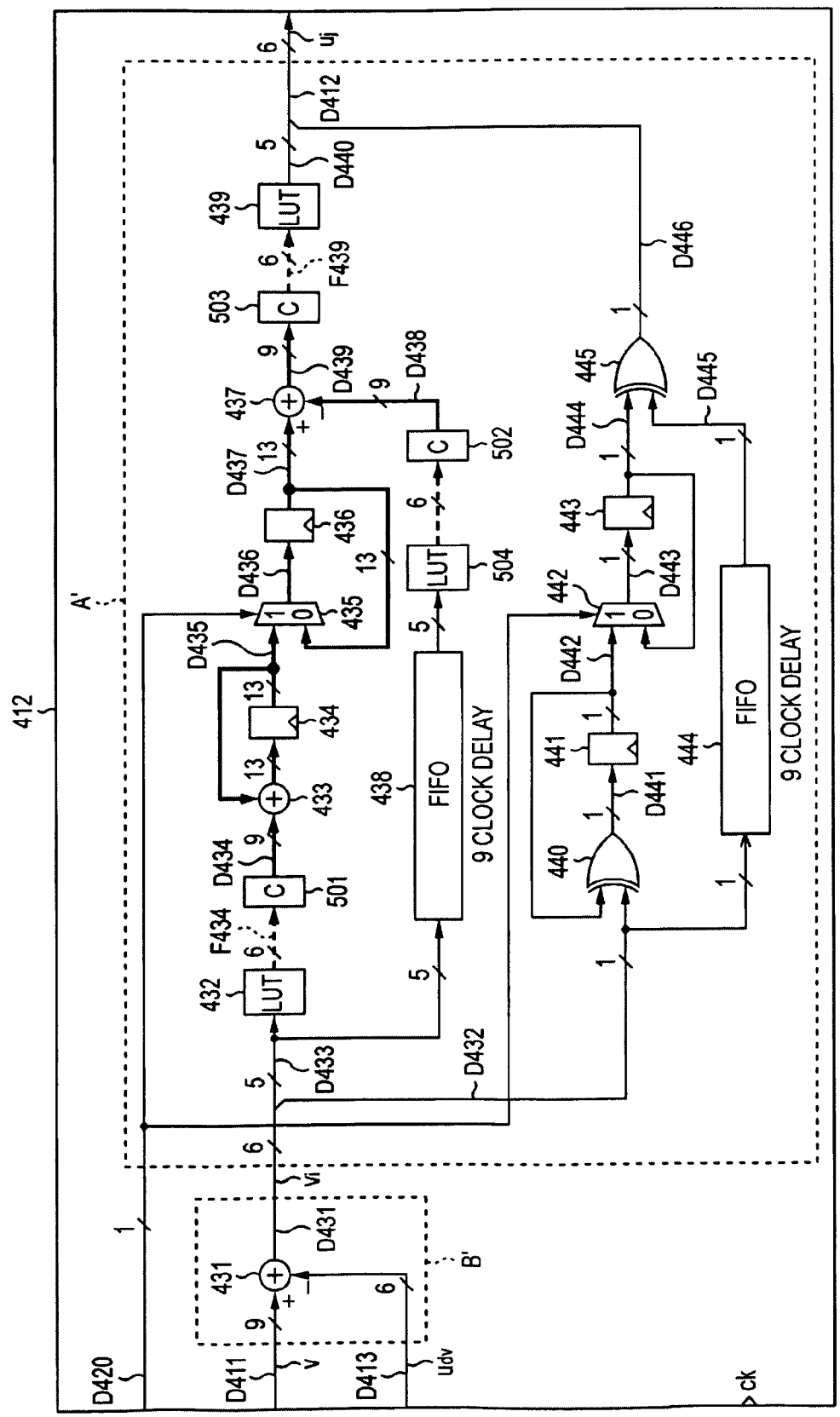
FIG. 32 A block diagram showing a further example of configuration of the quasi-check node calculator 412.

That is, FIG. 32 shows an example of configuration of the quasi-check node calculator 412 of FIG. 26 which is configured so that a quantized value with a smaller bit number, i.e. a fixed point quantized value inputted to the LUT 432 is delayed by the FIFO memory 438 in the case where the fixed point quantized value inputted to the LUT 432 is of 5 bits and the semi-floating point quantized value outputted from the LUT 432 is of 6 bits.

Incidentally, in FIG. 32, like numbers refer to like portions corresponding to the case of FIG. 31 so that description about those portions will be hereinafter omitted appropriately.

The quasi-check node calculator 412 of FIG. 32 is configured so that not a 6-bit semi-floating point quantized value outputted from the LUT 432 but a 5-bit fixed point quantized value inputted to the LUT 432 is delayed in the FIFO memory 438.

Further, in the quasi-check node calculator 412 of FIG. 32, an LUT 504 configured in the same manner as the LUT 432 is provided newly between the FIFO memory 438 and the converting circuit 502 so that the LUT 504 receives as an input a 5-bit fixed point quantized value delayed by the FIFO memory 438 and outputs a 6-bit semi-floating point quantized value expressing a result of the operation of the nonlinear function $\phi(|v_i|)$ in connection with the fact that not a 6-bit semi-floating point quantized value outputted from the LUT 432 but a 5-bit fixed point quantized value inputted to the LUT 432 is delayed by the FIFO memory 438.

In the quasi-check node calculator 412 of FIG. 32 configured as described above, not a 6-bit semi-floating point quantized value outputted from the LUT 432 but a 5-bit fixed point quantized value inputted to the LUT 432 is outputted after delayed by the FIFO memory 438. Then, the LUT 504 receives as an input the delayed 5-bit fixed point quantized value outputted from the FIFO memory 438 and outputs a 6-bit semi-floating point quantized value expressing a result of the operation of the nonlinear function $\phi(|v_i|)$.

The converting circuit 502 converts the 6-bit semi-floating point quantized value outputted from the LUT 504 into a 9-bit fixed point quantized value, and supplies the 9-bit fixed point quantized value to the operation unit 437. Thus, the operation unit 437 performs an operation by using the delayed result of the operation of the nonlinear function $\phi(|v_i|)$ supplied from the converting circuit 502.

Incidentally, the other process part performed by the quasi-check node calculator 412 of FIG. 32 is the same as in the case of FIG. 31.

As described above, an FIFO memory with a small capacity can be employed as the FIFO memory 438 because the quasi-check node calculator 412 is configured so that a quantized value with a smaller bit number selected from a fixed point quantized value inputted to the LUT 432 and a semi-floating point quantized value outputted from the LUT 432 is delayed by the FIFO memory 438, that is, because the quasi-check node calculator 412 is configured so that a quantized value with a smaller bit number, i.e. a fixed point quantized value inputted to the LUT 432 is delayed by the FIFO memory 438 as shown in FIG. 32 when, for example, the fixed point quantized value inputted to the LUT 432 is of 5 bits and the semi-floating point quantized value outputted from the LUT 432 is of 6 bits.

Here, when the quasi-check node calculator 412 is configured so that a fixed point quantized value inputted to the LUT 432 is delayed by the FIFO memory 438 as shown in FIG. 32, it is necessary to provide the LUT 504 newly between the FIFO memory 438 and the converting circuit 502. For this reason, when the bit number of the fixed point quantized value inputted to the LUT 432 is the same as the bit number of the semi-floating point quantized value outputted from the LUT 432, the quasi-check node calculator 412 can be configured so that the semi-floating point quantized value outputted from the LUT 432 is delayed by the FIFO memory 438 to omit the LUT 504 as shown in FIG. 28 to thereby reduce the circuit scale of the quasi-check node calculator 412.

Since it is necessary to provide the LUT 504 newly between the FIFO memory 438 and the converting circuit 502 when the quasi-check node calculator 412 is configured so that the fixed point quantized value inputted to the LUT 432 is delayed by the FIFO memory 438, it is desirable that decision as to which of the fixed point quantized value inputted to the LUT 432 and the semi-floating point quantized value outputted from the LUT 432 is delayed by the FIFO memory 438 is made in consideration of the scale of the LUT 504 in addition to the size relation in bit number between the fixed point quantized value inputted to the LUT 432 and the semi-floating point quantized value outputted from the LUT 432.

That is, when the bit number of the fixed point quantized value inputted to the LUT 432 is not smaller than the bit number of the semi-floating point quantized value outputted from the LUT 432, the quasi-check node calculator 412 can be configured so that the semi-floating point quantized value outputted from the LUT 432 is delayed by the FIFO memory 438 as shown in FIG. 28 to thereby reduce the circuit scale of the quasi-check node calculator 412.

When the bit number of the fixed point quantized value inputted to the LUT 432 is smaller than the bit number of the semi-floating point quantized value outputted from the LUT 432, it is desirable that a configuration with a smaller scale is employed on the basis of comparison between the total scale including the scale of the FIFO memory 438 when the fixed point quantized value smaller in bit number and inputted to the LUT 432 is delayed by the FIFO memory 438 and the scale of the LUT 504 required on this occasion, and the scale of the FIFO memory 438 when the semi-floating point quantized value larger in bit number and outputted from the LUT 432 is delayed by the FIFO memory 438.

Incidentally, although a decoding device having a full serial decoding architecture for performing operations of respective nodes one by one successively is employed in this embodiment, the architecture of the decoding device is not particularly limited. That is, the invention can be applied, for example, to a decoding device having a full parallel decoding architecture for performing operations of all nodes simultaneously or a decoding device having a partly parallel decoding architecture for performing operations of a certain number of nodes (neither one node nor all nodes) simultaneously, in addition to the decoding device having a full serial decoding architecture.

Since the decoding device having a full parallel decoding architecture or the decoding device having a partly parallel decoding architecture has a plurality of check node calculators (quasi-check node calculators) for performing check node operations, the effect of reduction in capacities of LUTs for performing operations of a nonlinear function $\phi(x)$ and an inverse function $\phi^{-1}(y)$ thereof (for outputting operation results) becomes further larger.

In addition, the parity check matrix H is not limited to the one shown in FIG. 9.

Further, the bit number (number of quantization bits) of an ordinary quantized value or a high-accuracy quantized value which is a fixed point quantized value, or the bit number of a semi-floating point quantized value is also not limited to the aforementioned value.

Further, for example, an RAM (Read Only Memory) can be used as each of the branch memories 100 and 102 and the receiving memory 104 in FIG. 17 and the intermediate decoding result storage memory 410, the branch memory 413 and the receiving memory 416 in FIG. 26. Here, the number of bits (bit width) per word in the RAM used as each of the branch memory 100, etc. and the number of words which can be stored in the RAM are not limited particularly. When the same control signal (such as a chip select signal or an address signal) is given to a plurality of RAMs in accordance with the bit width or the number of words of an RAM, the plurality of RAMs can be regarded as one RAM logically so that the plurality of RAMs can be used as the branch memory 101 or the like. That is, when, for example, the bit width of an RAM is not physically sufficient for the number of quantization bits of reception data $u_{0i}$ etc., such a plurality of RAMs can be regarded as one RAM logically so that the reception data $u_{0i}$ etc. can be stored in the plurality of RAMs.

In addition, although this embodiment is configured so that an operation of a nonlinear function $\phi(x)$ or an operation of an inverse function $\phi^{-1}(x)$ hereof is performed by an LUT such as the LUT 1121 (FIG. 18) and LUT 432 (FIG. 28) or by an LUT such as the LUT 1128 (FIG. 18) and the LUT 439 (FIG. 28), the operation of the nonlinear function $\phi(x)$ or the operation of the inverse function $\phi^{-1}(x)$ can be performed, for example, by a CPU (Central Processing Unit) or a logic circuit.

Further, although the check node calculator 181 of FIG. 18 is configured so that a 5-bit semi-floating point quantized value outputted from the LUT 221 is delayed by the FIFO 1127, configuration can be made so that not a 5-bit semi-floating point quantized value outputted from the LUT 221 but a 9-bit fixed point quantized value obtained in such a manner that the representation format of the 5-bit semi-floating point quantized value is converted by the converting circuit 231 is delayed by the FIFO 1127. In this case, the converting circuit 232 provided in the post stage of the FIFO 1127 in FIG. 18 can be omitted.

When the 5-bit semi-floating point quantized value is delayed by the FIFO 1127, the capacity of the FIFO 1127 can be reduced compared with the case where the 9-bit fixed point quantized value is delayed by the FIFO 1127. The same rule also applies to the FIFO 438 of FIG. 28.

Incidentally, the aforementioned decoding device for decoding an LDPC code can be applied to a tuner for receiving (digitalized) satellite broadcasting, etc.

The invention claimed is:

1. A decoding device for decoding an LDPC (Low Density Parity Check) code, comprising:
a first operation unit for performing a check node operation of a check node for decoding the LDPC code, the check node operation including an operation of a nonlinear function and an operation of an inverse function of the nonlinear function; and a second operation unit for performing a variable node operation of a variable node for decoding the LDPC code; wherein:

the first operation unit includes:

a function operation unit for receiving as an input a first quantized value which is a bit string expressing a numerical value with a fixed quantization width, and outputting a result of the operation of the nonlinear function as a second quantized value which is a bit string expressing a numerical value with a quantization width determined in accordance with a part of the bit string; and an inverse function operation unit for receiving the second quantized value as an input and outputting a result of the operation of the inverse function of the nonlinear function as the first quantized value.

2. The decoding device according to claim 1, wherein:

the first operation unit performs the check node operation and a part of the variable node operation; and the second operation unit performs the other part of the variable node operation.

3. The decoding device according to claim 1, wherein:

the minimum value of the quantization width of the second quantized value is not larger than the quantization width of the first quantized value.

4. The decoding device according to claim 3, wherein:

the minimum value of the quantization width of the second quantized value is equal to the quantization of the first quantized value.

5. The decoding device according to claim 1, wherein:

the check node operation further includes an integration performed after the operation of the nonlinear function but before the operation of the inverse function of the nonlinear function; and the first operation unit converts the second quantized value into the first quantized value before the integration is performed.

6. The decoding device according to claim 1, wherein:

the first operation unit further includes a conversion unit for converting the second quantized value outputted by the function calculation unit into the first quantized value.

7. The decoding device according to claim 1, wherein:

the check node operation further includes an operation which is performed by using a delayed result of the operation of the nonlinear function after the result of the operation of the nonlinear function is delayed; and the first operation unit further includes a conversion unit for converting the second quantized value expressing the delayed result of the operation of the nonlinear function into the first quantized value before the operation which is performed by using the delayed result of the operation of the nonlinear function.

8. The decoding device according to claim 7, wherein:

the first operation unit further includes another conversion unit for converting the first quantized value into the second quantized value and supplying the second quantized value to the inverse function operation unit, after the operation which is performed by using the delayed result of the operation of the nonlinear function.

9. The decoding device according to claim 1, wherein:

the function operation unit is an LUT (Look Up Table) for receiving the first quantized value as an input and outputting the result of the operation of the nonlinear function as the second quantized value; and the inverse function operation unit is an LUT for receiving the second quantized value as an input and outputting the result of the operation of the inverse function of the nonlinear function as the first quantized value.

10. The decoding device according to claim 1, wherein:

the first operation unit further includes a delay unit for delaying data for the check node operation; and the delay unit is constructed to delay one of the first quantized value inputted to the function operation unit and the second quantized value outputted from the function operation unit.

11. The decoding device according to claim 10, wherein:

when the delay unit is constructed to delay the first quantized value inputted to the function operation unit, the first operation unit further includes another function operation unit for receiving as an input the first quantized value delayed by the delay unit and outputting the result of the operation of the nonlinear function as the second quantized value.

12. A decoding method for a decoding device, the decoding device including:

a first operation unit for performing a check node operation of a check node for decoding an LDPC (Low Density Parity Check) code, the check node operation including an operation of a nonlinear function and an operation of an inverse function of the nonlinear function; and a second operation unit for performing a variable node operation of a variable node for decoding the LDPC code; the decoding method comprising:

a function operation step in the first calculation unit for receiving as an input a first quantized value which is a bit string expressing a numerical value with a fixed quantization width, and outputting a result of the operation of the nonlinear function as a second quantized value which is a bit string expressing a numerical value with a quantization width determined by a part of the bit string; and an inverse function operation step in the first calculation unit for receiving the second quantized value as an input, and outputting a result of the operation of the inverse function of the nonlinear function as the first quantized value.

* * * * *